United States Patent [19]
Katagiri

[11] Patent Number: 5,355,136
[45] Date of Patent: Oct. 11, 1994

[54] ANALOG-TO-DIGITAL CONVERTER CIRCUIT

[75] Inventor: Takashi Katagiri, Komagane, Japan

[73] Assignee: Sankyo Seiki Mfg. Co., Ltd., Nagano, Japan

[21] Appl. No.: 965,187

[22] Filed: Oct. 23, 1992

[30] Foreign Application Priority Data

Oct. 24, 1991 [JP] Japan .............................. 3-095312[U]
Oct. 29, 1991 [JP] Japan .................................. 3-309912
Dec. 10, 1991 [JP] Japan .................................. 3-350169

[51] Int. Cl.$^5$ ........................................... H03M 1/12
[52] U.S. Cl. .................................................. 341/157
[58] Field of Search .............. 341/157, 155, 157, 164, 341/165; 318/599, 603, 604

[56] References Cited

U.S. PATENT DOCUMENTS 3,500,109  9/1967  Sugiyama et al. .................. 341/164

Primary Examiner—Brian K. Young
Attorney, Agent, or Firm—McAulay Fisher Nissen Goldberg & Kiel

[57] ABSTRACT

An analog-to-digital converter circuit is adapted to control the speed of an electric motor. The circuit in one form comprises a low-pass filter receiving an analog speed instruction voltage, a comparator, a microprocessor incorporating a timer, and an inverter that controls the speed of the motor. The comparator compares the output signal from the filter with a triangular wave having a given frequency and a given amplitude. The output signal from the comparator is applied to the microprocessor, which produces a digital signal corresponding to the speed instruction voltage, by making use of internal clock pulses. The speed of the motor is detected by an encoder. The microprocessor controls the inverter in such a way that the difference between the speed detected by the encoder and the speed indicated by the digital signal becomes null.

15 Claims, 35 Drawing Sheets

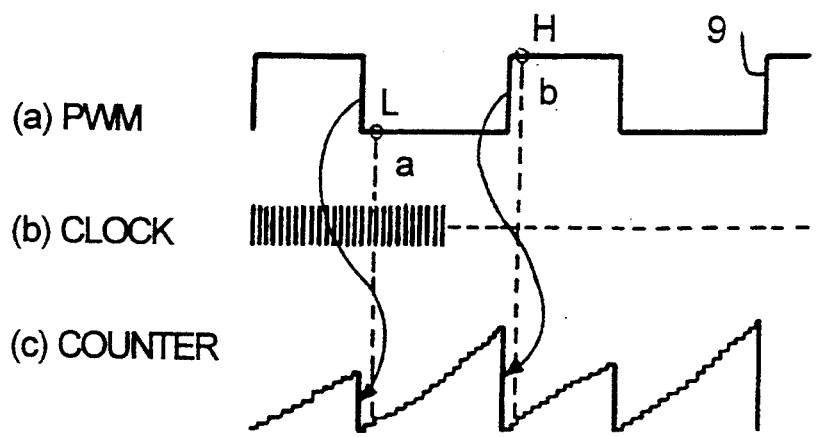
FIG. 8
FIG. 9A
LOW FREQUENCY
FIG. 9B
HIGH FREQUENCY
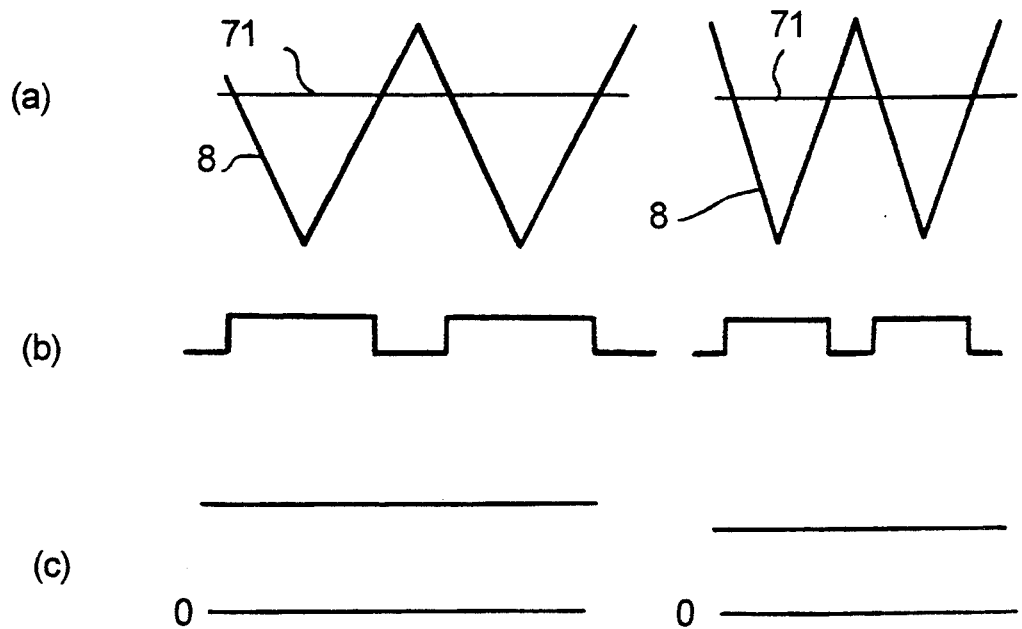

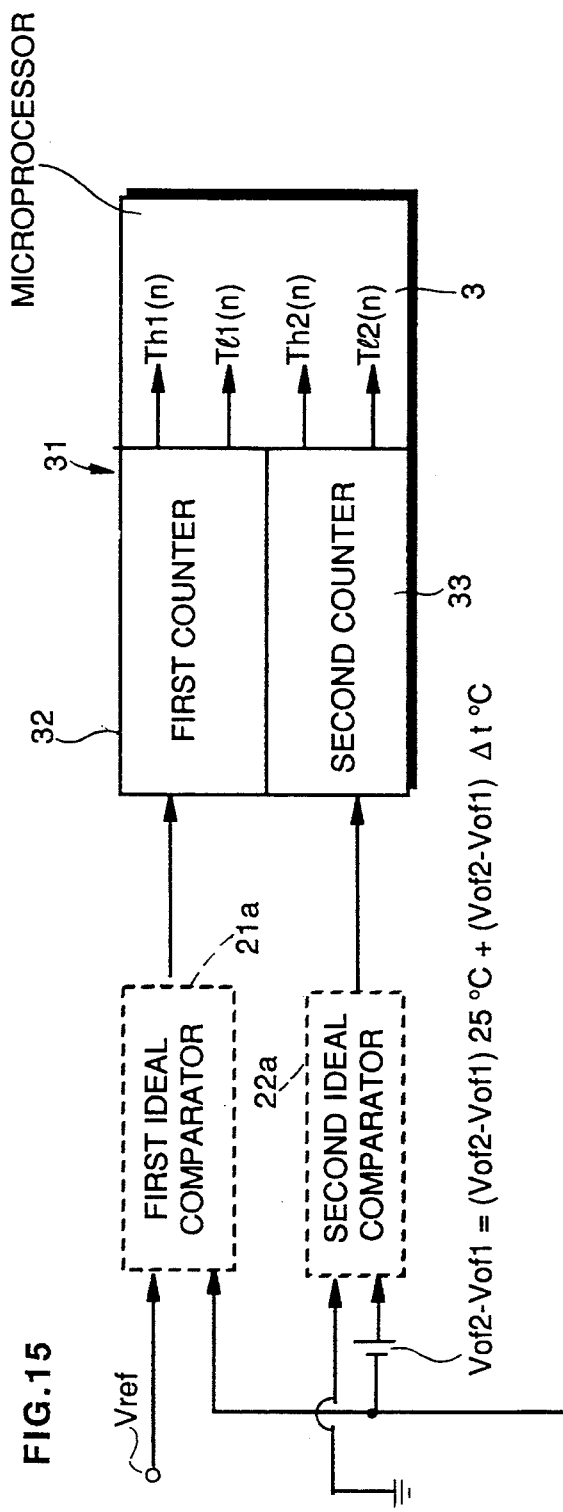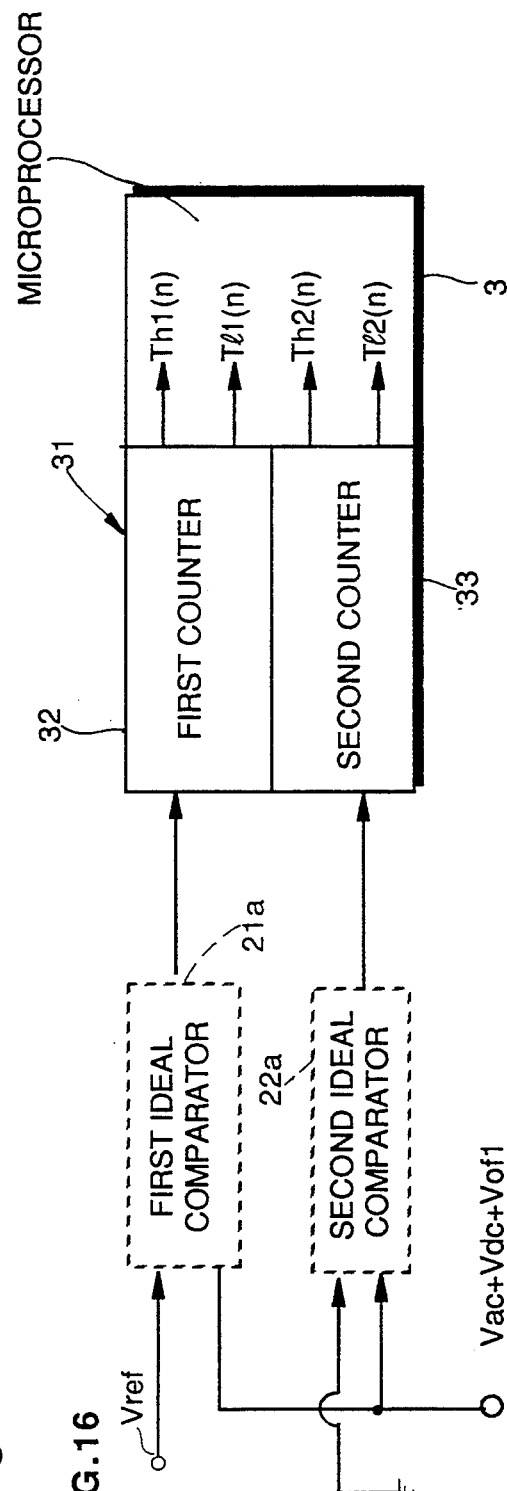

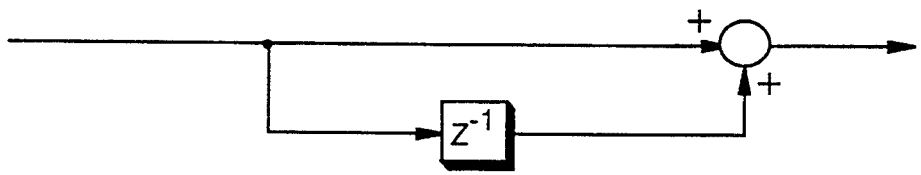
FIG.24
FIG.25
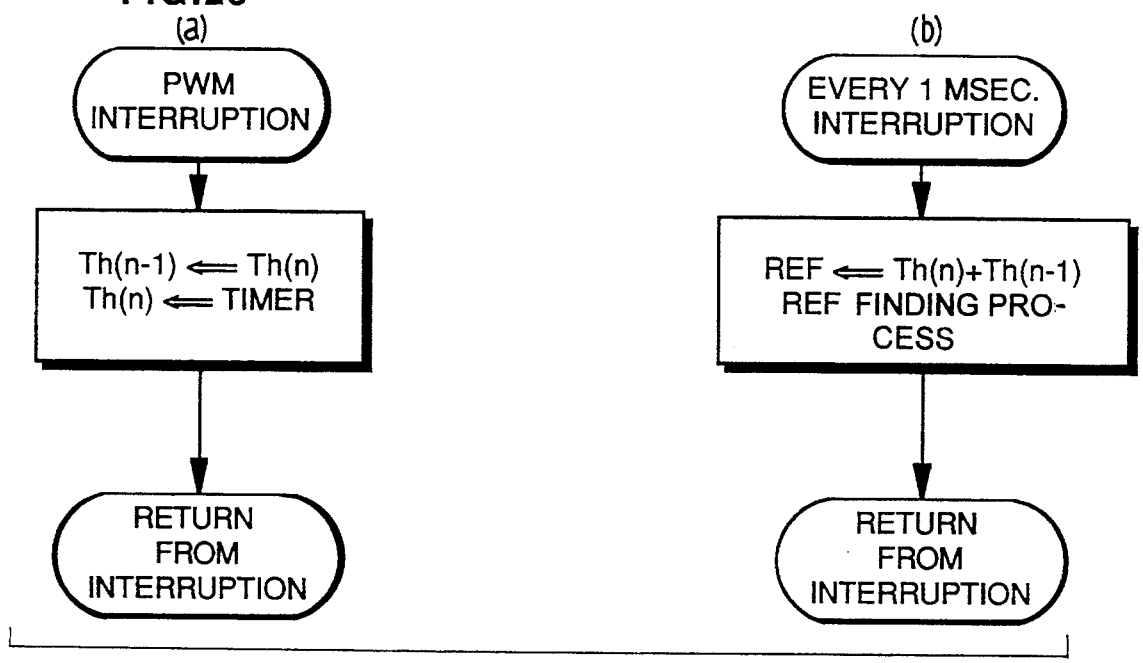
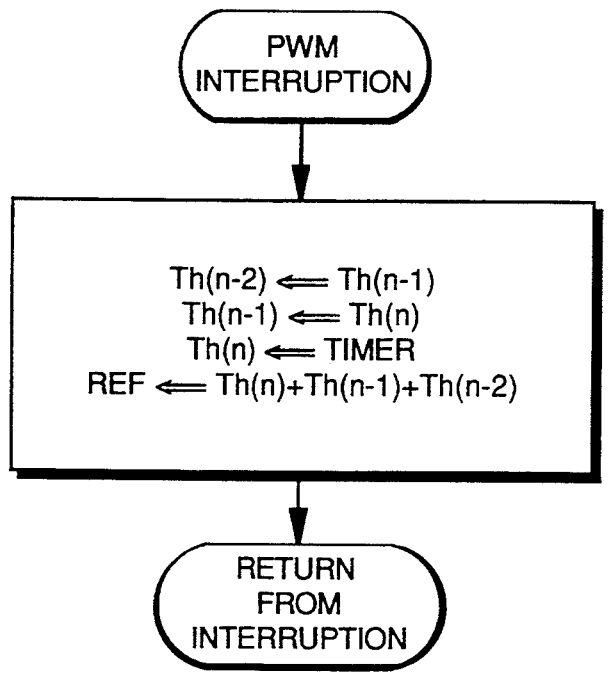
FIG.26

ANALOG-TO-DIGITAL CONVERTER CIRCUIT

BACKGROUND OF THE INVENTION a) Field of the Invention

The present invention relates to an analog-to-digital converter circuit and, more particularly, an analog-to-digital converter circuit adapted for use in a motor control circuit, for example.

b) Background of the Related Art

Some motor control circuits use a microprocessor and are controlled by software. FIG. 46 shows a conventional motor control circuit which is controlled by software as described above. A speed instruction voltage that is an analog signal is passed through a low-pass filter 101 to filter out noise and other higher harmonics. The analog output signal from the filter 101 is converted into digital form by an analog-to-digital converter IC 102 and supplied to a microprocessor 103 to control the output frequency of an inverter 104, thereby controlling the rotational speed of an electric motor 105. The rotational speed of the motor 105 is detected by an encoder 106. The microprocessor 103 calculates the difference between the speed instructed by the speed instruction signal and the actual speed of the motor 105, and controls the inverter 104 in such a way that the difference is reduced to zero.

The aforementioned motor control circuit is expensive because it uses an analog-to-digital converter IC. Also, it is necessary that the analog-to-digital converter IC be connected with the microprocessor by a number of lines, e.g., 10 or 12 lines, depending on the bit number. Therefore, the input/output ports of the microprocessor are occupied by the lines extending from the A/D converter IC. This makes it impossible to effectively utilize the microprocessor.

OBJECTS AND SUMMARY OF THE INVENTION

In view of the foregoing drawbacks with the prior art, it is an object of the present invention to provide an analog-to-digital converter circuit which dispenses with an analog-to-digital converter IC to thereby reduce the cost and which permits the ports of a microprocessor to be used effectively.

It is another object of the invention to provide an analog-to digital converter circuit whose conversion efficiency is neither affected by temperature variations nor aging.

It is a further object of the invention to provide an inexpensive analog-to-digital converter circuit whose digital output data is not affected if the DC component of a triangular wave used for analog-to digital conversion varies with temperature or if the offset voltage of the comparator varies with temperature.

It is a yet other object of the invention to provide an analog-to-digital converter circuit which has improved resolution and is not susceptible to noise.

It is a still other object of the invention to provide an analog-to-digital converter circuit which, if the level of a speed instruction signal exceeds the amplitude of a triangular wave and a pulse width-modulated signal is locked to its high or low level, produces an alarm signal indicating that the digital signal assumes an abnormal value.

It is an additional object of the invention to provide an analog-to-digital converter circuit which, if the pulse width modulated signal has been locked to its high or low level from the beginning of the operation, produces an alarm signal indicating that the digital signal assumes an abnormal value.

It is a still further object of the invention to provide an improved motor control apparatus which uses the above-described analog-to-digital converter circuit and which, if the level of the speed instruction signal exceeds the amplitude of a triangular wave and a pulse width-modulated signal is locked to its high or low level, stops the motor to prevent it from operating uncontrollably or abnormally.

In accordance with the invention, an analog-to-digital converter circuit comprises a comparator for comparing an analog input signal with a triangular wave signal having a given frequency and a given amplitude to convert the signal into a pulse width-modulated output signal and a counter, responsive to the pulse width modulated output signal, for counting clock pulses appearing during the period of the high or low level of the pulse width-modulated output signal to convert it into a digital output signal representative of the analog input signal.

Various aspects of the invention encompass:

1. avoidance of dependence on the frequency of the triangular wave signal so that stable and accurate conversion into digital form may be achieved;
2. avoidance of dependency of the conversion on temperature by subtracting data concerning the duty cycle of a rectangular wave from data concerning the duty cycle of the pulse-width modulated wave;
3. application of the invention to a speed instruction signal for a motor including means for stopping the motor if the speed instruction signal becomes outside of the amplitude of the triangular wave signal;
4. utilizing prior measured values to improve the resolution of the converter;
5. employing an alarm together with the converter to assure it is in proper condition for operation; and
6. avoiding, in all of the above, the need for an analog-to-digital converter IC.

For a better understanding of the present invention, reference is made to the following description and accompanying drawings while the scope of the invention will be pointed out in the appended claims.

BRIEF DESCRIPTION OF THE DRAWINGS

FIG. 8 is a timing chart illustrating the operation of Example 4;

FIGS. 9A and 9B are timing charts illustrating the problems with the pulse width conversion operation when the present invention is not applied;

FIG. 15 is a block diagram showing another model which takes into account the temperature characteristics of Example 5;

FIG. 16 is a block diagram of a model of Example 5 in which the offset voltage difference between the two comparators is adjusted to null;

FIG. 24 is an equivalent circuit diagram of a low-pass filter formed by Example 6;

FIGS. 25a and 25b are flow charts illustrating an interrupt operation of a modification of Example 6 of an analog-to-digital converter circuit according to the invention;

FIG. 26 is a flow chart illustrating an interrupt operation of another modification of Example 6 of an analog-to-digital converter circuit according to the invention;

DETAILED DESCRIPTION OF THE PREFERRED EMBODIMENTS

EXAMPLE 1

Figure 1:
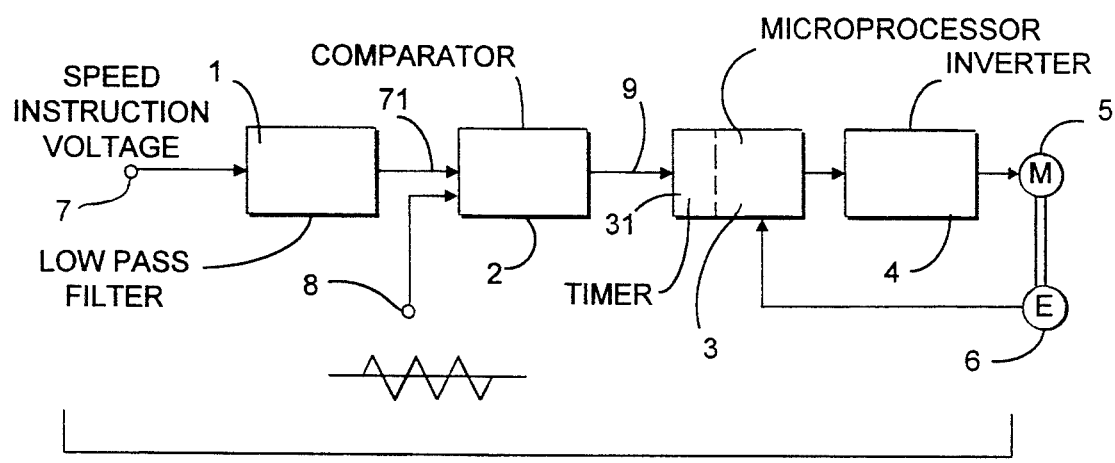
FIG. 1 a block diagram of a motor control circuit having Example 1 of an analog-to-digital converter circuit according to the invention.
Figure 2:
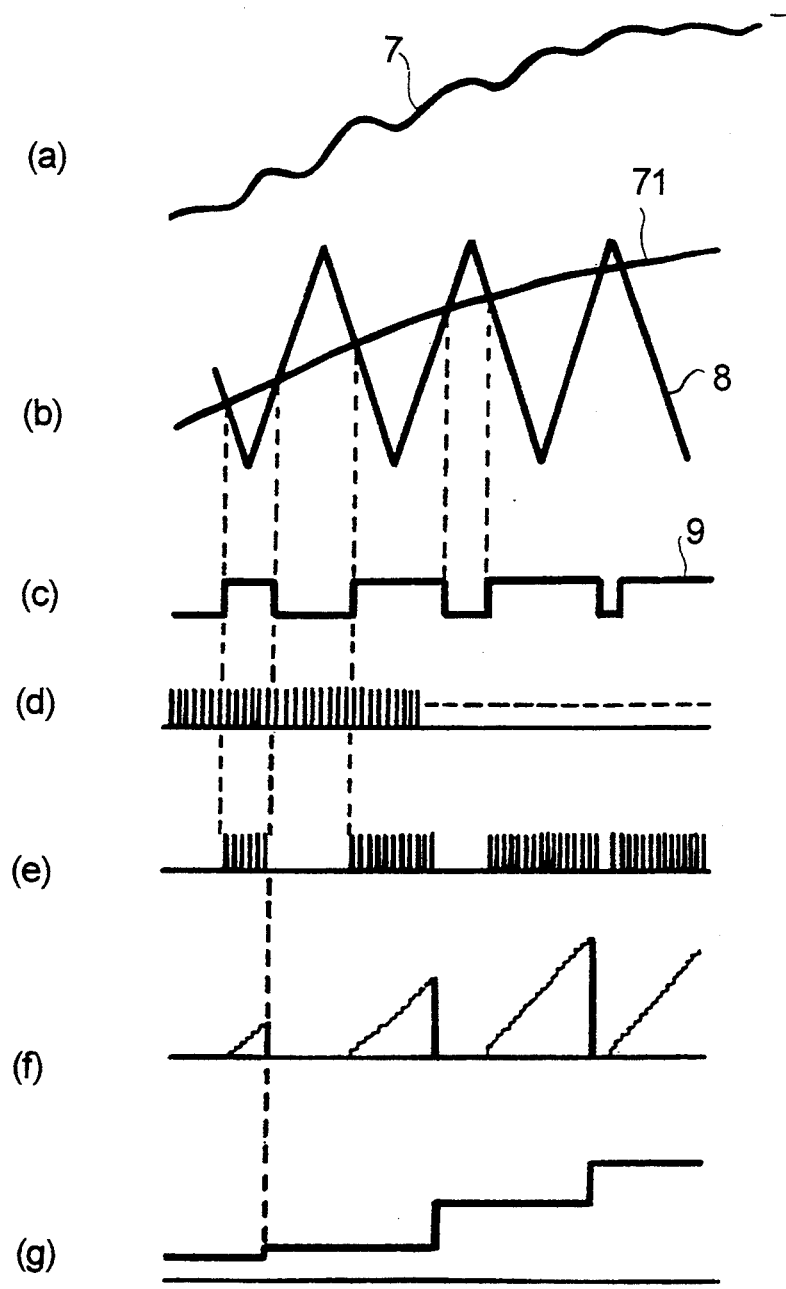
FIG. 2 is a timing chart illustrating the operation of Example 1.
Figure 46:
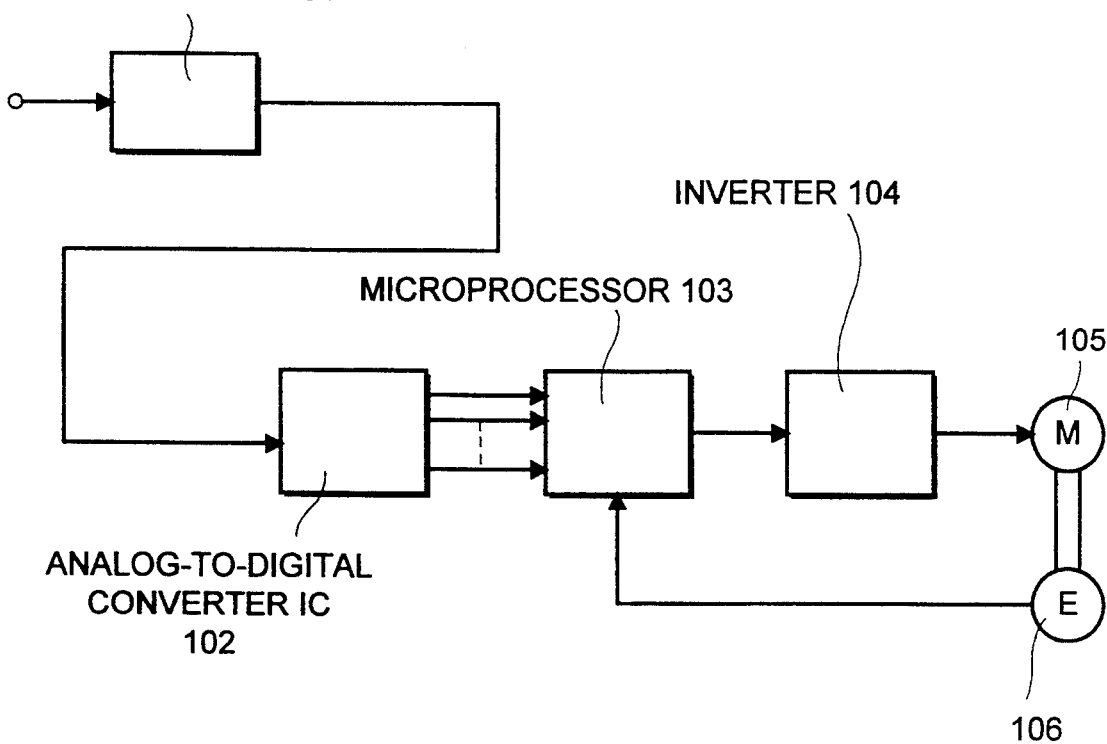
FIG. 46 is a block diagram of a motor control circuit including a conventional analog-to-digital converter circuit.

An example of analog-to-digital converter circuit according to the present invention is next described by referring to FIGS. 1 and 2. The illustrated example is adapted for use in a circuit for controlling the speed of an electric motor, in the same way as in the conventional circuit described in connection with FIG. 46.

Referring to FIG. 1, a speed instruction voltage 7 which is an analog signal is applied to a low-pass filter 1. The output from the filter 1 and a triangular wave 8 are applied to a comparator 2. The output from the comparator 2 is applied to a microprocessor 3 having a timer 31. The microprocessor 3 produces a digital signal corresponding to the speed instruction voltage 7, making use of internal clock pulses and the timer 31. The microprocessor 3 controls an inverter 4 in such a way that the difference between the speed of a motor 5 indicated by the output signal from an encoder 6 and the speed indicated by the digital signal described above is reduced to zero.

The operation of the Example 1 described above is next described in detail by referring also to FIG. 2. The speed instruction voltage 7 contains noise and other higher harmonics, as shown in FIG. 2(a). This speed instruction voltage 7 is passed through the low-pass filter 1 to remove the higher harmonics from the output from the low-pass filter. This output is indicated by 71 in FIG. 2(b).

The low-pass filter output 71 corresponding to the speed instruction voltage is compared with the triangular wave having a constant frequency and a constant amplitude by the comparator 2. As shown in FIG. 2(b), the position at which the low-pass filter output 71 corresponds to the speed instruction voltage 7 crosses the triangular wave 8 differs according to the level of the output 71. Therefore, the output from the comparator 2 takes the form of a pulse width-modulated signal 9 varying according to the level of the low-pass filter output 71, as shown in FIG. 2(c). In other words, the width, or duration, of the high level of the pulse width-modulated signal 9 indicates the amplitude of the speed instruction voltage 7. The triangular wave which is compared with the speed instruction voltage contains a saw-toothed wave in all the examples of the present invention, including the present example.

As is well known in the art, the timer 31 of the microprocessor 3 has a counter that counts the internal clock pulses of a given frequency as shown in FIG. 2(d). The timer 31 counts those of the clock pulses which appear within the period of the high level of the pulse width-modulated signal 9, as shown in FIG. 2(e). Therefore, the total count obtained by the counter is a digital value. The counter of the timer 31 is initialized in such a way that the total count of the counter of the timer 31 is stored in its counter buffer on the leading edge of the pulse width-modulated signal 9, as shown in FIG. 2(f), and that the counter causes an interruption, for clearing the total count. The total count obtained on the trailing edge of the pulse width-modulated signal 9 is stored in the counter buffer as shown in FIG. 2(g).

In this way, the speed instruction voltage 7 which is an analog signal shown in FIG. 2(a) is converted into digital form by undergoing a series of operations from FIG. 2(b) to FIG. 2(g). The value of the counter buffer that is a digital signal is used as an instructed speed for speed control provided by software. In particular, the microprocessor 3 calculates the difference between the rotational speed of the motor 5 detected by the encoder 6 and the digitized speed instruction value and controls the inverter 4 in such a way that the difference is reduced to zero.

The resolution of Example 1 described above is next discussed, using numerical values. Let the frequency of the internal clock pulses in the microprocessor 3 be 8 MHz. Let the frequency of the triangular wave be 800 Hz. The value of the digital output varies from 0 to 9999. That is, the resolution is 13.3 bits ($=\log_2 10000$) and surpasses the resolution of 12 bits of the analog-to-digital converter IC.

The response frequency is next discussed. Since the frequency of the triangular wave is 800 Hz as described above, the digital output data is updated at 800 Hz. The sampling theorem makes it impossible to reproduce analog input frequencies higher than 400 Hz as output data. According to the sampling theorem, if the signal is sampled at a frequency twice as high as the frequency of the signal, the original signal is reproduced almost completely. However, the cutoff frequency used in controlling the speed of the motor is about 100 Hz and, therefore, no practical problems take place in controlling the motor speed.

In the Example 1 described above, an analog-to-digital converter circuit can be fabricated from only a comparator and its peripheral components without using an analog-to-digital converter IC. Therefore, the A/D converter circuit is economical to manufacture. Where control is provided in terms of software by the use of a microprocessor, only one lead wire is necessary between the comparator and the microprocessor. Hence, the ports of the microprocessor can be utilized effectively. Where the A/D converter circuit is employed in a motor speed control circuit, the response frequency presents no problems from a practical point of view. The resolution exceeds the resolution obtained when an analog-to-digital converter IC is used as encountered in the prior art techniques.

In Example 1, those clock pulses which exist within the period of the high level of the pulse width-modulated signal are counted, as shown in FIG. 2, (c), (d), and (e). It is also possible to count those clock pulses which appear within the period of the low level of the pulse width-modulated signal. In this case, the total count decreases with increasing speed instruction voltage. Furthermore, the total count may be multiplied or divided by a constant value.

Figure 44A:
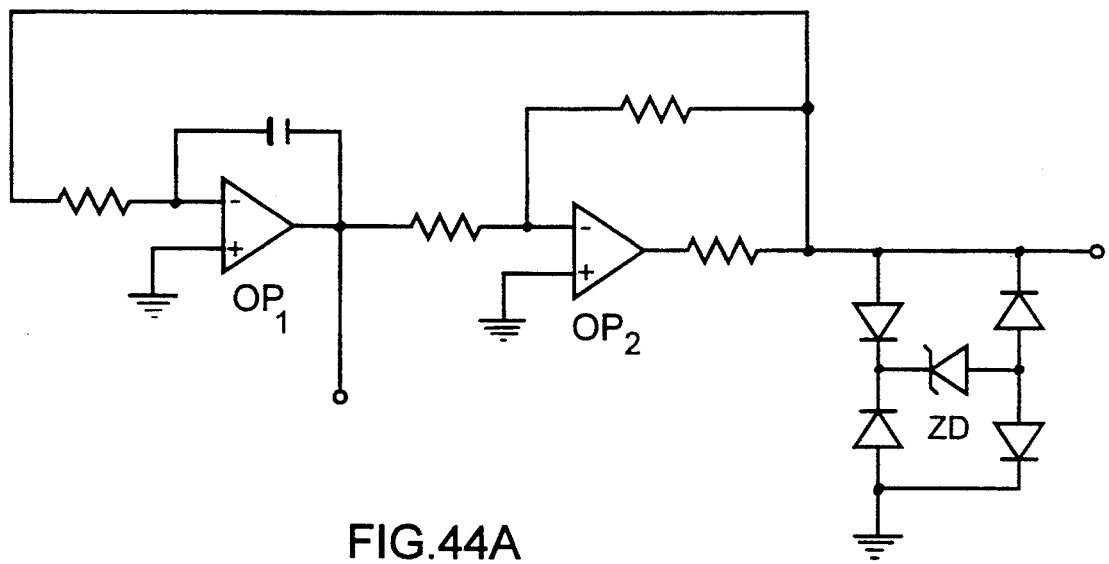
FIG. 44 is a triangular wave-generating circuit.

The above-described triangular wave 8 having the given frequency and the given amplitude is generated by a triangular wave-generating circuit shown in FIG. 44, (a), (b). This generating circuit performs the functions of three components, i.e., an output amplitude limiter, a comparator, and an integrator.

Figure 44B:
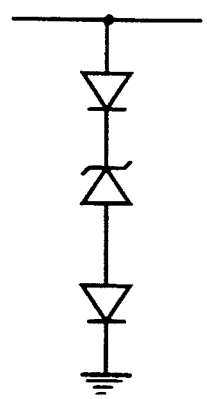

An operational amplifier $OP_1$ integrates the output from an operational amplifier $OP_2$ and converts the incoming rectangular wave into a triangular wave. The output amplitude of the rectangular wave, i.e., the output of the produced triangular wave, is set according to the zener voltage of a zener diode $Z_D$ acting to limit the amplitude of the output. Strictly, the output voltage of the rectangular wave is determined by both diode forward voltage $V_F$ and the zener voltage $V_z$, as shown in FIG. 44(b).

In accordance with the present invention, the circuit is designed, taking account of the temperature characteristics to suppress the effects of temperature variations. That is, the diode forward voltage $V_F$ has a temperature coefficient of $-1.9$ mV/°C. and so a temperature coefficient of $+4.0$ mV/°C. is provided. Therefore, the temperature coefficient of the triangular wave output amplitude can be made zero by using the zener diode $Z_D$ of 8.2 V.

EXAMPLE 2

Figure 3:
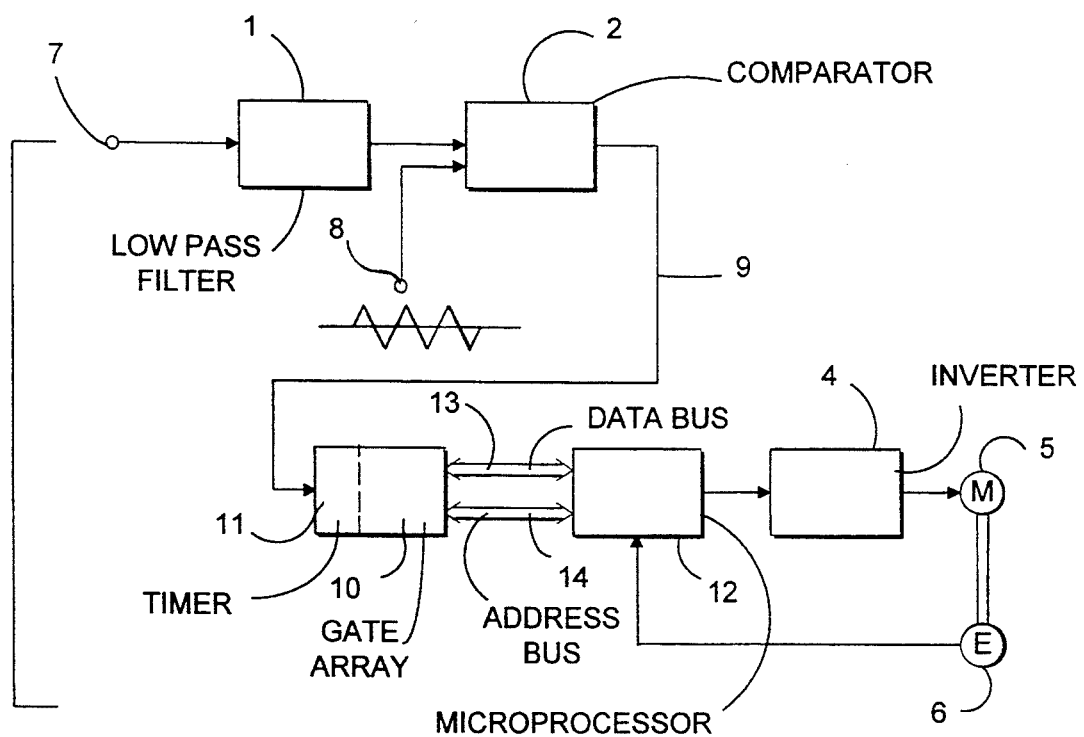
FIG. 3 is a block diagram of a motor control circuit having Example 2 of an analog-to-digital converter circuit according to the invention.

FIG. 3 shows Example 2 which uses a gate array, or logic circuit, 10 incorporating a timer 11. Like elements have identical element numbers. Using the timer 11 inside the gate array 10, those clock pulses which appear during the period of the high or low level of the pulse width-modulated signal from a comparator 2 are counted. Therefore, the timer inside a microprocessor 12 is not used. The gate array 10 is connected with the microprocessor 12 by a data bus 13 and an address bus 14 having an appropriate number of bits.

The operation of Example 2 shown in FIG. 3 is the same as the operation of Example 1 described above and so the operation is not described. Also in Example 2, it is not necessary to use an analog-to-digital converter IC. However, the number of components is increased. The number of the lead wires between the gate arrays 10 and the microprocessor 12 is great. Consequently, Example 1 shown in FIG. 1 is preferable to Example 2. It is to be noted that the present invention is not limited to motor speed control circuits; the invention is applicable also to various analog-to-digital converter circuits.

EXAMPLE 3

As described already in Examples 1 and 2, the speed instruction voltage 7 can be converted into digital form if the counter of the microprocessor 3 counts only those clock pulses which appear during the period of the high level of the pulse width-modulated signal 9. However, if only those clock pulses which appear within the period of the high level of the pulse width-modulated signal 9 are counted, the total count is affected by variations in the frequency of the triangular wave 8 that are caused by temperature variations or by aging. As a result, the accuracy of the analog-to-digital conversion deteriorates. The reason is next described in detail.

As shown in FIGS. 9A and 9B, the case in which the frequency of the triangular wave 8 is low is distinguished from the case in which the frequency is high. It is assumed that the amplitude of the triangular wave 8 is constant and that the level from the output 71 from a low-pass filter 1 is also constant. Where the frequency of the triangular wave 8 is low, as in FIG. 9A, (a) the period of the high level of the pulse width-modulated signal is increased (FIG. 9A, (b)), so that the counted clock pulses are increased in number. The result is that the value of the counter buffer which is digital output data is increased (FIG. 9A, (c)). Conversely, where the frequency of the triangular wave 8 is high, as in FIG. 9B, (a), the period of the high level of the pulse width-modulated signal is decreased, as if FIG. 9B, (b). This reduces the number of clock pulses counted. As a result, the value of the counter buffer, which is digital output data, decreases as shown in FIG. 9B, (c).

Therefore, where only the clock pulses appearing during the period of the high level of the pulse width-modulated signal 9 are counted, if the frequency of the triangular wave 8 is varied by temperature variations or by aging, the total count is affected. This deteriorates the accuracy of the analog-to-digital conversion.

Example 3 which is an improvement over Examples 1 and 2, is next described by referring to FIGS. 4–8. In Example 3, data obtained by analog-to-digital conversion is not affected by the frequency of the triangular wave 8. In this Example 3, an analog-to-digital converter circuit is applied to a motor speed control circuit in the same manner as in the above-described Examples 1 and 2. It is again to be noted that like components are indicated by like reference numerals in the various figures.

Figure 4:
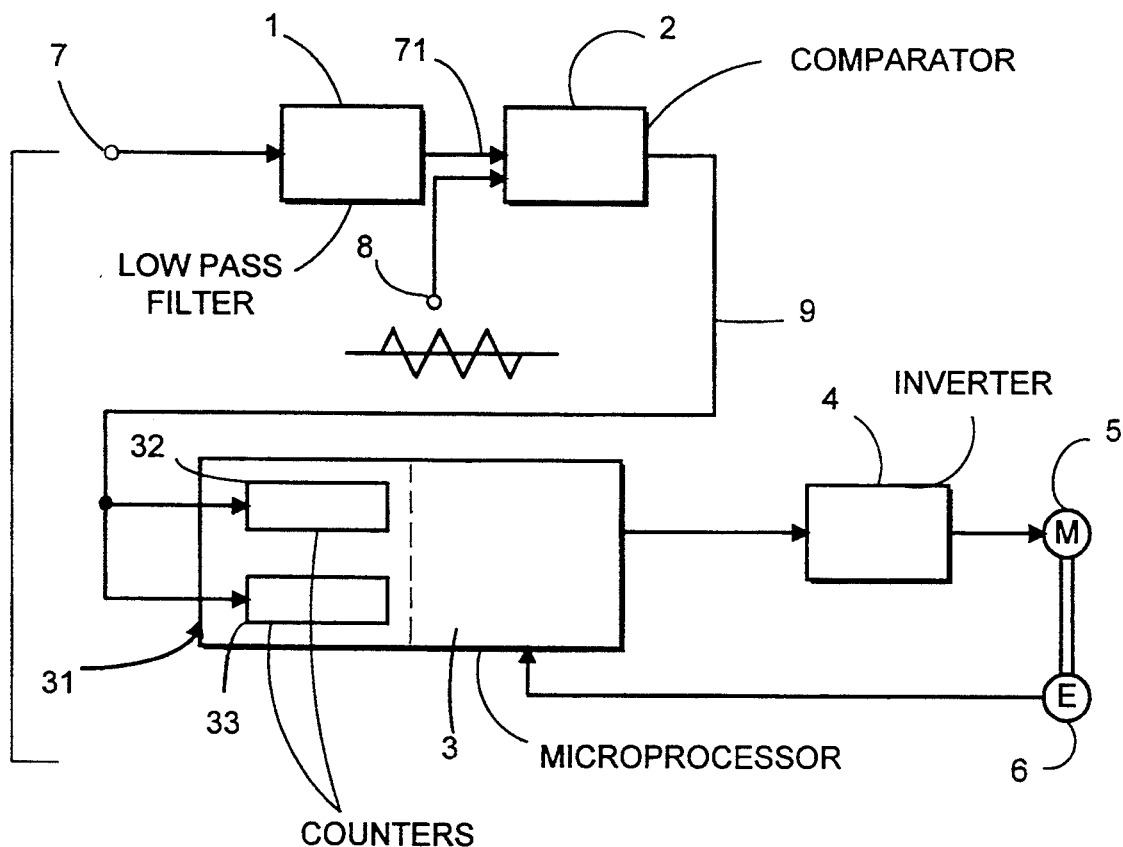
FIG. 4 is a block diagram of a motor control circuit having Example 3 of an analog-to-digital converter circuit according to the invention.

Referring to FIG. 4, as a speed instruction voltage 7 that is an analog signal is applied to a low-pass filter 1. The output from the filter 1 and a triangular wave 8 are applied to a comparator 2. The output from the comparator 2 is applied to a microprocessor 3 having two counters 32 and 33 which correspond to the timer 31 of Examples 1 and 2. The microprocessor 3 produces a digital signal corresponding to the speed instruction voltage 7, using the total counts of the counters 32 and 33. The microprocessor 3 controls an inverter 4 in such a way that the difference between the signal from an encoder 6 indicating the rotational speed of an electric motor 5 and the digital signal is reduced to zero.

Figure 5:
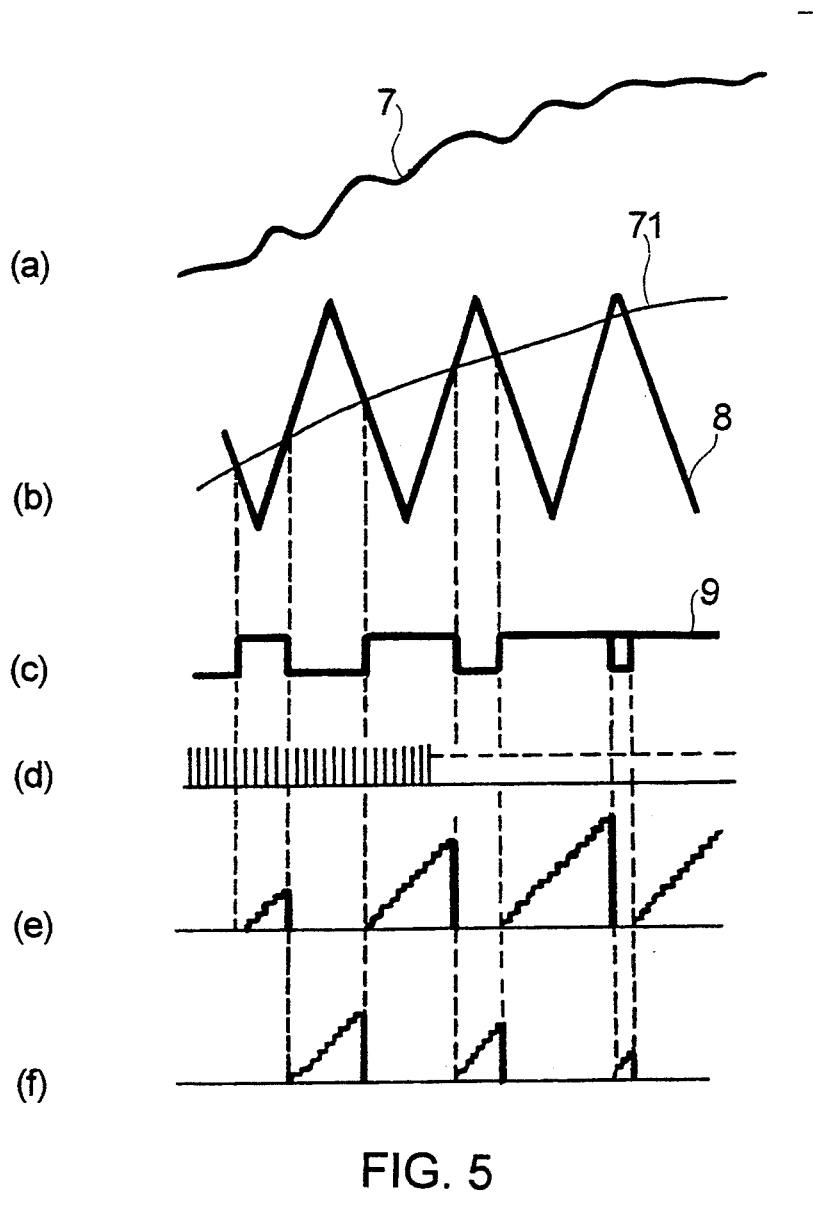
FIG. 5 is a timing chart illustrating the operation of Example 3.
Figure 6:
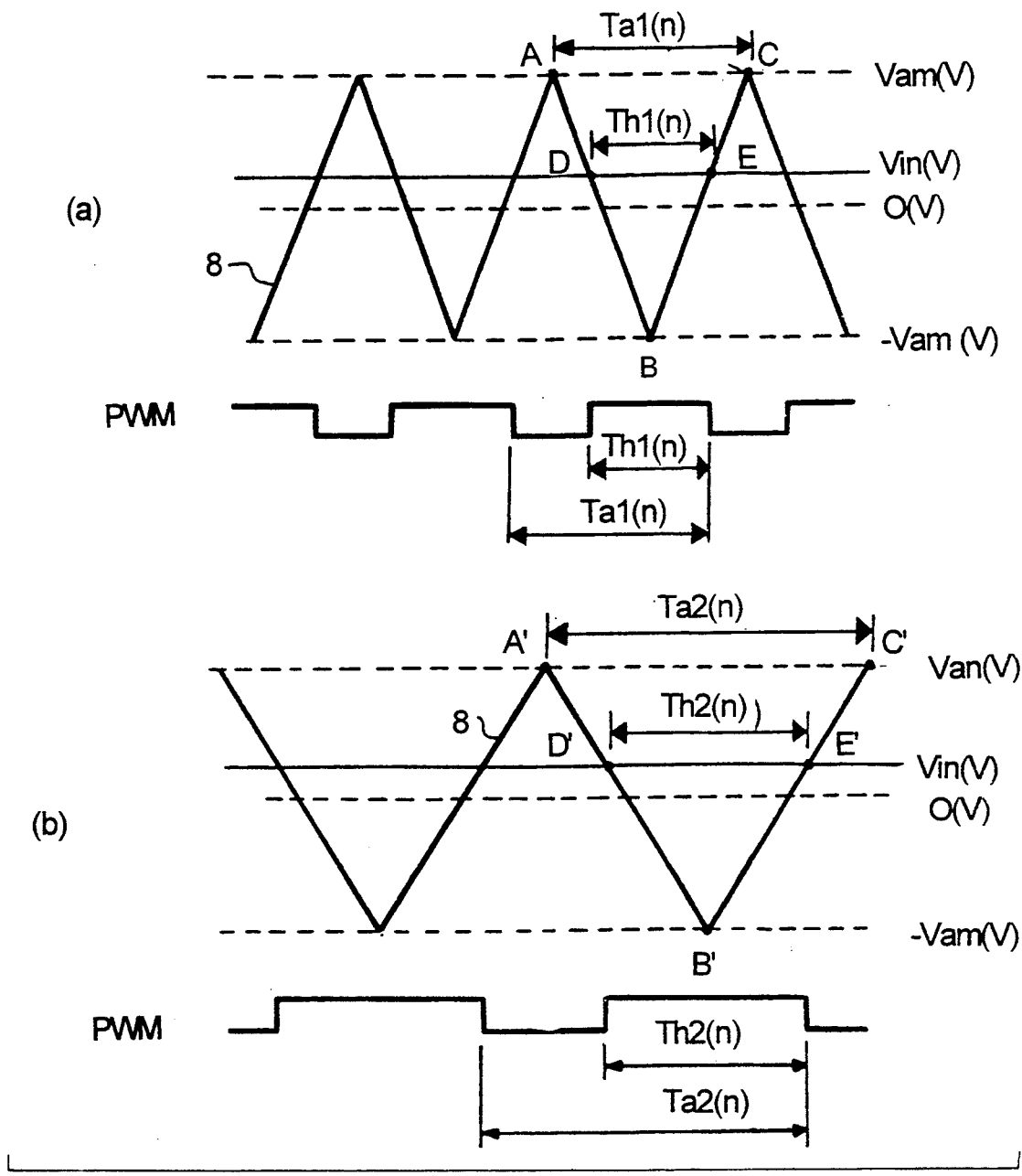
FIG. 6 a timing chart illustrating the pulse width conversion operation of Example 3.

The operation of Example 3 is next described in detail by referring also to FIG. 5. The speed instruction voltage 7 contains noise and other higher harmonics as shown in FIG. 5(a). This voltage 7 is passed through the low-pass filter to remove the higher harmonics. The output from this filter is indicated by numeral 71 in FIG. 5(b).

The low-pass filter output 71 corresponding to the speed instruction voltage 7 is compared with the triangular wave 8 having a constant frequency and a constant amplitude by comparator 2. As shown in FIG. 5(b), the position at which the low-pass filter output 71 corresponding to the speed instruction voltage 7 crosses the triangular wave 8 differs according to the level of the output 71. Therefore, the output from the comparator 2 takes the form of a pulse width-modulated signal 9 varying according to the level of the low-pass filter output 71, as shown in FIG. 5(c). In other words, the width, or duration, of the high level of the pulse width-modulated signal 9 indicates the amplitude of the speed instruction voltage 7. In this Example 3, the components are so connected that the output from the comparator 2, i.e., the pulse width-modulated signal 9, is at high level when the output voltage from the low-pass filter 1 exceeds the voltage of the triangular wave.

The microprocessor 3 produces internal clock pulses of a given frequency to be counted by the counters 32 and 33. FIG. 5(d) shows these clock pulses. The first counter 32 of the microprocessor 3 counts those of the clock pulses which appear within the period of the high level of the pulse width-modulated signal 9 as shown in FIG. 5(e), while the second counter 33 counts those of the clock pulses which exist within the period of the low level of the pulse width-modulated signal 9 as shown in FIG. 5(f). The first counter 32 is so initialized that it stores the total account in the counter buffer on the leading edge of the pulse width-modulated signal 9. Then, the counter 32 causes an interruption and clears the total count. The second counter 33 is initialized in such a manner that it loads the total count into the counter buffer on the leading edge of the pulse width-modulated signal 9, causes an interruption, and clears the total count.

Let $Th(n)$ be the value held in the counter buffer of the first counter 32. Let $Tl(n)$ be the value held in the counter buffer of the second counter 33. "(n)" means that the value is the n-th sample. From the values held in the counter buffers, the microprocessor 3 calculates the sum $$Th(n) + Tl(n) = T\text{all}(n)$$

[(period of the high level)+(period of the low level)=(total period of the triangular wave)]

$T\text{all}(n)$ indicates the total period of the triangular wave when the n-th sample is taken. Then, the microprocessor 3 calculates $\{Th(n)\}/\{T\text{all}(n)\}$, i.e.,[(the period of the high level)/(the total period of the pulse width-modulated signal 9)].

The signal obtained in this way is a digital signal. That is, the speed instruction voltage 7 which is an analog signal shown in FIG. 5(a) is converted into digital form by undergoing a series of operations shown in FIGS. 5(a–f). This digital signal is used as an instructed speed for speed control provided by software. In particular, the microprocessor 3 calculates the difference between the rotational speed of the motor 5 detected by the encoder 6 and the digitized speed instruction value and controls the inverter 4 in such a way that the difference is reduced down to zero.

In the above Example 3, the calculated value of [(the period of the high level of the pulse width-modulated signal 9)/(the total period)] is used. In this case, if the frequency of the triangular wave 8 varies, the digitized value is not affected. The reason is now described by referring to FIGS. 6a and 6b. FIG. 6(a) shows a case in which the frequency of the triangular wave 8 is high. FIG. 6(b) shows a case in which the frequency of the triangular wave 8 is low. Referring to FIG. 6(a), let A and C be two adjacent peaks of the triangular wave 8. Let B be the minimum point between these two peaks A and C. Let D and E be the points at which the output Vin from the low-pass filter crosses the triangular region ΔABC. Let Vam be the voltage at the peaks A and C of the triangular wave 8. Let −Vam be the voltage at the minimum point B. Let $Ta_1(n)$ be the total period of the pulse width-modulated signal, and hence the total period of the triangular wave 8. Let $Th_1(n)$ be the period of the high level of the pulse width-modulated signal. Similarly, with respect to FIG. 6(b), let A', B', C', D' and E', be the points corresponding to the points A, B, C, D, and E, respectively, of FIG. 6(a). Let $Ta_2(n)$ be the total period of the pulse width-modulated signal, or the total period of the triangular wave 8. Let $Th_2(n)$ be the period of the high level of the pulse width-modulated signal.

In FIG. 6(a), if we take notice of similar regions ΔABC and ΔDBE, the relation $$\{[Th_1(n)]/Ta_1(n)\} = (Vam + Vin)/2Vam \quad (1)$$

holds. Similarly, in the case of FIG. 6(b), the relation $$\{[Th_2(n)]/Ta_2(n)\} = (Vam + Vin)/2Vam \quad (2)$$

holds. From equations (1) and (2), we have the relationship $$\{[Th_1(n)]/Ta_1(n)\} = \{[Th_2(n)]/Ta_2(n)\} = \text{(period of high level)/(total period)} = \text{duty cycle} \quad (3)$$

In this way, [(the period of the high level of the pulse width modulated signal 9)/(the total period)] is maintained constant, irrespective of whether the frequency of the triangular wave 8 is high or low. That is, the duty cycle of the pulse width-modulated signal 9 does not depend on the frequency of the triangular wave 8. Therefore, [(the number of the clock pulses counted during the period of the high level)/ (the number of the clock pulse counted during the total period)] does not depend on the frequency of the triangular wave 8. The same result arises if the number of the clock pulses counted during the period of the high level and the number of the clock pulses counted during the total period are multiplied by a constant value. The same result is obtained if [(the number of the clock pulses counted during the period of the low level)/(the number of the clock pulses counted during the total period)] is calculated, or if the quotient is multiplied by a constant value.

EXAMPLE 4

Various modifications of Example 3 are described below. In Example 3 shown in FIG. 4, the two counters 32 and 33 included in the microprocessor 3 count clock pulses appearing during the period of the high level of the pulse width-modulated signal 9 and clock pulses appearing during the period of the low level, respectively. One counter may be a total period counter that counts T all(n). The other counter may be a high-level period counter that counts Th(n). This other counter may also be a low level period counter which counts Tl(n) or finds Th(n) after calculating the difference Th(n)=T all(n)−Tl(n).

Figure 7:
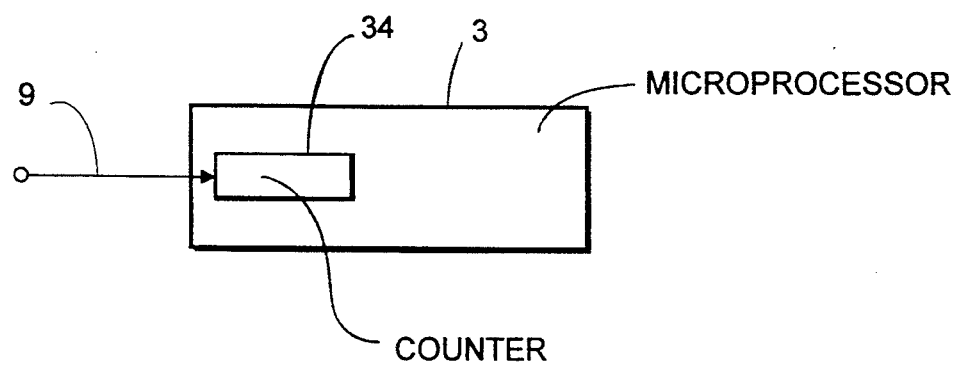
FIG. 7 is a block diagram of Example 4 of an analog-to-digital converter circuit according to the invention.

As described above, Example 3 uses the two counters in the microprocessor 3. Example 4 is shown in FIG. 7, where one counter 34 incorporated in the microprocessor is used to process signals. FIG. 8 illustrates the processing method. The counter 34 is cleared on the leading edge and on the trailing edge of the pulse width-modulated signal. At this time, the peak value in the counter 34 is loaded into the counter buffer. As indicated by points a and b of FIG. 8, a decision is made immediately after the edges of the pulse width-modulated signal 9 to see whether the level of the pulse width-modulated signal 9 is high or low, if the level is low at the point a, the measured value accepted into the counter buffer immediately before is regarded as the measured value obtained during the period of the high level. If the level at the point b point is high, the measured value accepted into the counter buffer immediately before is regarded as the measured value obtained during the period of the low level. The total period is obtainer by adding together these two measured values. Then, the value is processed in the same way as in Example 3 described above to obtain digital data.

As already described in connection with Equation (3), [(the period of the high level)/(the total period)] does not depend on the frequency of the triangular wave 8. The same result is derived by calculating [(the period of the low level)/(the total period)]. If the digital output data is taken to be [(the period of the low level)/(the total period)] or a multiple of this quotient, the data does not depend on the frequency of the triangular wave 8.

EXAMPLE 5

In Examples 3 and 4 described above, an analog-to-digital converter circuit can be fabricated without using an analog-to-digital converter IC. If the frequency of the triangular wave is varied for some reason, the digital output data is not affected. However, in the above-described analog-to-digital converter circuit, the digital output data varies with temperature, for the following reason.

It is assumed that the analog signal 7 shown in FIG. 4 is a constant voltage. If the duty cycle of the pulse width-modulated signal 9, or the [(the period of the high level)/(the total period)], is constant, then the output data given by $$Dout(n) = \{[Th(n)]/[T\,all(n)]\} \times (\text{constant}) \quad (4)$$

should be constant. However, the duty cycle of the pulse width modulated signal 9 varies with temperature variations. As a result, the output data given by equation (4) will also vary. Three major causes of variations in the duty cycle of the pulse width modulated signal 9 are as follows:

(1) The amplitude of the triangular wave varies with temperature.
(2) The DC component of the triangular wave varies with temperature.
(3) The offset voltage of the comparator varies with temperature.

The cause (1) described above can be easily and economically removed by designing the circuit, taking account of the temperature characteristics of the analog devices forming the triangular wave-generating circuit. However, if the circuit devices are selected so as to avoid the problems (2) and (3) above, and no other countermeasures are taken, then the cost is increased considerably.

Figure 12A:
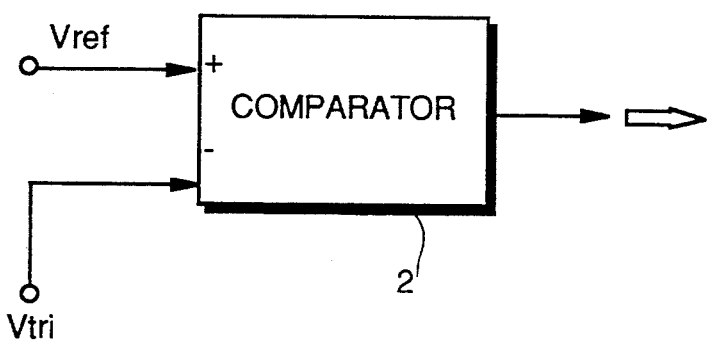
FIGS. 12a and 12b are block diagrams of one model of the comparator used in Example 5.
Figure 12B:
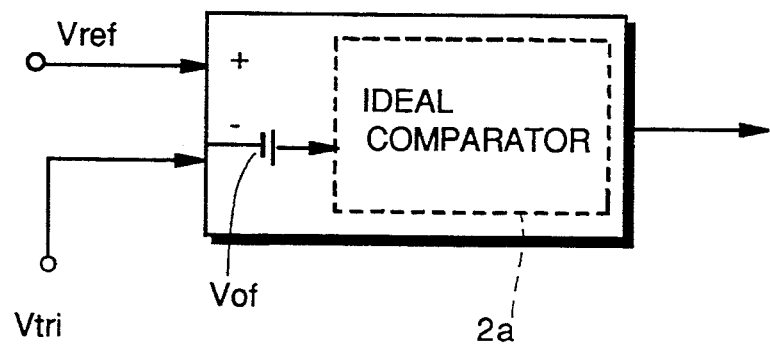
Figure 13:
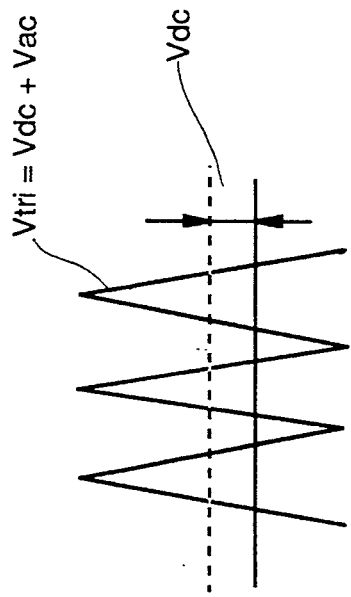
FIGS. 13a and 13b are waveform diagrams showing models of triangular waves used in Example 5.
Figure 13:
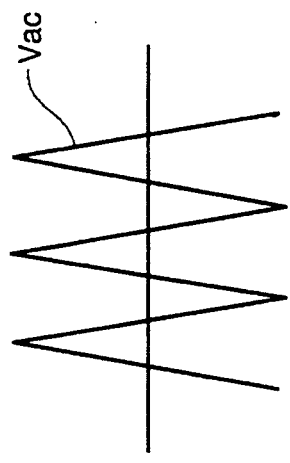

More specifically, the cause of the temperature characteristics of Example 3 shown in FIG. 4 is next discussed. A model of a comparator is shown in FIG. 12. A model of the triangular wave is shown in FIG. 13. The actual comparator 2 shown in FIG. 12(a) can be considered to be an ideal comparator 2a to which an offset voltage Vof is applied, as shown in FIG. 12(b).

The offset voltage Vof has temperature characteristics. The ideal comparator 2a compares Vref, that is, an analog signal with (Vtri+Vof), where Vtri indicates the triangular wave 8.

FIG. 13(a) shows the ideal triangular wave. FIG. 13(b) indicates the actual triangular wave. The actual triangular wave Vtri can be considered to be the AC component Vac of the ideal triangular wave to which a DC component Vdc is added. The DC component has temperature characteristics. Although the amplitude of the AC component Vac also has temperature characteristics, these characteristics can be made negligible compared with the temperature characteristics of Vof and Vdc by designing the circuit while paying attention to the temperature coefficients of the analog devices of the triangular wave-generating circuit as described above.

As can be seen from FIGS. 12 and 13, the input Vref applied to the positive terminal of the comparator 2 is compared with (Vtri+Vof)=(Vac+Vdc+Vof). The temperature characteristics of the Vdc and Vof pose problems. The aforementioned problems (2) and (3) correspond to these problems.

Example 5 of the analog-to-digital converter circuit is next described by referring to FIGS. 10-20. In Example 5, the digital output data is maintained constant if problem (2) occurs, i.e., if the DC component of the triangular wave varies with temperature or if problem (3) occurs, i.e., if the offset voltage of the comparator varies with temperature. In this Example 5, an analog-to-digital converter circuit is applied to a motor speed control circuit, in the same way as in Examples 1-4 described above.

Figure 10:
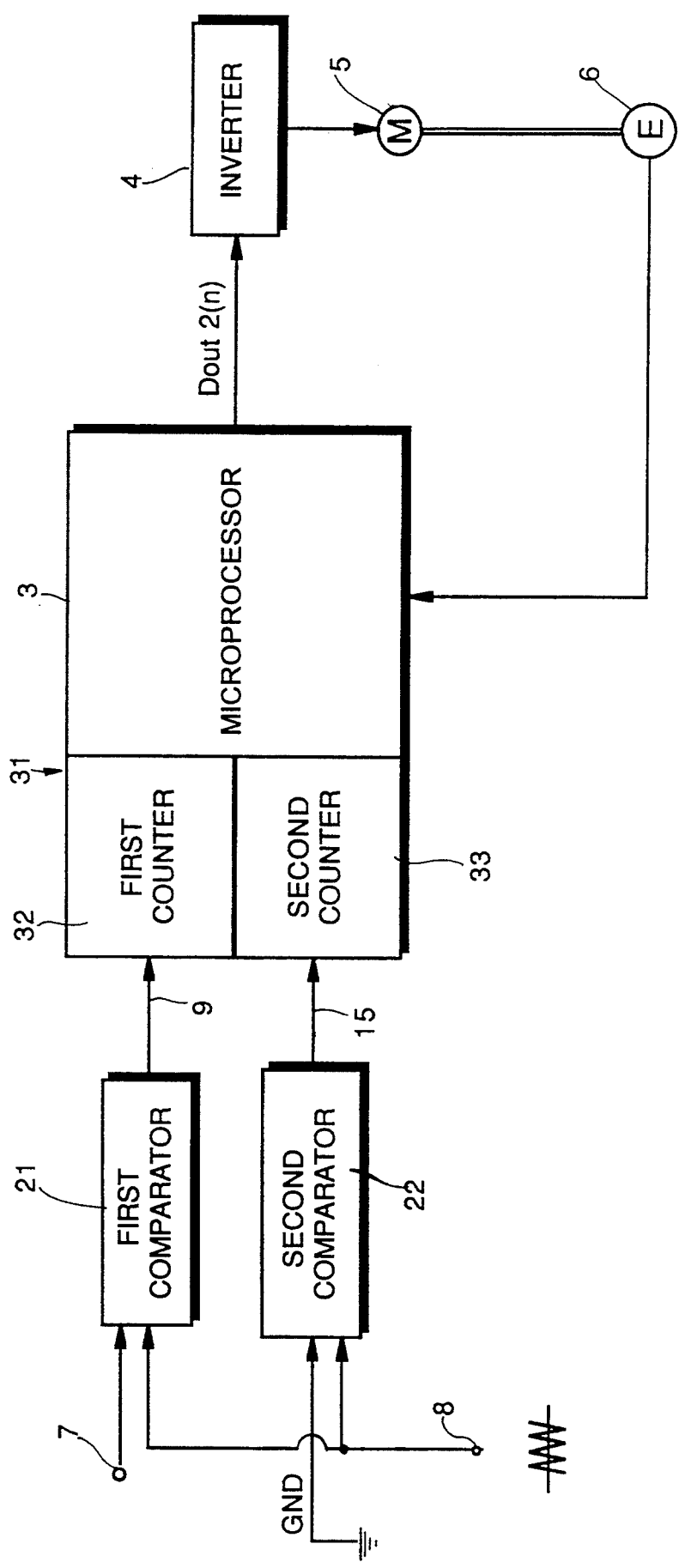
FIG. 10 is a block diagram of Example 5 of an analog-to-digital converter circuit according to the invention.

Referring to FIG. 10, an analog signal 7, that is, a speed instruction voltage, for example, is compared with a triangular wave 8 by a first comparator 21 and converted into a pulse width-modulated signal 9. This signal 9 is applied to a first counter 32 included in a microprocessor 3 which has a second counter 33 in addition to the first counter 32. The triangular wave 8 is compared with a constant voltage (ground voltage in this example) by a second comparator 22, and a rectangular wave 15 is created. This rectangular wave 15 is applied to the second counter 33 of the microprocessor 3. The total count of the first counter 32 corresponds to the duty cycle of the pulse width-modulated signal 9. The total count of the second counter 33 corresponds to the duty cycle of the rectangular wave 15. The microprocessor 3 produces digital data Dout$_2$(n), that is, the difference between data concerning the duty cycle of the pulse width-modulated signal and data about the duty cycle of the rectangular wave 15. The microprocessor controls an inverter 4 in such a way that the difference between the signal from an encoder 6 indicating the rotational speed of an electric motor 5 and the analog signal 7 is reduced to zero.

Figure 11:
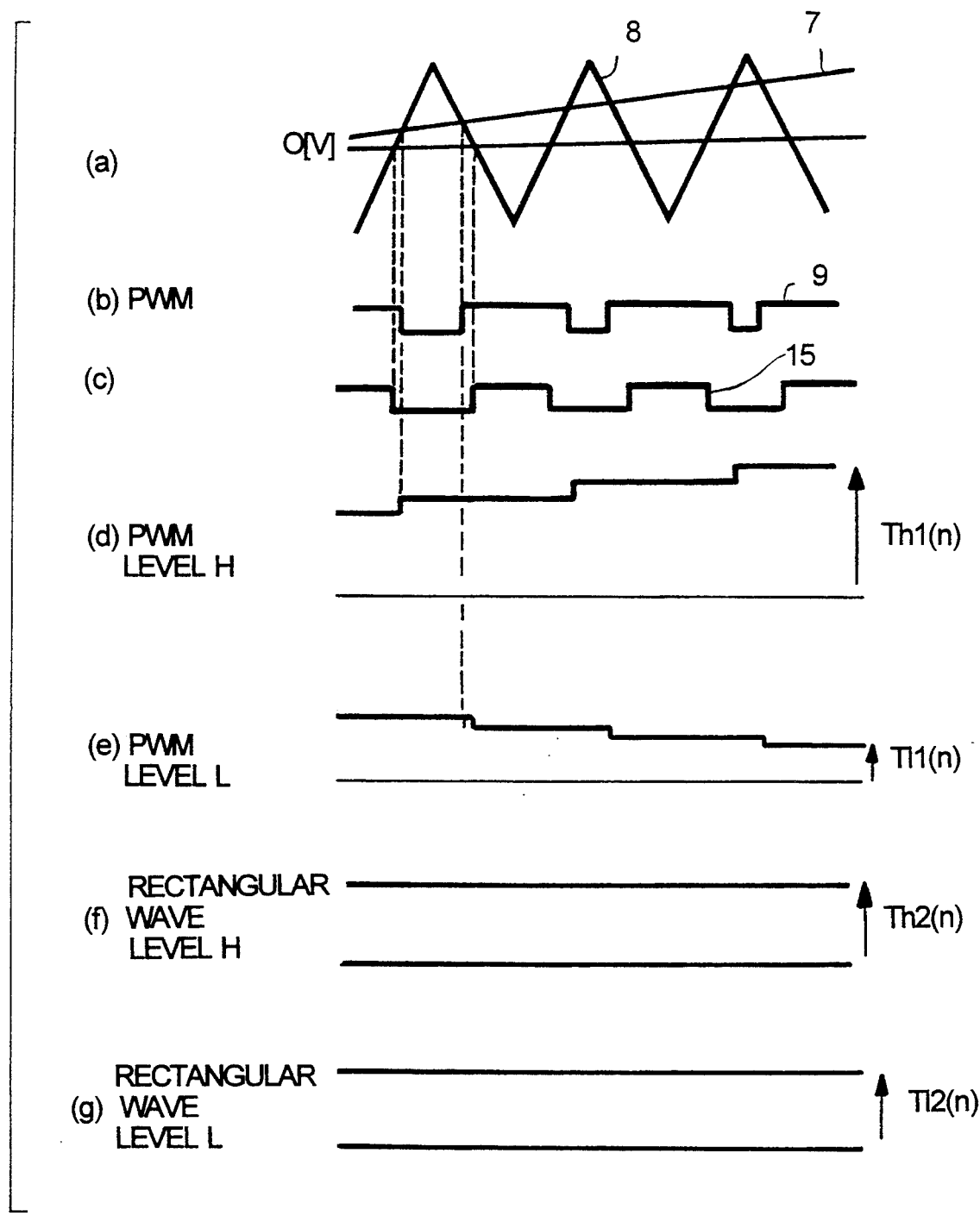
FIG. 11 is a timing chart illustrating the operation of Example 5.

The operation of Example 5 described above is next described in detail by referring also to FIG. 11. The analog signal 7 which is a speed instruction signal is compared with the triangular wave 8 by the first comparator 21. As shown in FIG. 11, (a) and (b), the level at which the analog signal 7 intersects the triangular wave 8 differs according to the level of the analog signal 7. Therefore, the output from the first comparator 21 is the pulse width-modulated signal 9 varying in dependence on the level of the analog signal 7. In this Example 5, the components are so connected that when the voltage of the analog signal 7 is greater than the voltage of the triangular wave 8, the pulse width-modulated signal 9 from the first comparator 21 is at high level.

The second comparator 22 compares the triangular wave 8 with the ground voltage, that is, a constant voltage and produces the rectangular wave 15 shown in FIG. II(c). Since the triangular wave 8 is compared with the ground voltage, or 0 V, the duty cycle of the rectangular wave 15 is approximately 50%.

The first counter 32 and the second counter 33 of the microprocessor 3 count internal clock pulses appearing during the period of the high level and internal clock pulses appearing during the period of the low level of the pulse width-modulated signal 9 and of the rectangular wave 15. Let Th$_1$(n), Tl$_1$(n), Th$_2$(n), and Tl$_2$(n) be the count values of the periods of various levels shown in FIG. 11, (d), (e), (f), (g), respectively, it being noted that (n) indicates the n-th sample. From the count values described above, the microprocessor 3 calculates digital output data Dout$_2$(n) according to the formula $$Dout_2(n) = \frac{K \times Th_1(n)}{Th_2(n) + Tl_2(n)} - \frac{K \times Th_2(n)}{Th_2(n) + Tl_2(n)} + \frac{K}{2} \quad (5)$$

where K is a constant. The first term of equation (5) indicates data about the duty cycle of the pulse width-modulated signal 9. The second term indicates data about the duty cycle of the rectangular wave 15. The third term is a constant value. That is, equation (5) is the difference between the data about the duty cycle of the pulse width-modulated signal 9 and the data about the duty cycle of the rectangular wave 15. The "[Th$_2$(n)+Tl$_2$(n)]" of the denominator indicates the total period. The total period may also be expressed by calculation with the "[Th$_1$(n)+Tl$_1$(n)]" of the pulse width-modulated signal 9 but the pulse width-modulated signal 9 is varying data and contains a large amount of noise. Therefore, the period of the rectangular wave 15 containing a lower amount of noise is used in this example. Since the duty cycle of the rectangular wave 15 is approximately 50%, Th$_2$(n)=Tl$_2$(n). Because of this relation, the sum of the second term of equation (5) {−[K×Th$_2$(n)]/{Th$_2$(n)+Tl$_2$(n)] and the third term [K/2] is approximately 0. Accordingly, in equation (5), the contribution of the first term is large. Therefore, equation (5) is substantially equal to equation (4) above. That is, the second and third terms are correcting terms. The effects of the correction are described below.

Figure 14:
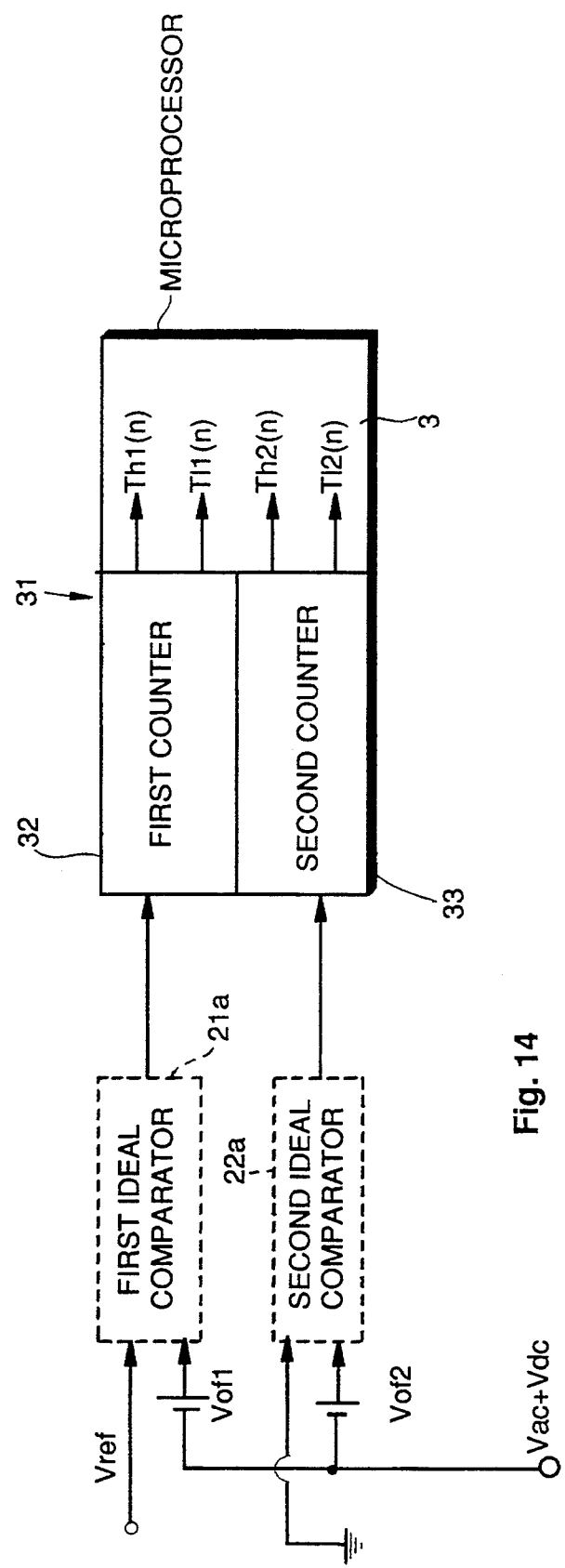
FIG. 14 is a block diagram showing a model which takes into account the temperature characteristics of Example 5.

In FIGS. 14 and 15, the models of FIGS. 12 and 13 are applied to Example 5 shown in FIG. 10. The model of FIG. 15 is similar to the model of FIG. 14 except that Vof$_1$ is replaced by the equivalent DC component of a triangular wave. Th$_1$(n) and Tl$_1$(n) obtained from the first counter 32 can be considered to be measured pulse width-modulated signal values obtained by comparing analog signal Vref and triangular wave (Vac+Vdc+Vof$_1$). Th$_2$(n) and Tl$_2$(n) can be considered to be measured rectangular wave signal values obtained by comparing 0 V and the triangular wave (Vac+Vdc+Vof$_1$,) by means of a comparator having an offset voltage given by $$(Vof_2 - Vof_1) = [(Vof_2 - Vof_1)25°C.] + [(Vof_2 - Vof_1)\Delta t°C.] \quad (6)$$

The first term of the right-hand side of equation (6) indicates the value of (Vof$_2$−Vof$_1$) at 25° C. The second term indicates the amount of variation of $(V_{of_2} - V_{of_1})$ when temperature has changed from 25° C.

We now establish the following two conditions so that the value of equation (6) can be regarded as 0:

(1) the $[(V_{of_2} - V_{of_1})25°\, C.]$ is adjusted with a volume or by software;

(2) One comparator IC which incorporates the first comparator 21 and the second comparator 22 of Example 5 shown in FIG. 10 and in which the temperature characteristics of $V_{of_1}$ and $V_{of_2}$ are substantialy the same is used. By designing the first comparator 21, the second comparator 22, and their peripheral circuits so as to satisfy the two conditions described above, the relation $(V_{of_2} - V_{of_1}) = 0$ can be realized including the temperature characteristics. The condition (1) means that the $[(V_{of_2} - V_{of_1})25°\, C.]$ of FIG. 15, or the first term of equation (6) is set to 0. The condition (2) means that the $[(V_{of_2} - V_{of_1})\Delta t°C.]$, or the second term of equation (6), is set to 0. Therefore, if both conditions (1) and (2) are satisfied, the right-hand side of equation (6) is zero.

Where the conditions (1) and (2) described above apply, Example 5 of FIG. 10 is equivalent to the model of FIG. 16. In the model of FIG. 16, the same triangular wave $(V_{ac} + V_{dc} + V_{of_1})$ is applied to a first ideal comparator 21a and to a second ideal comparator 22a. None of these two comparators 21a, 22a have temperature characteristics. The difference between the temperature characteristics of the offset voltages of the first comparator 21 and the second comparator 22, respectively, is canceled out. $Th_1(n)$, $Tl_1(n)$, $Th_2(n)$, and $Tl_2(n)$ shown in FIGS. 10 and 11 are exactly the same as the counterparts of FIGS. 14–16. Only the models producing the pulse width-modulated signal and the rectangular wave are different.

Figure 17:
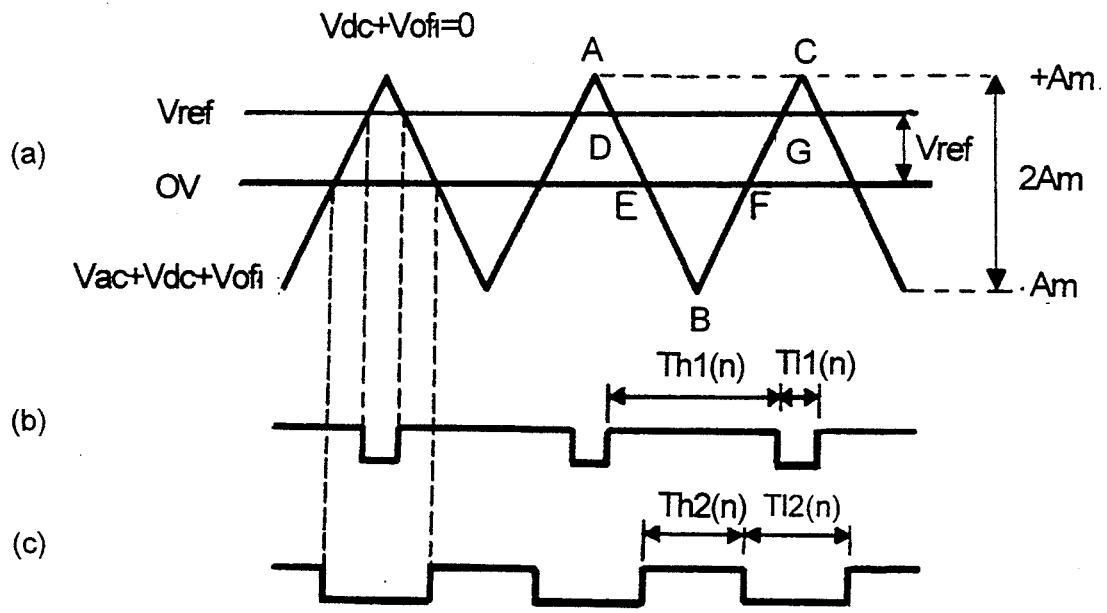
FIG. 17 is a timing chart illustrating the model of FIG. 16, and in which the DC component of the triangular wave and the offset voltages of the comparators vary with temperature.
Figure 18:
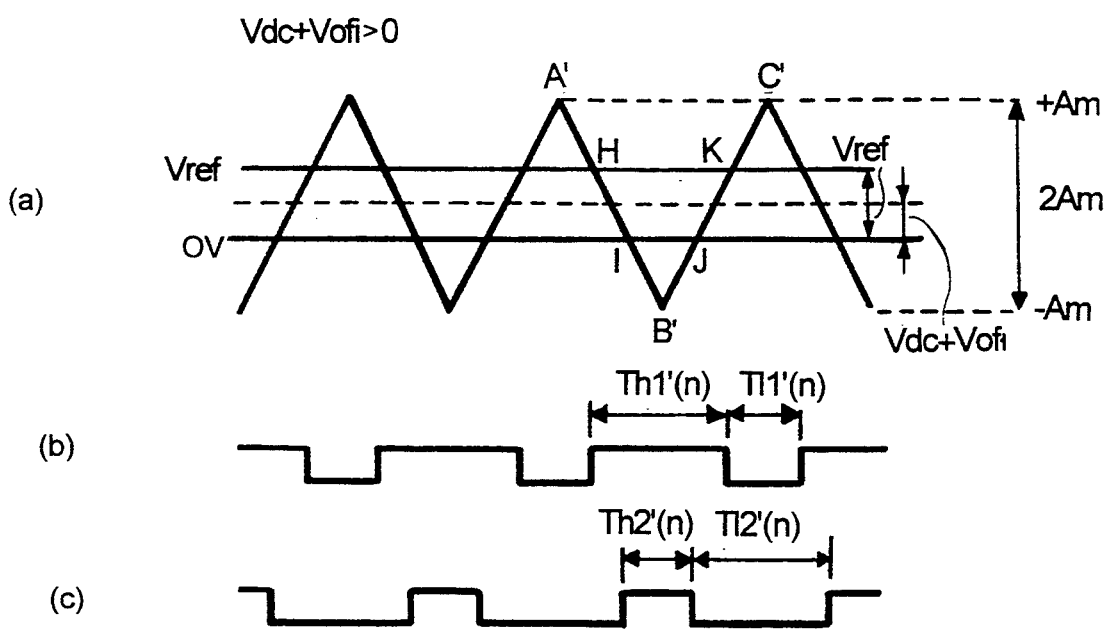
FIG. 18 is a timing chart similar to FIG. 17, but illustrating a different case.

FIGS. 17 and 18 show waveforms obtained when the $(V_{dc} + V_{of_1})$ of the model of FIG. 16 varies with temperature. FIG. 17 shows the waveform when $(V_{dc} + V_{of_1}) = 0$. FIG. 18 shows the waveform when $(V_{dc} + V_{of_1}) > 0$. To discriminate between these two cases, a prime "'" is attached to all of the $Th_1(n)$, $Tl_1(n)$, $Th_2(n)$, and $Tl_2(n)$ of FIG. 18. If the frequency of the triangular wave is sufficiently high compared with variations in $V_{ref}$, and if $V_{ref}$ hardly varies within one period of the triangular wave, then the following relationship holds:

$$Th_1(n) + Tl_1(n) = Th_2(n) + Tl_2(n) = \overline{A-C}$$

The same principle applies in the case of FIG. 18.

In FIG. 17, letting $A_m$ be the amplitude of the triangular wave, we have $$\frac{Th_1(n)}{Th_2(n) + Tl_2(n)} = \frac{\overline{D-G}}{\overline{A-C}} = \frac{A_m + V_{ref}(t)}{2A_m}$$

$$\frac{Th_2(n)}{Th_2(n) + Tl_2(n)} = \frac{\overline{E-F}}{\overline{A-C}} + \frac{A_m}{2A_m} = \frac{1}{2}$$

In the above equation, (t) means that $V_{ref}$ is varying constantly. From equation (5), we get $$D_{out_2}(n) = \frac{K \times \{A_m + V_{ref}(t)\}}{2A_m} = \quad (7)$$

-continued
$$\frac{K}{2} + \frac{K}{2} = \frac{K}{2A_m} \times \{A_m + V_{ref}(t)\}$$

Similarly with respect to FIG. 18, we have the relations $$\frac{Th'_1(n)}{Th'_2(n) + Tl'(n)} = \frac{\overline{H-K}}{\overline{A'-C'}} = \frac{A_m + V_{ref}(t) - V_{dc} - V_{of_1}}{2A_m}$$

$$\frac{Th'_2(n)}{Th'_2(n) + Tl'_2(n)} = \frac{\overline{J-J}}{\overline{A'-C'}} + \frac{A_m - (V_{dc} + V_{of_1})}{2A_m}$$

Therefore, equation (5) can be changed into the form $$D_{out_2}'(n) = \frac{K}{2A_m} \times \{A_m + V_{ref}(t)\} \quad (8)$$

where "'" is attached to indicate that the terms are found from a diagram where the $(V_{dc} + V_{of_1})$ is different.

Equation (7) means that $V_{ref}(t)$ has a linear relation with $D_{out_2}(n)$ and that the analog signal is linearly converted into digital form. Likewise, equation (8) means that $V_{ref}(t)$ has a linear relation with $D_{out_2}'(n)$ and that the analog signal is linearly converted into digital form. Equations (7) and (8) demonstrate that the value of equation (5) is maintained constant if $(V_{dc} + V_{of_1})$ is changed with temperature variations. In FIG. 18, if $\overline{A-C}$ differs from $\overline{A'-C'}$, equation (7) is not different from equation (8). That is, the value of equation (5) remains the same if the frequency of the triangular wave varies.

In the above Example 5 shown in FIG. 10, the output data calculated from equation (5), using the values of $Th_1(n)$, $Tl_1(n)$, $Th_2(n)$, and $Tl_2(n)$ found as illustrated in FIG. 11 results in the features: (a) The data remains the same if the DC component $V_{dc}$ of the triangular wave varies; (b) the data remains the same if the offset voltage $of_1$ of the first comparator varies; and (c) the data remains the same if the frequency of the triangular wave varies provided that the amplitude of the triangular wave does not vary with temperature, i.e., $V_{ac}$ does not vary with temperature and that the difference between the offset voltage of the second comparator and the offset voltage of the first comparator is zero, i.e., equation (6)=0, or the above-described conditions (1) and (2).

Accordingly, if the DC component of the triangular wave varies with temperature, if the offset voltage of the first comparator 21 varies, or if the frequency of the triangular wave varies, the digital data found from equation (5) remains the same. Hence, the temperature characteristics are improved. It can be seen from the condition (2) described above that if $V_{of_2}$ and $V_{of_1}$ are substantially equal in temperature characteristics and if the offset voltage of the second comparator varies with temperature the digital data given by equation (5) is not affected by temperature.

The above-described condition (1), i.e., $[(V_{of_2} - V_{of_1})25°\, C.]$ is adjusted, is used to simplify the model and to facilitate the description. The condition (1) does not affect the conclusion described above. This is described in further detail. Also, a method of adjusting $[(V_{of_2} - V_{of_1})25°\, C.]$ in terms of software instead of adjustment with an externally attached volume is described.

Figure 19:
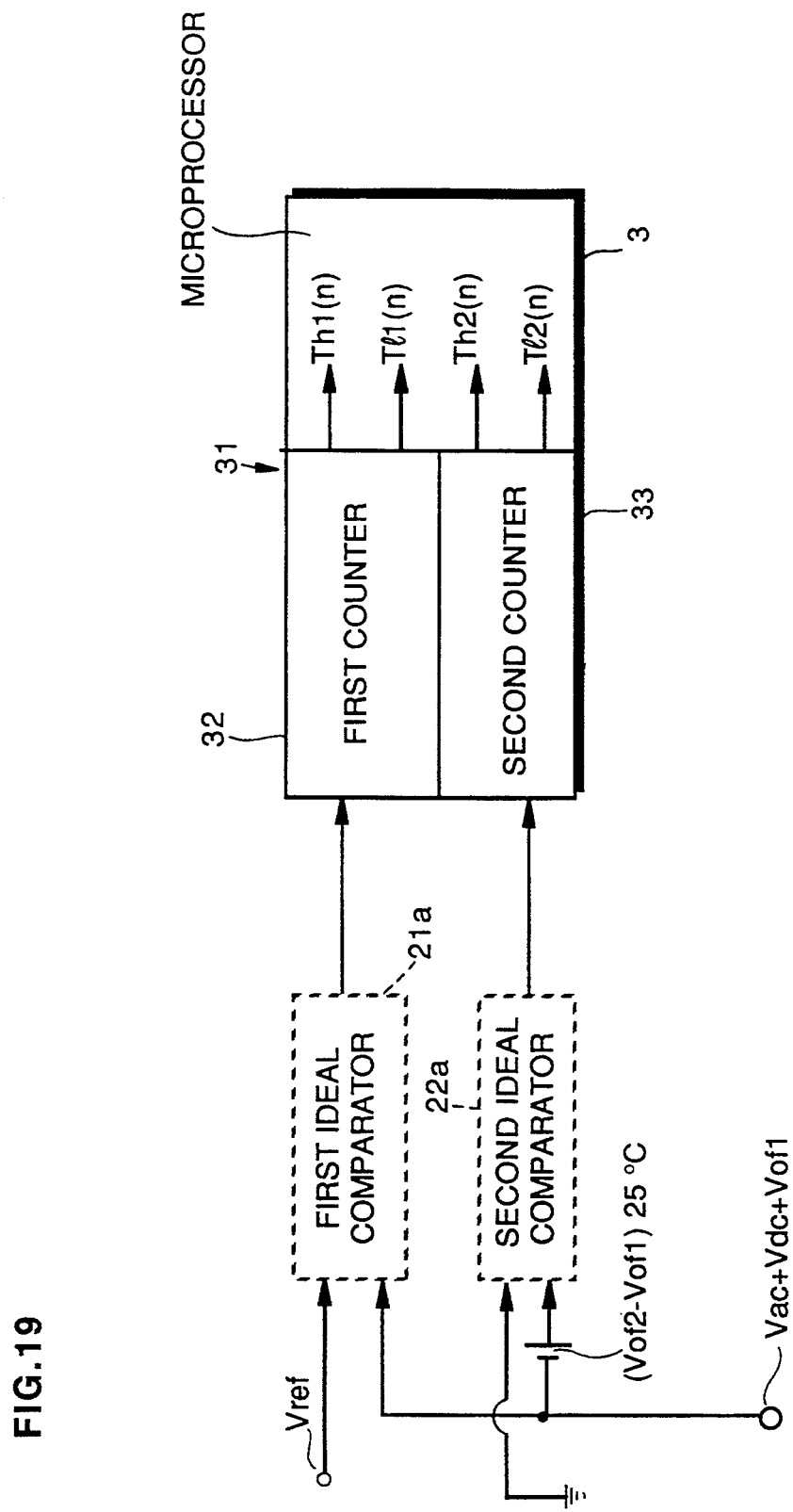
FIG. 19 is a block diagram of a model in which the offset voltage difference between the two comparators of Example 5 is assumed to be unaffected by temperature.
Figure 20:
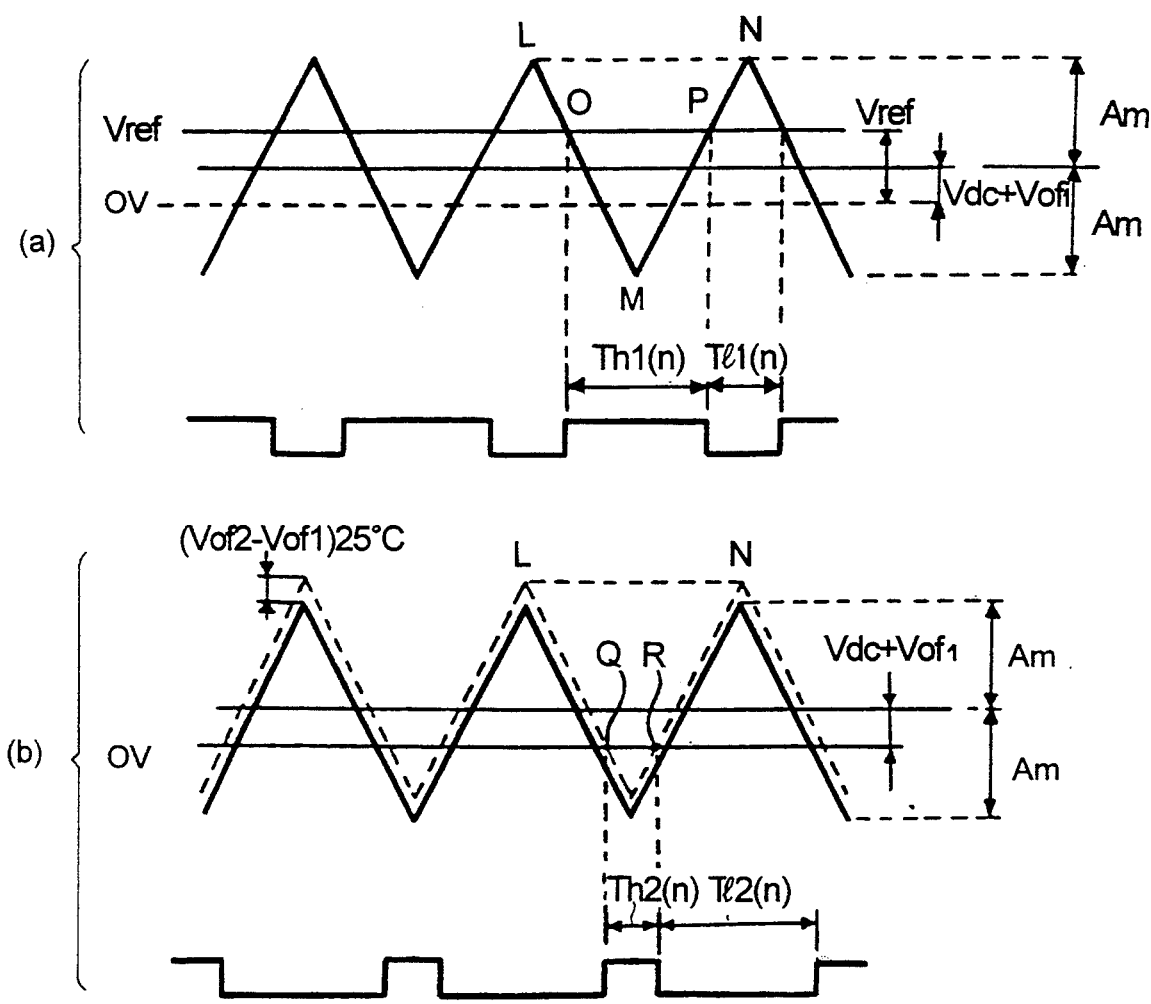
FIG. 20 is a timing chart illustrating the operation of the model of FIG. 19.

FIG. 19 shows a model in which the variation, i.e., $[(Vof_2-Vof_1)\Delta t°C.]$, in the offset voltage difference between the comparators shown in FIG. 15 caused by temperature variations has been adjusted to zero. FIG. 20 illustrates the operation of the first ideal comparator 21a and of the second ideal comparator 22a at this time. The second comparator 22a compares a triangular wave $[Vac+Vdc+Vof_1+Vof_2-Vof_1)25° C.]$ with 0 V. In FIG. 20b, this triangular wave is indicated by the broken line. If the frequency of the triangular wave is higher than the change rate of Vref, the relation holds:

$$Th_1(n)+Tl_1(n)=Th_2(n)+Tl_2(n)=L^-N$$

Each of FIGS. 17 and 18 shows the output of the first ideal comparator 21a and the output of the second ideal comparator 22a at the same time. The first ideal comparator 21a compares the triangular wave with Vref. The second ideal comparator 22a compares the triangular wave with 0 V. FIGS. 17 and 18 show different instants of time. FIG. 20(a) shows the output from the first ideal comparator 21a comparing the triangular wave with Vref. FIG. 20(b) shows the output from the second ideal comparator 22a comparing the triangular wave with 0 V. FIG. 20(a) and FIG. 20(b) show the same instant of time. That is, $L^-N$ of (a) is exactly the same as L N of (b). Therefore, "⁻" is not attached in (b). From FIG. 20(a), we have $$\frac{Th_1(n)}{Th_2(n)+Tl_2(n)} = \frac{Th_1(n)}{Th_1(n)+Tl_1(n)} = \frac{O-P}{L-N} = \frac{Am+Vref-(Vdc+Vof_1)}{2Am}$$

From FIG. 20(b), we have $$\frac{Th_2(n)}{Th_2(n)+Tl_2(n)} = \frac{O-R}{L-N} = \frac{Am-[(Vof_2-Vof_1)25° C.]-(Vdc+Vof_1)}{2Am}$$

By substituting the above two equations into equation (5), we have $$Dout_2(n) = \frac{K}{2Am} \times (Vref(t)+Am) + \frac{K}{2Am}\{(Vof_2-Vof_1)25° C.\} \quad (9)$$

This can be changed into the form $$Dout_2(n) = \frac{K}{2Am}\{(Vof_2-Vof_1)25° C.\} = \frac{K}{2Am}\{Vref(t)+Am\}$$

Comparing this with equation (8) obtained from the model of FIG. 16 shows that only $\{(K/2Am)[(Vof_2-Vof_1)25° C.]\}$ of the left-hand side is different. This term is not affected by temperature.

Therefore, $\{(K/2Am)[(Vof_2-Vof_1)25° C.]\}$ is always subtracted from the value $[Dout_2(n)]$ derived from equation (5) to compensate the offset voltage. This compensated value is taken as $[Dout_2(n)]$. In this case the principle of FIG. 16 applies to the model of FIG. 19 where $[(Vof_2-Vof_1)25° C.]$ is not zero. In this way, the offset voltage can be adjusted in terms of software without relying on an externally attached volume. If the adjustment of the offset voltage is also taken into account, equation (5) is changed into the form $$Dout_2(n) = \frac{K \times Th_1(n)}{Th_2(n)+Tl_2(n)} - \frac{K \times Th_2(n)}{Th_2(n)+Tl_2(n)} + \frac{K}{2} - \frac{K}{2Am}\{(Vof_2-Vof_1)25° C.\} \quad (10)$$

The manner in which $\{(K/2Am)[(Vof_2,-Vof_1)25° C.]\}$ is found is described now. From equation (5), $[Dout_2(n)]$ is found as analog input Vref=0 V. At this time, from equation (9), the digital data $[Dout_2(n)]$ assumes the value $$Dout_2(n) = \frac{K}{2} + \frac{K}{2Am}\{(Vof_2-Vof_1)25° C.\}$$

Since K is a predetermined constant, digital data corresponding to $\{(K/2Am)[(Vof_2-Vof_1)25° C.]\}$ is found from the above equation. That is, when the analog input is null, the deviation of the value of the digital data from (K/2) should be found.

OTHER EXAMPLES

Various modifications of Example 5 are next described. The gist of Example 5 lies in equation (5). That is, (digital output data) = K × {(duty cycle of the output from the first comparator) − (duty cycle of the output from the second comparator) + 1/2} (11)

where K is a constant. To prevent a decrease in the number of digits in multiplication, the right-hand side has been previously multiplied by K. Of course, the multiplication by K may be omitted by ingeniously performing the arithmetic operation. In the above equation, (½) indicates the amount of bias and prevents the digital output from assuming a negative value. Where the digital output can take a negative value, the term (½) may be omitted.

The correction of the offset voltage has been discussed in connection with Equation (10). Where the offset voltages of the used comparators are so small that they can be neglected, the offset voltage correction may not be necessary. In Equation (5), the period of the output from the second comparator is used as the period for finding the duty cycle. Instead, the period of the output from the first comparator may be employed. The input to the second comparator has been set to 0 V. The input voltage can be set to any other voltage as long as it is maintained constant in spite of temperature variations. In Equation (5), the calculation is performed, based on the duty cycle of the high level. The calculation may also be performed, based on the duty cycle of the low level. In the illustrated Example 5, the counter incorporated in the microprocessor is used. Alternatively, a counter circuit is built from the gate array shown in FIG. 3 and other devices. The total count obtained during the period of the high level and the total count obtained during the period of the low level are accepted into a microcomputer to perform the processing of Equation (5) above.

The triangular wave applied to the first comparator is not always required to be the same as the triangular wave applied to the second comparator. The DC component of the triangular wave applied to the first comparator may be different from the DC component of the triangular wave applied to the second comparator. Let $\Delta dc$ be the difference between these two DC components. If ($Vof_2-Vof_1$) of FIG. 15 is replaced by ($Vof_2-Vof_1+\Delta dc$), then the principle described thus far can be used as it is.

EXAMPLE 6

In the various Examples described above, the resolution may not always be sufficiently high. Especially, where the number of clock pulses counted during the period of the high or low level of the pulse width-modulated signal is small, the resolution is low. For example, where the internal frequency of the microprocessor cannot be made high compared with the carrier frequency of the pulse width-modulated signal, the desired resolution cannot be obtained. Also in the above Examples, if noise is contained in the triangular wave-generating circuit, the positive or negative DC power supply of each comparator, or the grounded terminal, then the reference voltage for the comparator and the input voltage vary, causing the duty cycle of the pulse width-modulated signal to change. As a result, the digital output from the A/D converter varies. Especially, where an inexpensive switching power supply is used as the power supply, the apparatus is susceptible to noise.

Accordingly, an analog-to-digital converter circuit which can have an improved resolution and is insusceptible to noise is next described by referring to the drawings.

Referring to FIG. 1, a speed instruction voltage 7 which is an analog signal is applied to a low-pass filter 1. The output from the filter 1 and a triangular wave 8 are applied to a comparator 2. The output from the comparator 2 is applied to a microprocessor 3 having a timer 31. The microprocessor 3 obtains a digital signal corresponding to the speed instruction voltage 7, making use of internal clock pulses and the timer 31. The microprocessor controls an inverte4 4 in such a way that the difference between the signal from an encoder 6 indicating the speed of an electric motor 5 and the digital signal described above decreases to zero.

The operation of this example is next described in detail by referring also to FIG. 2. The speed instruction voltage 7 contains noise and other higher harmonics, as shown in FIG. 2(*a*). This speed instruction voltage 7 is passed through the low-pass filter 1 to remove the higher harmonics from the output from the low-pass filter. This output is indicated by 71 in FIG. 2(*b*).

The low-pass filter output 71 corresponding to the speed instruction voltage 7 is compared with the triangular wave 8 having a constant frequency and a constant amplitude by the comparator 2. As shown in FIG. 2(*b*), the position at which the low-pass filter output 71 corresponding to the speed instruction voltage 7 crosses the triangular wave 8 differs according to the level of the output 71. Therefore, the output from the comparator 2 is changed into a pulse width-modulated signal 9 as shown in FIG. 2(*c*) according to the level of the filter output 71 corresponding to the speed instruction voltage 7. In other words, the width or the duration of the high level of the pulse width-modulated signal 9 indicates the amplitude of the speed instruction voltage 7.

The timer 31 of the microprocessor 3 has a counter that counts the internal clock pulses of a given frequency as shown in FIG. 2(*d*). The internal counter counts those of the clock pulses which appear within the period of the high level of the pulse width modulated signal 9, as shown in FIG. 2(*e*). As shown in FIG. 2(*f*), the counter is so initialized that it loads the total count into a buffer designated as "TIMER" on the trailing edge of the pulse width-modulated signal 9, makes a request for an interruption, and clears the total count. The total count of the counter is a digital signal. The total count on the trailing edge of the pulse width-modulated signal 9 as shown in FIG. 2(*g*) is stored in the counter buffer.

Figure 21:
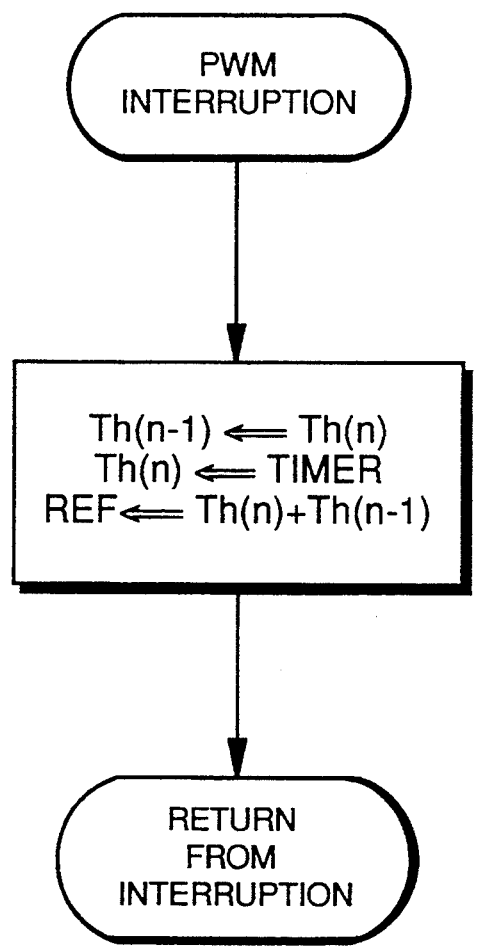
FIG. 21 is a flow chart illustrating an interrupt operation in Example 6 of an analog-to-digital converter circuit according to the invention.

When the above-described request for an interruption is accepted, the processing is performed in the sequence illustrated in FIG. 21. Specifically, (a) data in a RAM designated Th(n) is copied into another RAM designated Th(n−1). (b) The total count of a buffer designated TIMER is copied into the RAM designated Th(n). (c) Data in the RAM designated Th(n) and data in the RAM designated Th(n−1) are summed up and copied into a RAM designated REF. When the interruption terminates, the measured data concerning the period of the high level of the present pulse width-modulated signal is stored in the RAM designated Th(n). The measured data concerning the period of the high level immediately prior to the pulse width-modulated signal is stored in the RAM designated Th(n−1). The sum of both kinds of data is stored in the RAM designated REF. This Example 6 is characterized in that the value stored in the RAM designated REF is used as the output from the A/D converter circuit. In contrast, in the above-described Example 1, the value stored in the RAM designated TIMER is used as the output from the A/D converter circuit.

In this way, the speed instruction voltage 7 which is an analog signal shown in FIG. 2(*a*) is converted into digital form by undergoing a series of operations from FIG. 2(*b*) to FIG. 2(*g*). The value of the counter buffer REF that is a digital signal is used as an instructed speed for speed control provided by software. In particular, the microprocessor 3 calculates the difference between the rotational speed of the motor 5 detected by the encoder 6 and the digitized speed instruction value and controls the inverted 4 in such a way that the difference is reduced to zero.

Figure 22:
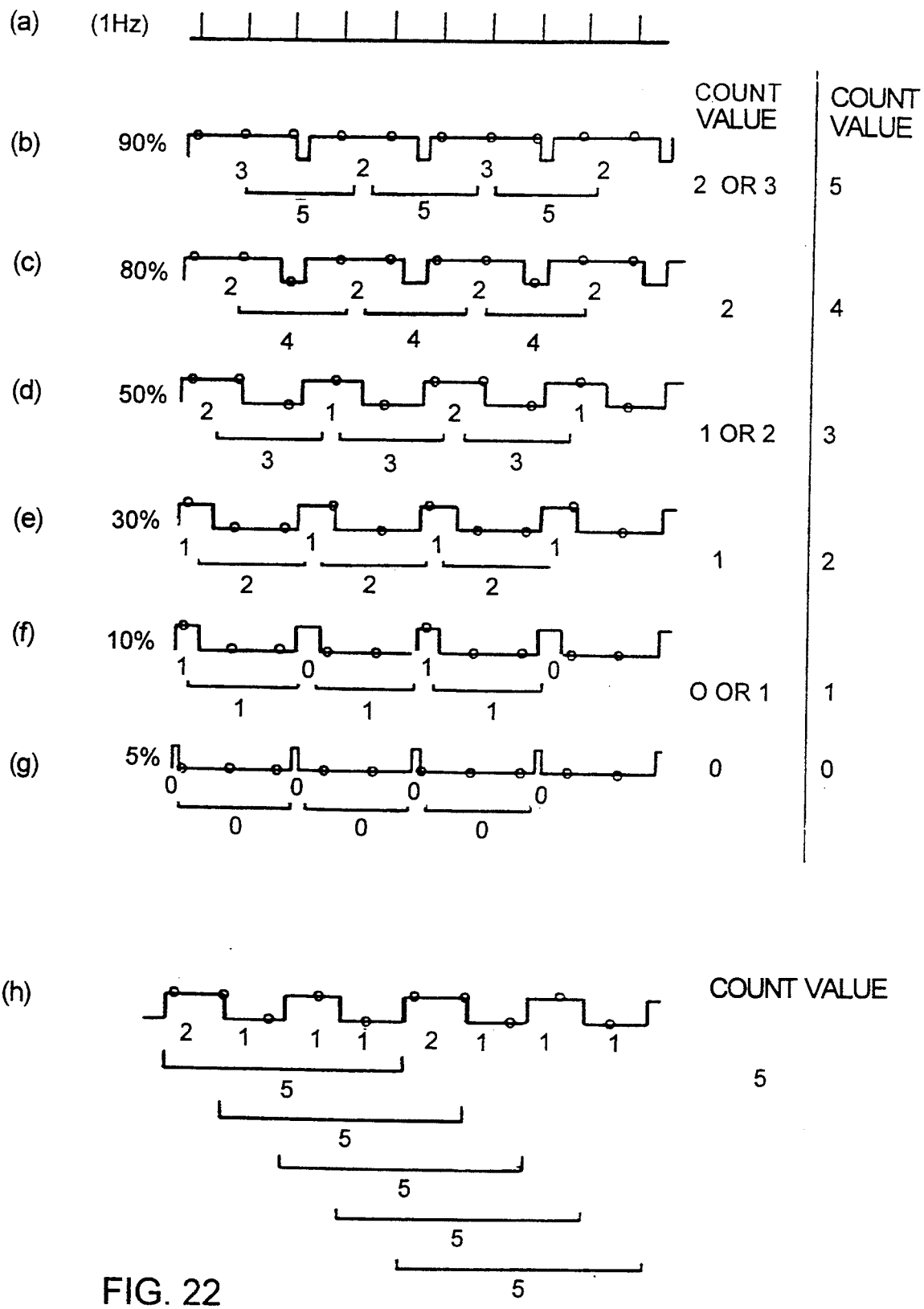
FIG. 22 is a waveform diagram illustrating the effects of improvement in the resolution of Example 6 under certain conditions.

In this Example 6, the sum of the present measured value in the timer 31 and the previous measured value is taken as a digital output. This improves the resolution of the output from the analog-to-digital converter circuit. The reason is next described in detail by referring to FIGS. 22 and 23. To facilitate the description, it is assumed that the frequency of the internal clock pulses is 1 Hz and that the frequency of the triangular wave is 2.5 Hz, as shown in FIG. 22. Since the internal clock pulses are asynchronous with the triangular wave, the actual situation is not always coincident with FIG. 22; such cases which are easy to explain are selected and illustrated. FIG. 22(*a*) shows the internal clock pulses. FIG. 22, (*b*)–(*g*), show pulse width modulated signals having duty cycles of 90%, 80%, 50%, 30%, 10%, 5%, respectively. The circles on the waveforms of FIG. 22, (*b*)–(*g*), show samples taken in synchronism with the internal clock pulses. The numeral put at the first stage of each of the figures (*b*)–(*g*) indicates the value counted during the period of the high level. The numeral put at the second stage indicates the value (corresponding to the value stored in the RAM designated REF of FIG. 21) obtained by summing together the previous count value (corresponding to Th(n−1) of FIG. 21) and the present count value (corresponding to Th(n) of FIG. 21).

We now take FIG. 22(b) as an example. When the duty cycle of the pulse width-modulated signal is 90%, the count value of the clock pulses obtained during the period of the high level is 2 or 3. The sum of the previous count value and the present count value is 5. As the duty cycle successively decreases from (c) to (g), the count value obtained during the period of the high level decreases successively. Finally, the value decreases to zero. Also the sum value decreases to zero. Therefore, the count values about the high level can take four values from 3 to 0, depending on the duty cycle of the pulse width-modulated signal. On the other hand, the value obtained by summing up the two values derived from two successive periods of high level can assume 6 values from 5 to 0. That is, the sum value can take more values than the single count value. Hence, the resolution of the digital output is improved by a factor of 1.5.

Figure 23:
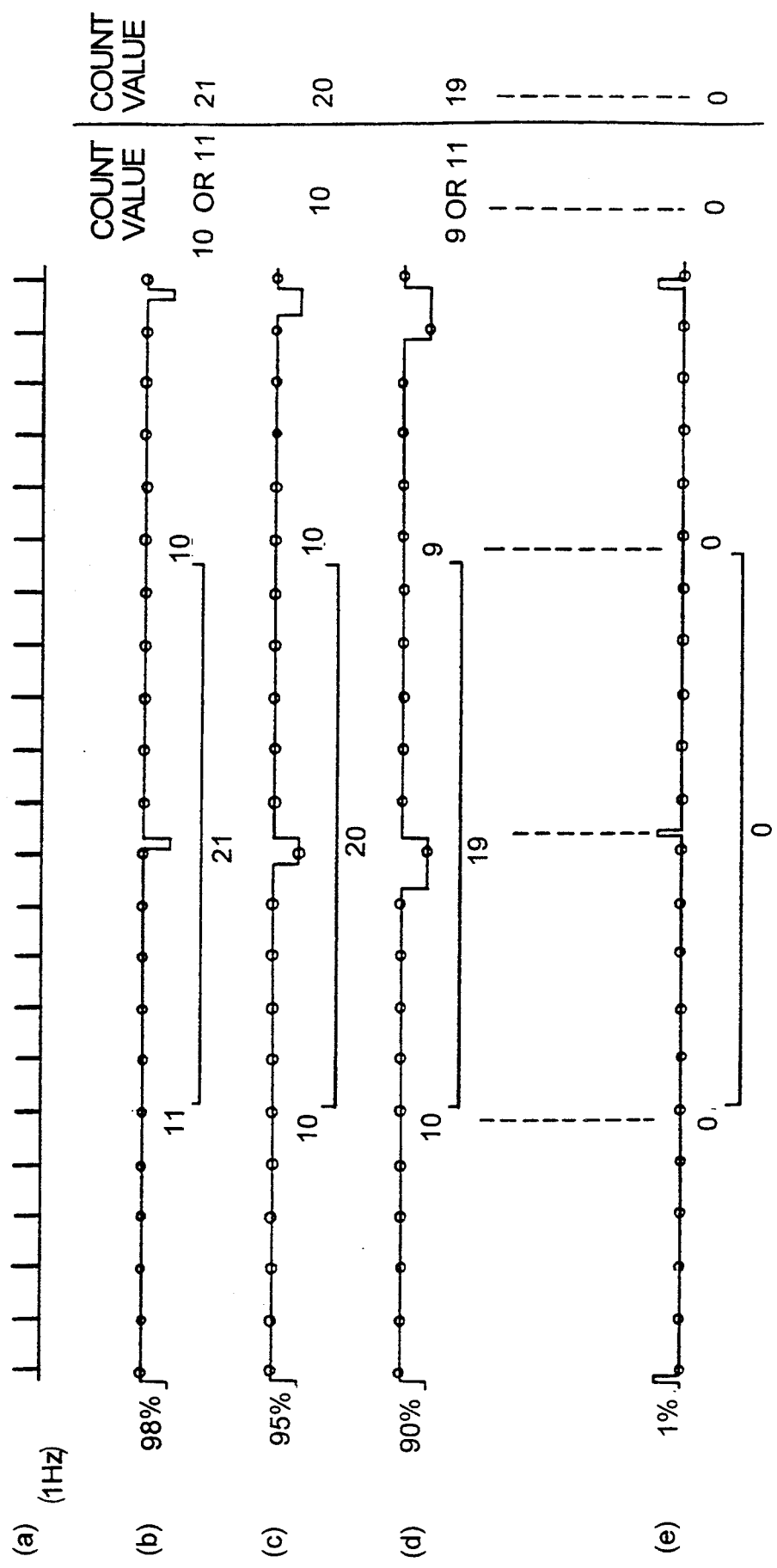
FIG. 23 is a waveform diagram illustrating the effects of improvement in the resolution of Example 6 under other conditions.

FIG. 23 shows the case in which the internal clock pulses have a frequency of 1 Hz, and the triangular wave has a frequency of 11 Hz. That is, both signals widely differ in frequency. The count value obtained during the period of the high level of the pulse width-modulated signal can take 12 values from 11 to 0. The sum value can assume 22 values from 21 to 0. Consequently, the resolution is improved by a factor of $22/12 \simeq 1.83$ by using the sum value. In this way, as the difference in frequency between the internal clock pulses and the triangular wave increases, the ratio of the range of the single values to the range of the sum values approaches 2. That is, the resolution is approximately doubled by using the sum value. Practically, the frequency of the internal clock pulse is selected to be several MHz. The frequency of the triangular wave is selected from the range from hundreds of Hz to several kHz.

In the above Example 6, the sum of the present measured value in the counter incorporated in the timer 31 and the previous measured value is taken as digital output, whereby the circuit is operated as a low-pass filter. This improves the resistance to noise, for the reason described below. In the field of digital signal processing, the operation for producing the sum of the present value and the previous value of a numerical value applied at regular intervals of time is known as a primary FIR filter. It is known that this operates as a low-pass filter. FIR stands for finite impulse response. The FIR filter is shown in the block diagram of FIG. 24. In FIG. 24, $Z^{-1}$ indicates the function of storing the previous value.

In Example 6, the operation for summing up the two successive values is performed in every interruption, i.e., on ever trailing edge of the pulse width-modulated signal. The operation is not always performed at regular intervals of time. Therefore, the function does not completely agree with the function of the above described FIR filter which sums up two values at regular intervals of time. However, where the duty cycle of the pulse width modulated signal changes only a little, i.e., where the amplitude of the input signal to the analog-to-digital converter circuit is small, the previous data and the present data are summed up substantially at regular intervals of time. Hence, the same function as the FIR filter is performed. In this way, noises of higher frequencies can be reduced by the summation operation.

In Example 6, the clock pulses are counted during the period of the high level of the pulse width-modulated signal, as shown in FIG. 2, (c), (d), (e). The clock pulses may be counted during the period of the low level of the pulse width-modulated signal. In this case, as the speed instruction voltage increases, the count value decreases.

In Example 6, the previous data and the present data are summed up in interruption processing which is performed on every trailing edge of the pulse width-modulated signal. Where the output from the analog-to-digital converter circuit is not used on every trailing edge of the pulse width-modulated signal, the summation operation is not required to be performed on every trailing edge of the pulse width-modulated signal. For example, where the output from the analog-to-digital converter circuit should be used every 1 msec, the summation operation is carried out in the processing which is performed every 1 msec. This processing performed every 1 msec may be an interruption. Where strict time control is not necessary, the summation operation may be performed by a routine executed at regular intervals rather than interruption.

FIG. 25 shows the case in which the summation operation is carried out every 1 msec. As illustrated in FIG. 25(a), the loading of the previous data into the RAM designated Th(n−1) and the loading of the present data into the RAM designated Th(n) are executed in interruption on every trailing edge of the pulse width modulated signal. As illustrated in FIG. 25(b), in the interruption on every trailing edge of the pulse width-modulated signal, processing for finding REF is carried out every 1 msec. Control then goes to interrupt processing where the whole system is operated. Since the value in the REF, that is, a sum value, is not updated on every trailing edge of the pulse width-modulated signal, the real-time characteristic of the digital output signal is poor. Where it is desired to obtain an output for operating the system every 1 msec by the use of the analog-to-digital converter circuit, the software illustrated in FIG. 25 suffices.

In the example of FIG. 25, the previous data and the present data are summed up every 1 msec. In order to obtain the same effects as in the case of FIG. 21, the two kinds of data are preferably summed up at intervals substantially equal to the intervals of the triangular wave. In practice, the circuit is so designed that the ratio of the previous value to the present value ranges from about $\frac{1}{4}$ to 4. To accurately measure the period of the high level of the pulse width-modulated signal, the priority given to the interruption processing illustrated in FIG. 25(b) should be lower than the priority given to the interruption processing illustrated in (a). That is, the conditions are so set that an interruption is caused on every trailing edge of the pulse width-modulated signal. For the same reason, the processing of (b) should be so set that multiple interruption is allowed.

Figure 27:
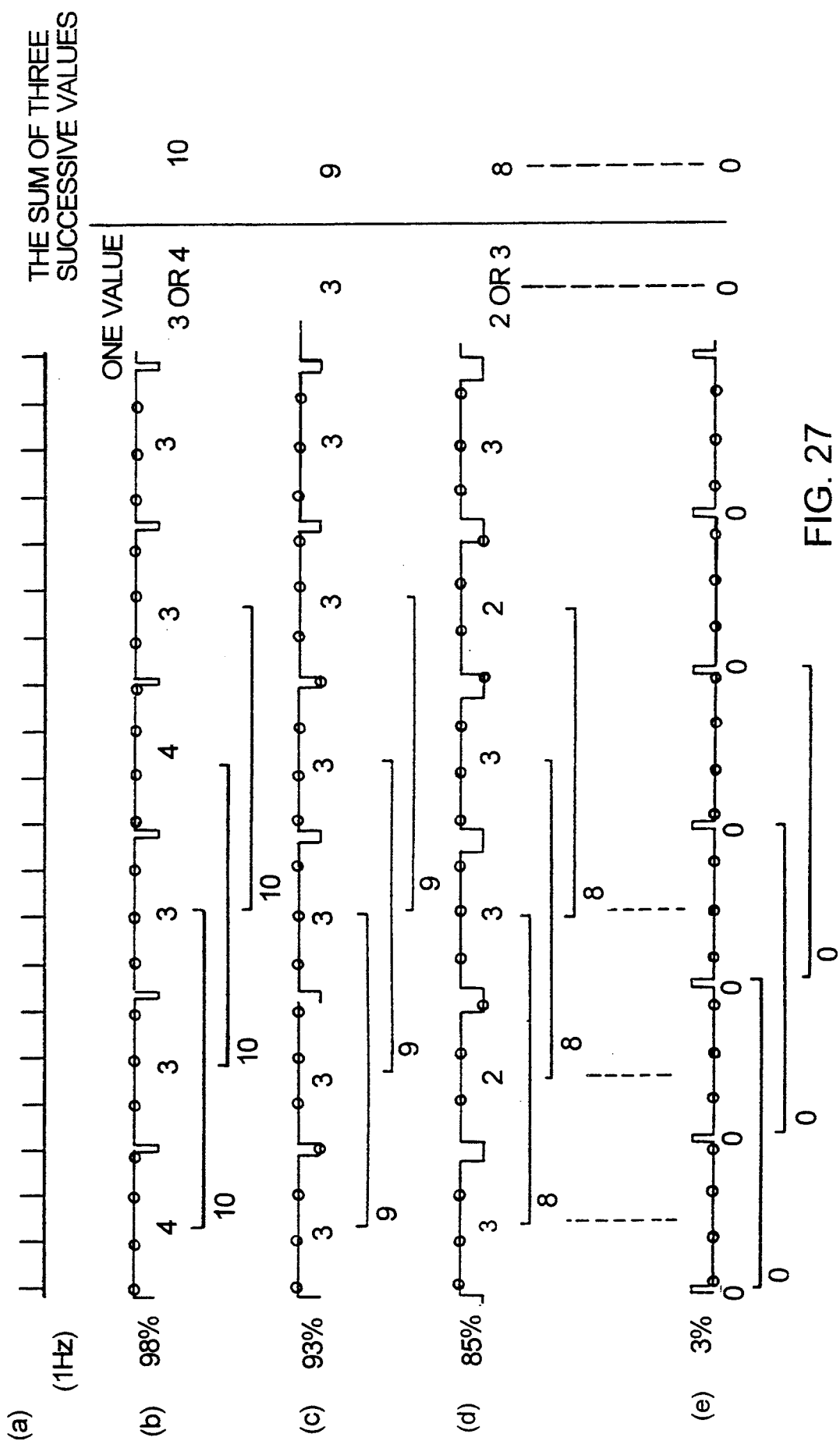
FIG. 27 is a waveform diagram illustrating the effects of improvement in the resolution of the example of FIG. 26 under certain conditions.

In Example 6 described thus far, two successive values in the counter obtained from the period of the high or low level of the pulse width-modulated signal are summed up. Three successive values may also be summed up. This example is illustrated in FIGS. 26 and 27. In FIG. 27, the internal clock pulses and the triangular wave have frequencies of 1 Hz and 3/10 Hz, respectively. Data obtained from one measurement can take five values from 0 to 4. The sum of three successive values can assume 11 values from 0 to 10. This improves the resolution by a factor of 2.2. As described above, as the difference in frequency between the internal clock pulses and the triangular wave increases, the resolution is improved, and the resolution approaches three times. At this time, the interruption on every trailing edge of the pulse width-modulated signal is performed as illustrated in FIG. 26. Also in this case, the processing for finding REX can be executed by a separate processing routine, as illustrated in FIG. 25.

Figure 28:
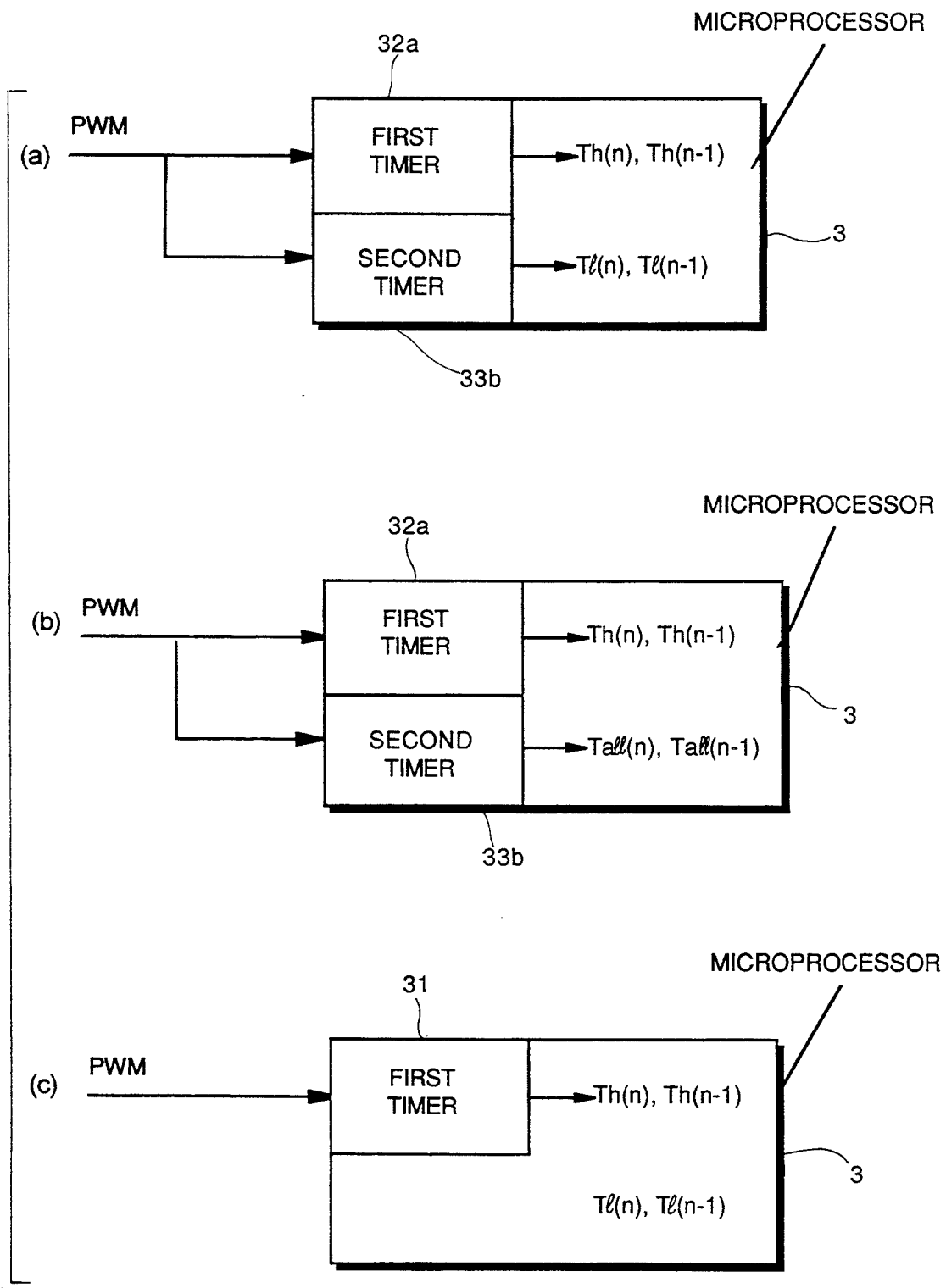
FIGS. 28a, 28b, and 28c show block diagrams illustrating various other modifications of Example 6 of analog-to-digital converter circuit according to the invention.
Figure 29:
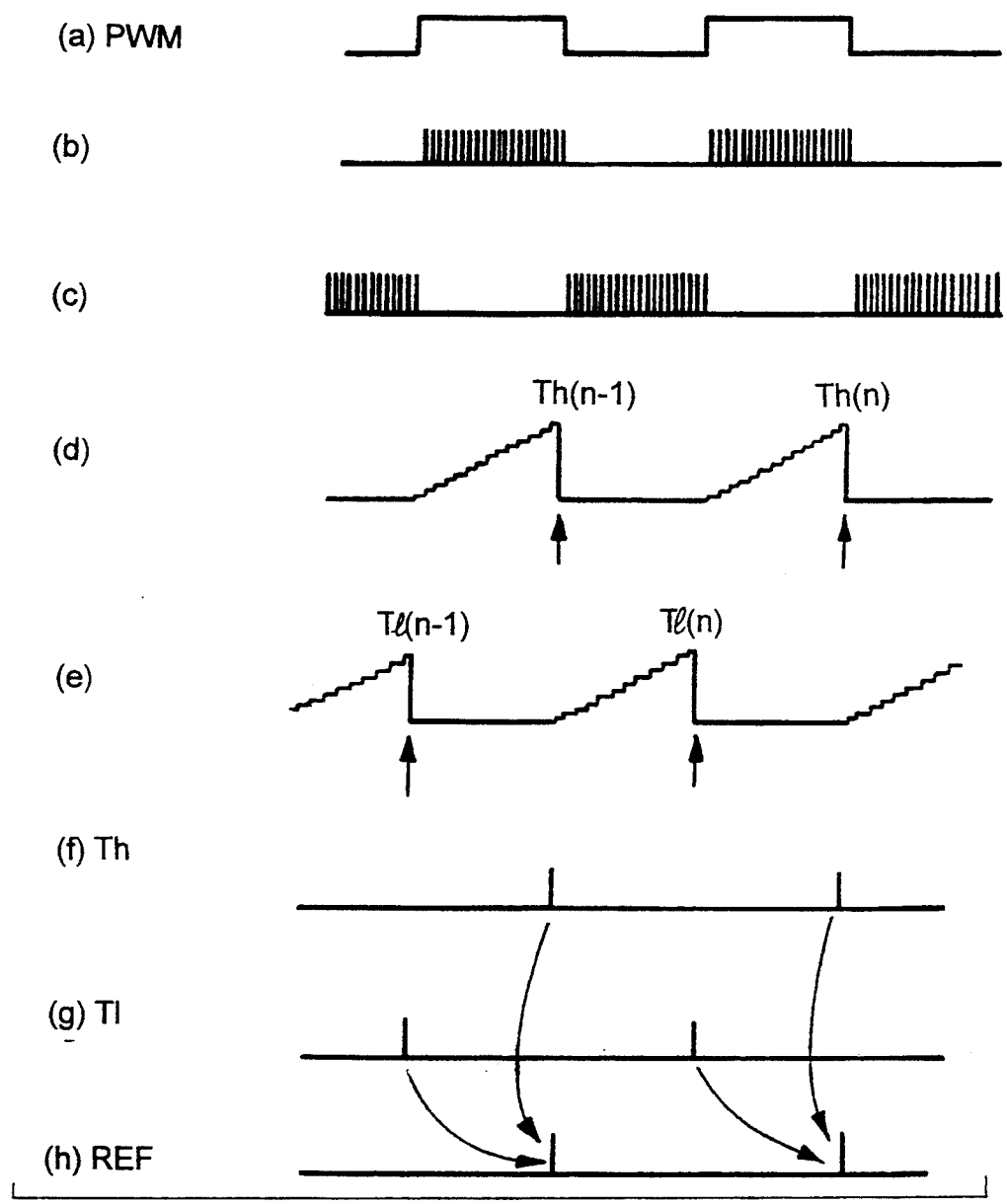
FIG. 29 is a timing chart illustrating the operation of the example of FIG. 28(a)

Furthermore, data obtained from four or five successive measurements may be summed up. However, if the number of the values summed up increases, the interruption time is prolonged. Also, the response time of the analog-to-digital converter circuit is increased. In consequence, addition of two through four values is practical. In the above Example 6, values obtained during the period of the high or low level of the pulse width-modulated signal are summed up and taken as digital output. In the same way as in Examples 3 and 4 described above, in order to compensate the changes in the frequency of the triangular wave, [(the period of the high level)/(the total period)], or [(the period of the low level)/(the total period)] of the pulse width-modulated signal, or multiples of these periods may be measured. FIG. 28, (a), (b), (c), illustrate these examples. FIG. 29 illustrates the operation of the example of FIG. 28(a).

The example of FIG. 28(a) is first described. The pulse width-modulated signal is applied to first and second timers incorporated in a microprocessor 3. The first and second timers are indicated by 32a and 33b, respectively. The first timer counts internal clock pulses appearing during the period of the high level of the pulse width-modulated signal. The first timer measures the period of the high level of the pulse width-modulated signal. The second timer measures the period of the low level of the pulse width-modulated signal, utilizing the internal clock pulses. The counter 1 of the first timer is so initialized that it counts internal clock pulses appearing during the period of the high level of the pulse width-modulated signal, loads the total count into a buffer designated TIMER1 on every trailing edge of the pulse width-modulated signal, and makes a request for a first timer interruption, and clears the total count. The counter 2 of the second timer is so initialized that it counts internal clock pulses appearing during the period of the low level of the pulse width-modulated signal, loads the total count into a buffer designated TIMER2 on every leading edge of the pulse width-modulated signal, makes a request for a second timer interruption, and clears the total count. Therefore, the newest value about the period of the high level is always stored in the buffer designated Timer1. The newest value about the period of the low level is stored in the buffer designated TIMER2.

Figure 30:
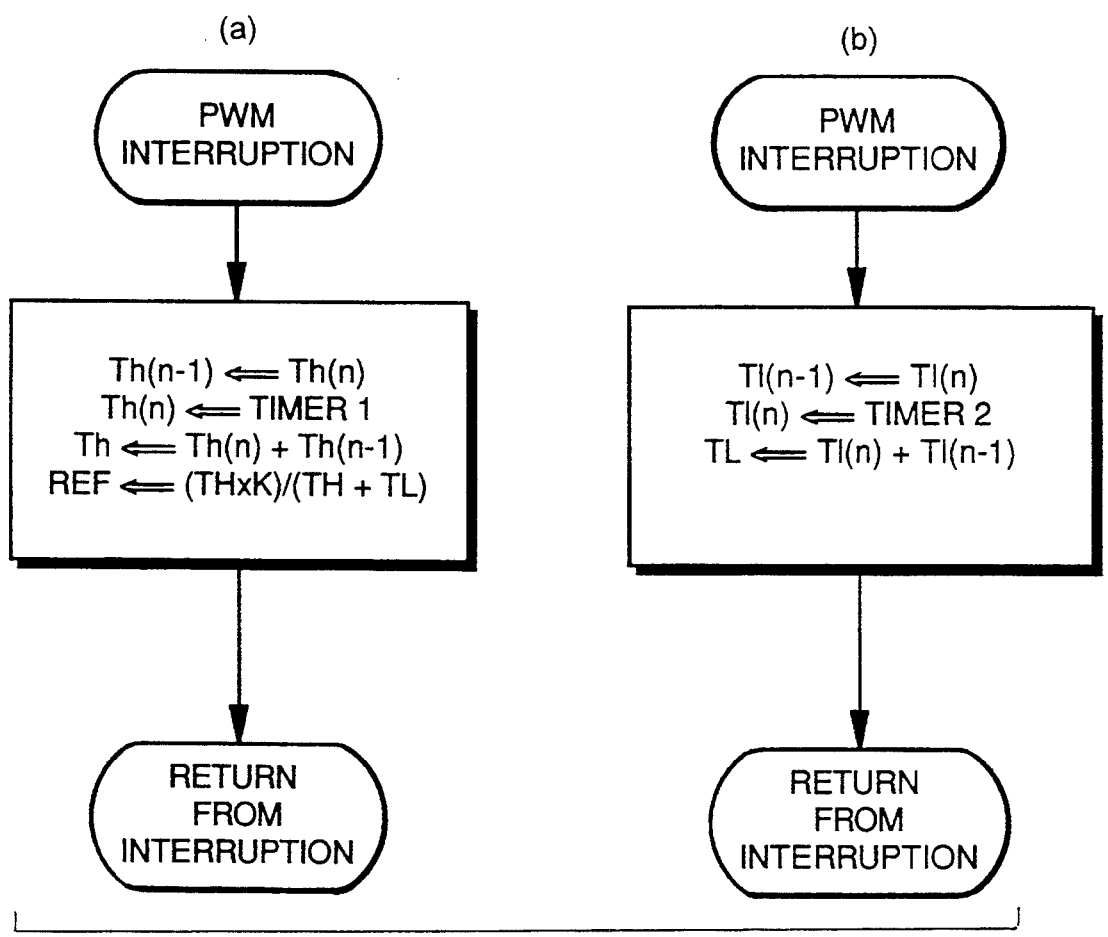
FIGS. 30a and 30b are flow charts illustrating an interrupt operation of the example of FIG. 28(a)

The interrupt processing performed by the second timer on every leading edge of the pulse width-modulated signal is next described by referring to FIG. 30(b). First, RAM data designated Tl(n) is copied into a RAM designated Tl(n−1). Then, the value of the buffer TIMER2 is copied into Tl(n). The sum of Tl(n) and Tl(n−1) is loaded into a Ram designated TL. Therefore, the value stored in the RAM designated TL is the sum of the present count value Tl(n) counted during the period of the low level of the pulse width-modulated signal and the previous count value Th(n−1). The value in the RAM designated TL is updated on every leading edge. FIG. 29(g) illustrates this processing.

The first timer interruption on every trailing edge of the pulse width-modulated signal is next described. The processing from the top row to the third row of FIG. 30(a) is equivalent to the processing of FIG. 30(b). The same processing is performed for the period of the high level of the pulse width-modulated signal. In the fourth column of FIG. 30(a), the presently found value TH, i.e., the sum of the present count value Th(n) about the period of the high level and the previous count value Th(n−1), and TL obtained by the second timer interruption are used, and [(period of the high level)×(constant K)/(total period)] is calculated. The calculated value is loaded into the RAM designated REF. Practical examples of the constant K are 256 (=$2^8$) and 65536 (=$2^{16}$), because these values make the processing of the microprocessor easy. In this example, sum values derived from the period of the high level and from the total period are used. Noise reduction can be accomplished for the total period, as well as for the period of the high level. The rows for finding TH, TL, and REF may be executed in a separate routine as illustrated in FIG. 25, instead of the first timer interruption and the second timer interruption.

With respect to the total period, it is not always necessary to use the values obtained by summing two successively derived values. The sum values are used only for the period of the high level. This also improves the resolution and reduces noise. Specifically, where REF is found in FIG. 30(a), the processing $$REF \leftarrow (TH \times K)/[\{TH(n)+Tl(n)\} \times 2]$$

is performed. Since the denominator contains neither Th(n−1) nor Tl(n−1), each item of the data about the total period consists of a single value.

Figure 31:
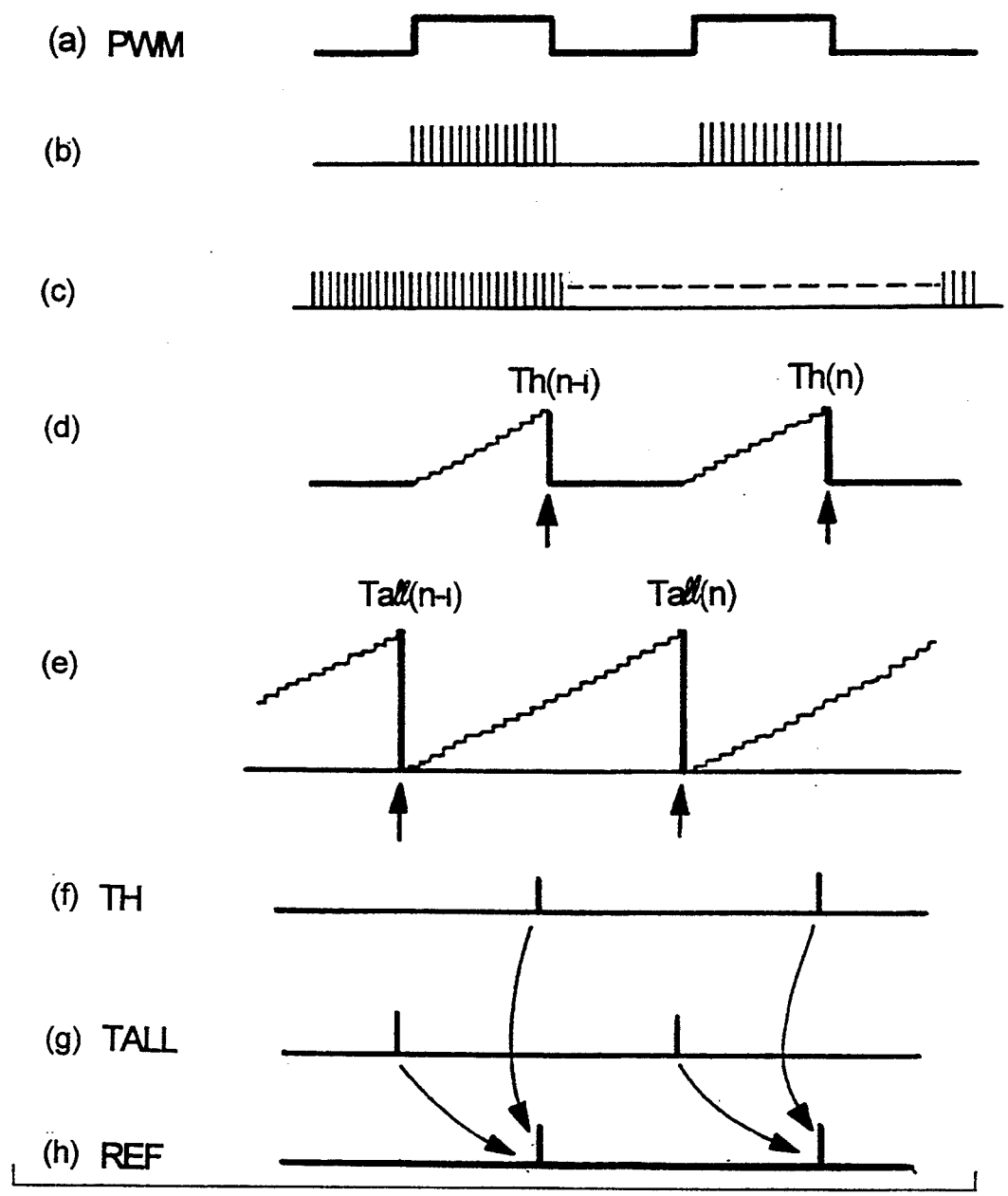
FIG. 31 is a timing chart illustrating the operation of the example of FIG. 28(b)
Figure 32:
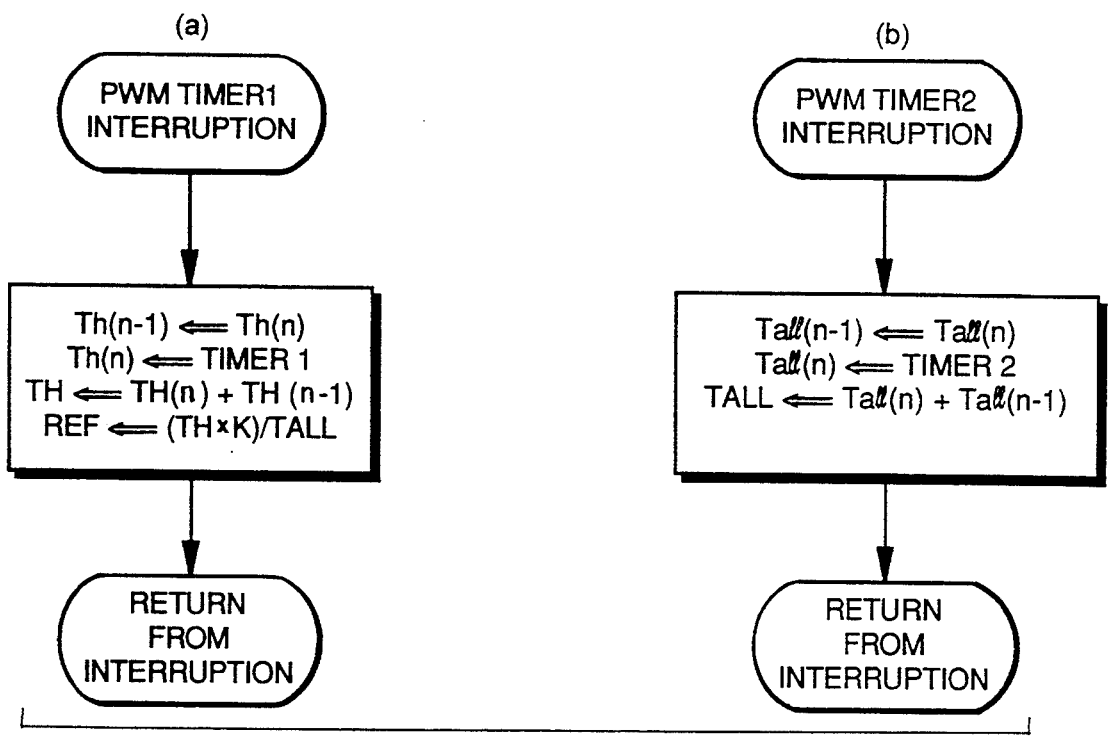
FIGS. 32a and 32b are flow charts illustrating an interrupt operation of the example of FIG. 28(b)

The Example of FIG. 28(b) is next described by referring also to FIGS. 31 and 32. The first timer measures the period of the high level of the pulse width-modulated signal. The second timer measures the total period of the pulse width-modulated signal. Therefore, the counter 1 of the first timer is so initialized that it performs the operation illustrated in FIG. 31(d). The counter 2 of the second timer is initialized in such a way that it carries out the operation illustrated in FIG. 31(e). In FIG. 31(e), the measurement of the total period is completed on every leading edge of the pulse width-modulated signal. The measurement may also be completed on every trailing edge. The first timer loads the total count obtained during the period of the high level into a buffer designated Timer on every trailing edge of the pulse width-modulated signal. The second timer loads the total count obtained during the total period into a buffer designated TIMER2 on every leaving edge of the pulse width-modulated signal.

FIG. 32(b) illustrates the interruption processing by the second timer. The request for an interruption illustrated in FIG. 2(b) is made on every leading edge of the pulse width-modulated signal. The value of Tall(n) is copied into Tall(n−1). The value of the buffer TIMER2 is copied into Tall(n). Let TALL be the sum of the values of Tall(n) and Tall(n−1). The sum of the present total count and the previous total count of the clock pulses appearing during the total period is stored in the TALL.

FIG. 32(a) illustrates the interruption processing by the first timer. The request for an interruption of FIG. 32(a) is made on every trailing edge of the pulse width-modulated signal. The value of Th(n) is copied into Th(n−1). The value of the buffer Timer is copied into Th(n). Let TH be the sum of the values of Th(n) and Th(n−1). By this processing, the sum of the present total count and the previous total count of the clock pulses appearing during the period of the high level is loaded into TH. In the fourth column of FIG. 32(a), the value of TH is multiplied by a constant K. Generally, this constant K is set to 256 or 65536 in the same way as in the case of FIG. 28(a). The product is divided by the value of TALL. The quotient is substituted into REF, to produce the analog-to-digital converter circuit output. The rows of FIG. 32 for finding TH, TALL, and REF may be executed by a separate processing routine as illustrated in FIG. 25 instead of the interruption processing of the first and second timers.

In the examples of FIGS. 28(b), 30–32 described thus far, the present total count and the previous total count are summed up for the period of the high level and for the total period of the pulse width-modulated signal. Hence, the resolution is improved, and noise is reduced.

Figure 34:
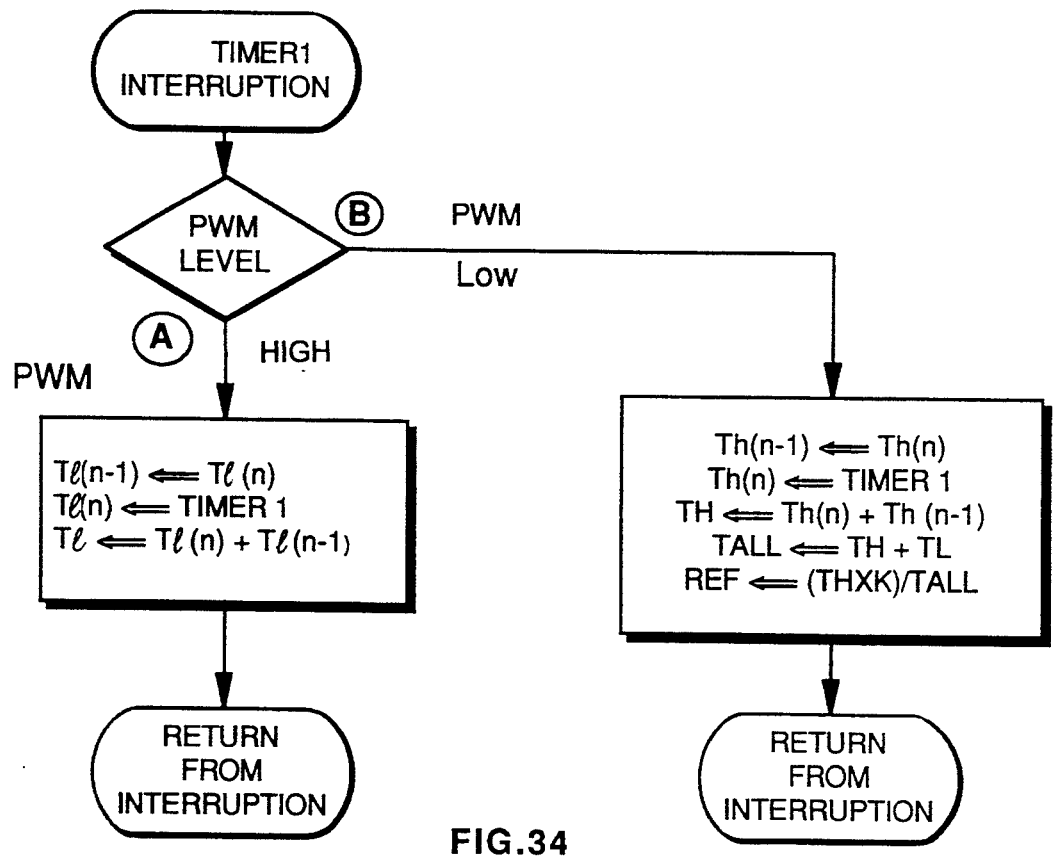
FIG. 34 is a flow chart illustrating an interrupt operation of the example of FIG. 28(c)
Figure 33:
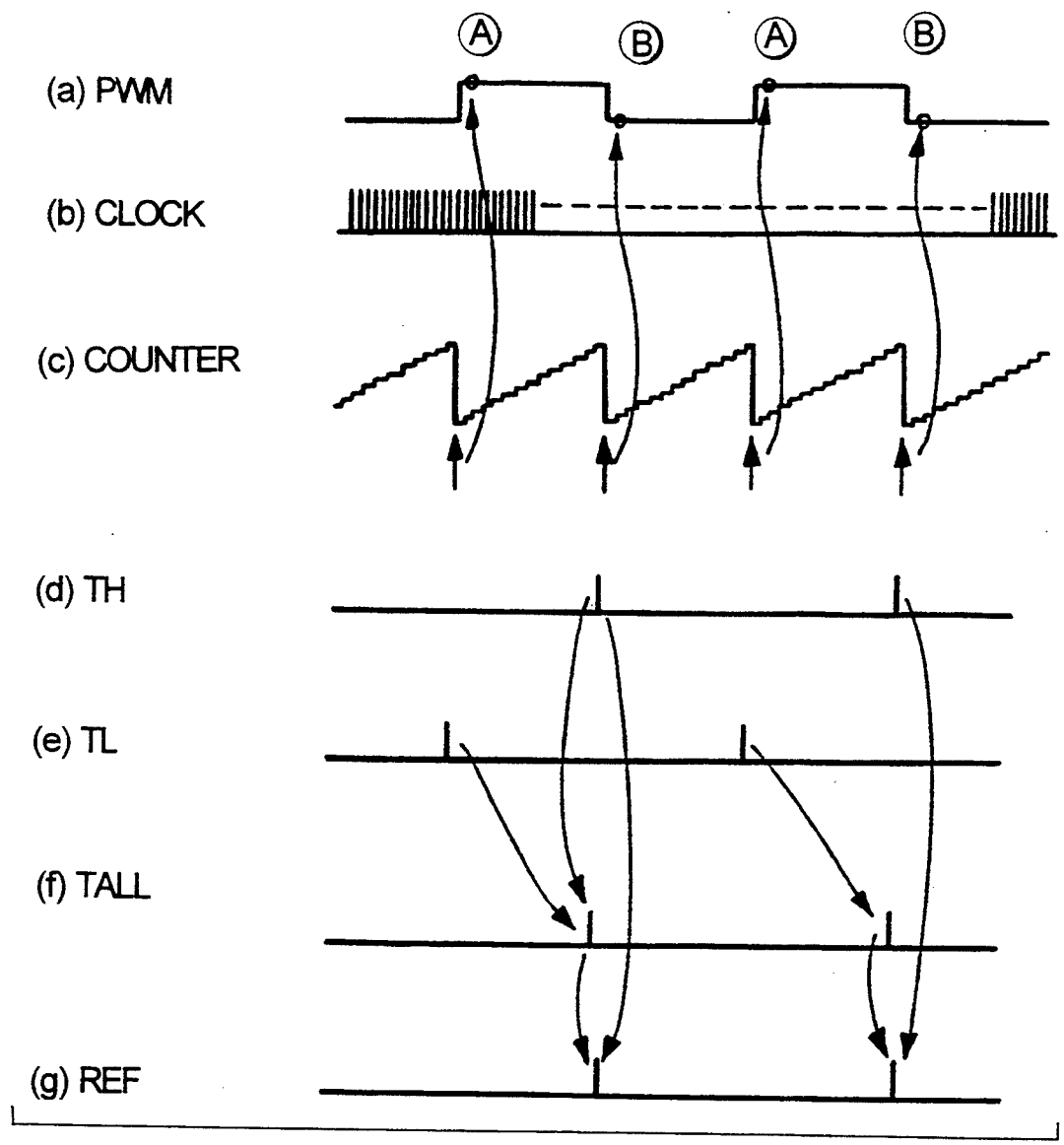
FIG. 33 is a timing chart illustrating the operation of the example of FIG. 28(c)

The example illustrated in FIG. 28(c) is next described by referring also to FIGS. 33 and 34. In this example, a microprocessor 3 incorporates only one first timer 31. This first timer measures the period of the high level and the period of the low level of the pulse width-modulated signal. The first timer is so initialized that it loads the total count into the buffer designated TIMER1 on the leading and trailing edges of the pulse width-modulated signal, permits the first timer to make a request for an interruption, and clears the total count. FIGS. 33 and 34 illustrate the interruption of the first timer. As illustrated in these figures, the level of the pulse width modulated signal is judged immediately after entering the interruption processing. If the level is high, the condition corresponds to A of FIG. 33(a). It can be seen that the interruption processing is now initialized in response to the leading edge of the pulse width-modulated signal. The measured value of the period of the low level is stored in the buffer designated Timer1. At this time, the value of Tl(n) is copied into Tl(n−1). The value of the buffer Timer1 is copied into Tl(n). The value of Tl(n) and the value of in Tl(n−1) are summed up and loaned into TL. The sum of the previous data about the period of the low level and the present data about the period of the low level is stored in TL. This value of TL is constantly updated.

If the level of the pulse width-modulated signal is low, the condition corresponds to B of FIG. 33(a). It can be seen that the interruption processing is presently started on the trailing edge of the pulse width-modulated signal. The measured value about the period of the high level is stored in the buffer Timer1. At this time, the value of Th(n−1) is copied into Th(n). The value of the buffer TIMER1 is copied into Th(n). The sum of the previous data and the present data about the period of the high level is stored in TH. The value of TH is constantly updated. The value of TH and the value of TL are summed up and loaded into TALL. That is, the value of TALL is the sum of two values for all the period. Then, the calculation [(TH×K)/TALL] is executed. REF is produced as the output from the A/D converter circuit. As described previously, K is set to 256 or 65536. The operations for finding TH, TL, TALL, and REF may be carried out in a separate routine as illustrated in FIG. 25.

Also in this example, the sum of the previous data and the present data is used for the period of the high level and for the total period of the pulse width-modulated signal. In consequence, the resolution is improved, and noise is reduced.

An invention associated with the above-described Example 5 is next described. In particular, if the DC component of the triangular wave varies with temperature, or if the offset voltages of the comparators vary with temperature, data about the duty cycle of the rectangular wave obtained by comparing the triangular wave and a constant voltage is subtracted from data about the duty cycle of the pulse width-modulated signal, to prevent the digital output data from changing. Also in this case, there exist the following options, corresponding to the various modifications described thus far.

i) Whether data about the total period is obtained from the first timer or from the second timer.

ii) What processing routine is used to find TH, TL, TALL, and REX.

iii) Whether the measured value of the period of the high level or the measured value of the low level is used as digital signal.

iv) Whether each item of the data about thy total period consists of a single value or of the sum of two values.

v) The duty cycle of the rectangular wave is used as a reference. Whether the duty cycle of the period of the high level or the duty cycle of the period of the low level is used as the reference.

An example having the following conditions is next described.

a) The total period is obtained from the second timer. Further, each item of data is obtained by summing up two values.

b) $TH_1$, $TH_2$, $TL_2$, TALL, and REF are calculated in routines other than the first timer interruption and the second timer interruption.

c) The period of the high level of the pulse width-modulated signal is measured as a digital signal.

d) Each item of data about the total period is obtained by summing up two values.

e) The duty cycle of the period of the high level of the rectangular wave is used as a reference.

The subscript i of $Th_i$ and $TL_i$ indicates whether the data is obtained from the first comparator or from the second comparator. The subscript i included in $Th_i( )$ and $Tl_i( )$ has the same meaning.

Figure 35:
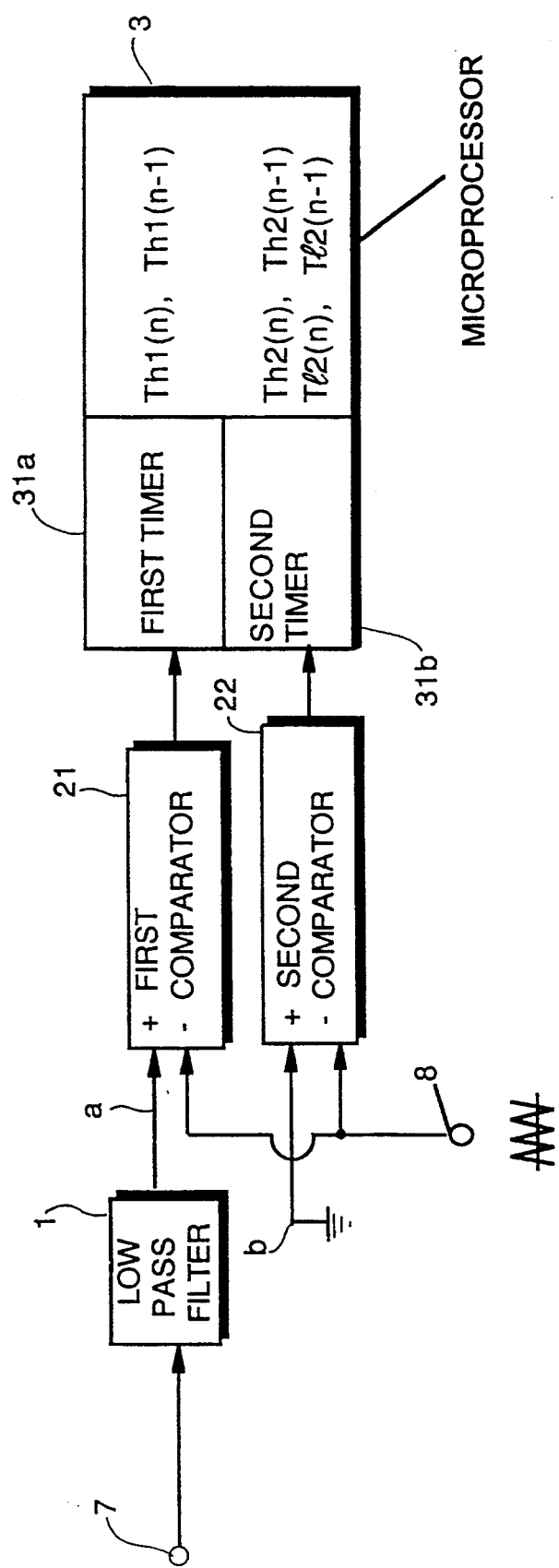
FIG. 35 shows a block diagram of still another modification of Example 6 of an analog-to-digital converter circuit according to the invention.
Figure 36:
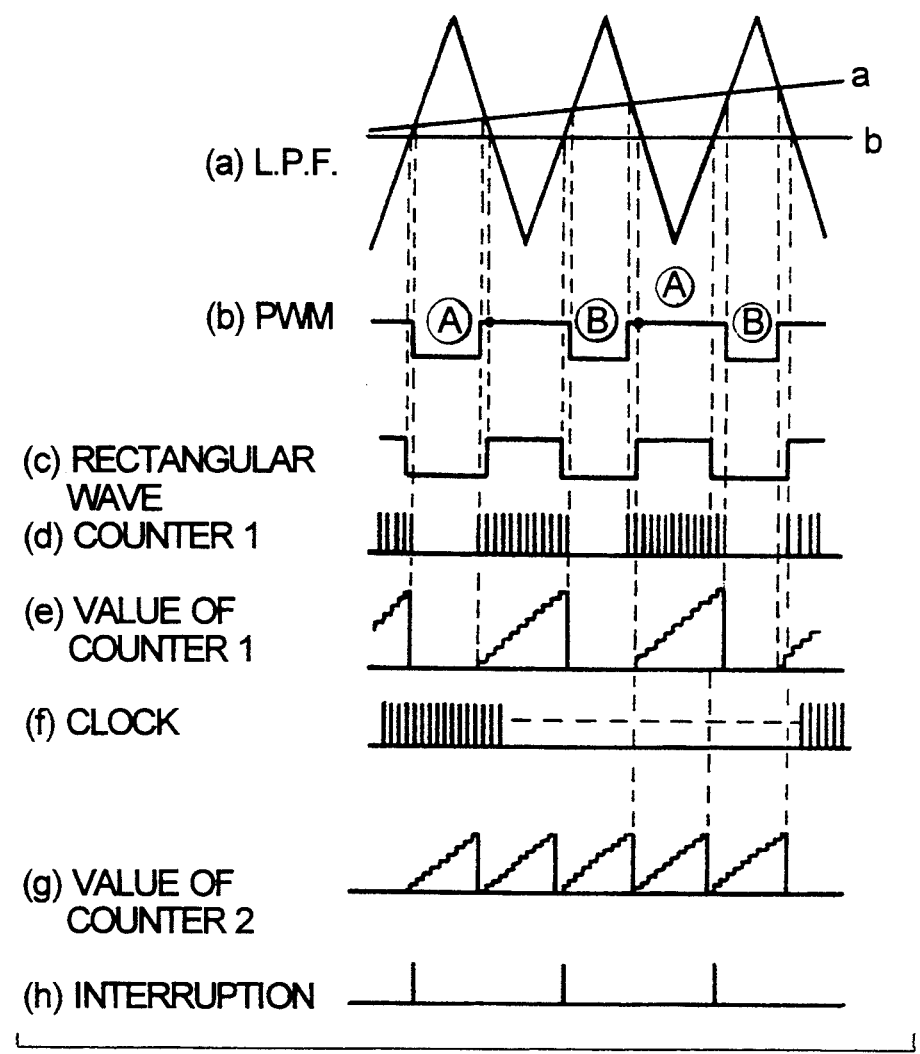
FIG. 36 is a timing chart illustrating the operation of the example of FIG. 35.

Specific examples having the above-described conditions are described by referring to FIGS. 35–39. Referring to FIG. 35, a first comparator 21 and a second comparator 22 are provided. The first comparator compares a speed instruction signal 7 passed through a low-pass filter 1 with a triangular wave 8 to produce a pulse width-modulated signal. The positive terminal of the other second comparator is grounded. The triangular wave 8 is applied to the negative terminal of the second comparator. Thus, the second comparator compares the triangular wave 8 with 0 V that is ground potential, thus producing a rectangular wave having a duty cycle of 50%. A microprocessor 3 incorporates a first timer 31a and a second timer 31b. The first timer measures the period of the high level of the first comparator. The second timer measures the periods of the high and low levels of the second comparator. The first timer is so set up that it loads the total count into a buffer designated TIMER1 on ever trailing edge of the pulse width modulated-signal, makes a request for an interruption, and clears the counter 1 of the first timer. The second timer is so set up that it loads the total count into a buffer designated TIMER2 on every leading edge and every trailing edge of the rectangular wave, makes a request for an interruption, and clears the timer 2 of the second timer.

Figure 37:
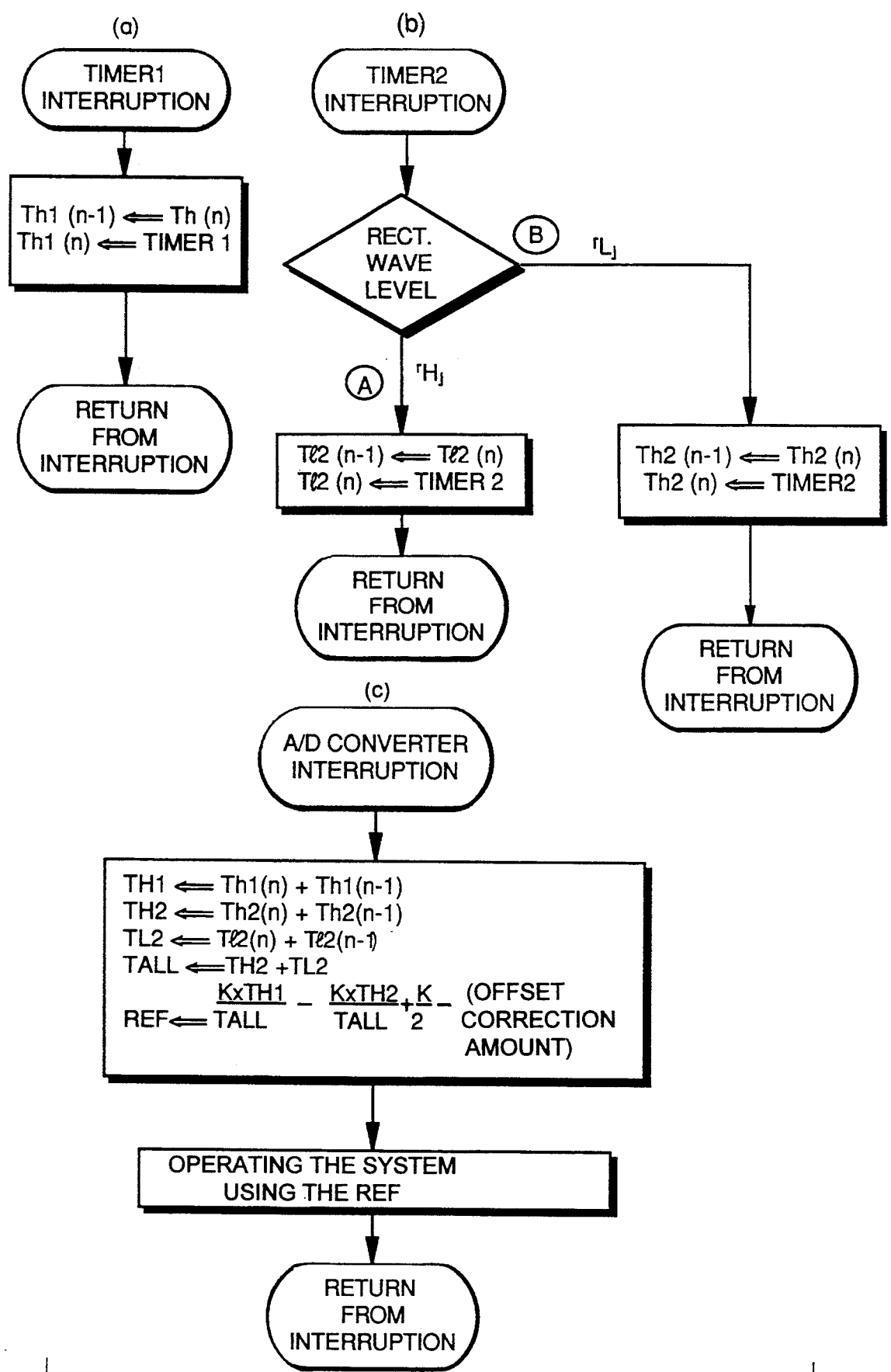
FIGS. 37a, 37b, and 37c are flow charts illustrating interrupt operations of the various modifications of FIG. 35.

The above-described interruption processing is next described by referring to FIG. 37. In the interruption processing of the first timer, as shown in FIG. 37(a), the value of $Th_1$, (n) is copied into $Th_1(n-1)$. The value of TIMER1 is copied into $Th_1(n)$. Thus, the processing is ended. The present data about the period of the high level of the pulse width-modulated signal is stored in $Th_1(n)$. The previous data about the period of the high level of the pulse width-modulated signal is stored in $Th_1(n-1)$. The interruption of the second timer is initiated by a decision made to judge the level of the rectangular wave, as illustrated in FIG. 37(b). Then, control path branches into two. If the level of the rectangular wave is high, it follows that an interruption occurred on the leading edge of the rectangular wave as indicated by A of FIG. 36(b). Accordingly, the count value obtained from the period of the low level of the rectangular wave is stored in the TIMER2. Thus, the value of $Tl_2(n)$ is copied into $Tl_2(n-1)$. The value of the TIMER2 is copied into $Tl_2(n)$. The present data and the previous data about the period of the low level of the rectangular wave are stored in $Tl_2(n)$ and $Tl_2(n-1)$. The same principle applies where the level of the rectangular wave is high. The present data and the previous data about the period of the high level of the rectangular wave are stored in $Tl_2(n)$ and $Tl_2(n-1)$.

FIG. 37(c) illustrates the interruption processing for operating the system, utilizing the output from the A/D converter circuit. In this interruption processing, the value $TH_1$ obtained by summing up two values about the period of the high level of the pulse width-modulated signal, the value $TH_2$ obtained by summing up two values about the period of the high level of the rectangular wave, the value $TL_2$ obtained by summing up two values about the period of the low level of the pulse width-modulated signal, and the value TALL obtained by summing up two periods of the rectangular wave are found. The digital output REF, i.e., $[(K \times TH_1)/(TALL) - (K \times TH_2)/(TALL)K/2 - (\text{offset correction amount})]$, is calculated from the above values. This formula corresponds to Equation (10) used in the description of the Example 5.

In this way, in the present example, every item of data is obtained by summing up two values measured successively for all of the period of the high level, the period of the high level of the rectangular wave, and the period of the low level of the rectangular wave. Consequently, the resolution is enhanced, and noise is reduced. The digital output is prevented from varying if the DC component of the triangular wave and the offset voltages of the comparators vary with temperature, by subtracting sum values for the periods of the high and low levels of the rectangular wave corresponding to the duty cycle of the rectangular wave from sum values obtained by summing up two successively measured values corresponding to the dusty cycle of the pulse width-modulated signal, each of the former sum values being obtained by summing up two successive values.

Figure 38:
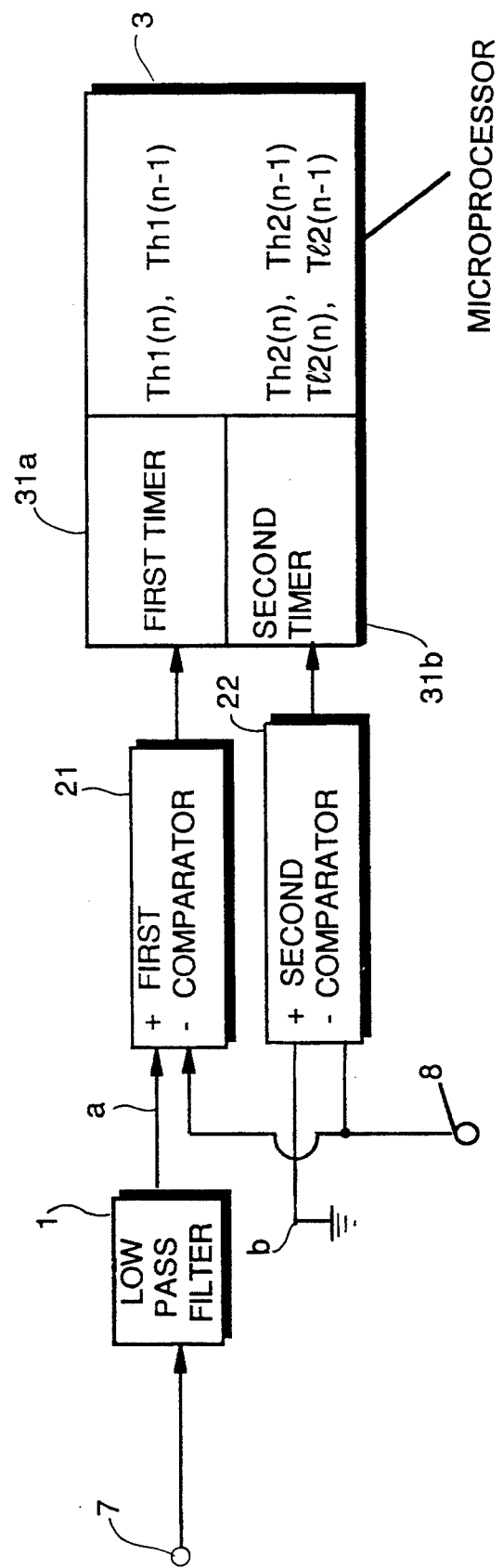
FIG. 38 is a block diagram of yet another modification of Example 6 of an analog-to-digital converter circuit according to the invention.
Figure 39:
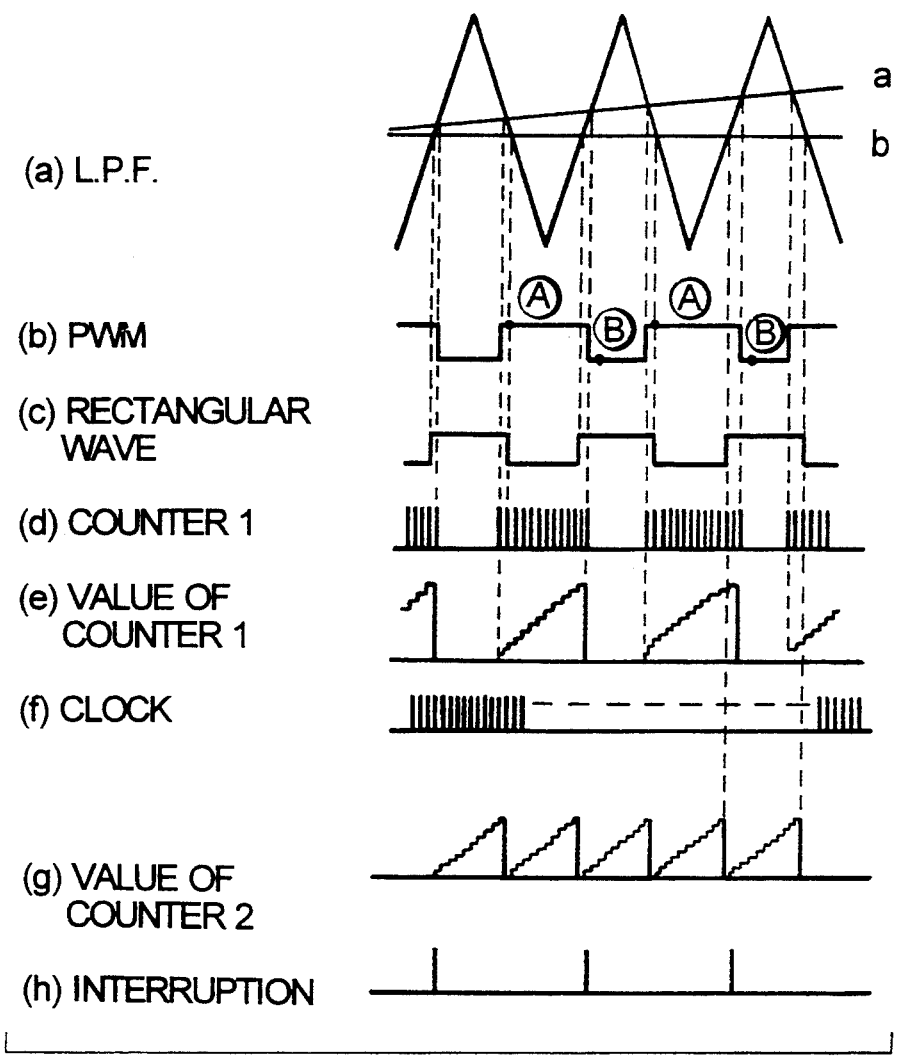
FIG. 39 is a timing chart illustrating the operation of the example of FIG. 38.

As shown in FIG. 38, the input signals to the two input terminals of the second comparator can have an opposite relation to the example of FIG. 35. In particular, the triangular wave 8 is applied to the positive input terminal of the second comparator. Ground potential, or 0 V, is applied to the negative terminal. The operation of this example is illustrated in FIG. 39. This example is similar to the example of FIG. 35 except that the polarity of the rectangular wave is reversed. In this example, two successive values obtained during the period of the high level of the pulse width-modulated signal are summed up to produce a value $TH_1$. Two successive values obtained during the period of the high level of the rectangular wave are summed up to produce a value $Th_2$. Two successive values obtained during the period of the low level of the pulse width-modulated signal are summed up to produce a value $TL_2$. Two successive periods of the rectangular wave are summed up to produce a value TALL. The digital output REF, i.e., $[(K \times TH_1)/(TALL) - (K \times TL_2)/(TALL) + K/2 - (\text{offset correction amount})]$, is calculated from the above values. In this way, this example differs from the example of FIG. 35 in that the duty cycle of the rectangular wave is calculated from the sum values $TL_2$ about the period of the low level of the pulse width-modulated signal, and that the calculated duty cycle is subtracted from the duty cycle of the pulse width-modulated signal.

EXAMPLE 7

The motor control apparatus using the above-described analog-to-digital converter circuit dispenses with an analog-to-digital converter IC and is economical. Furthermore, the input/output ports of a microprocessor can be effectively utilized.

Figure 45:
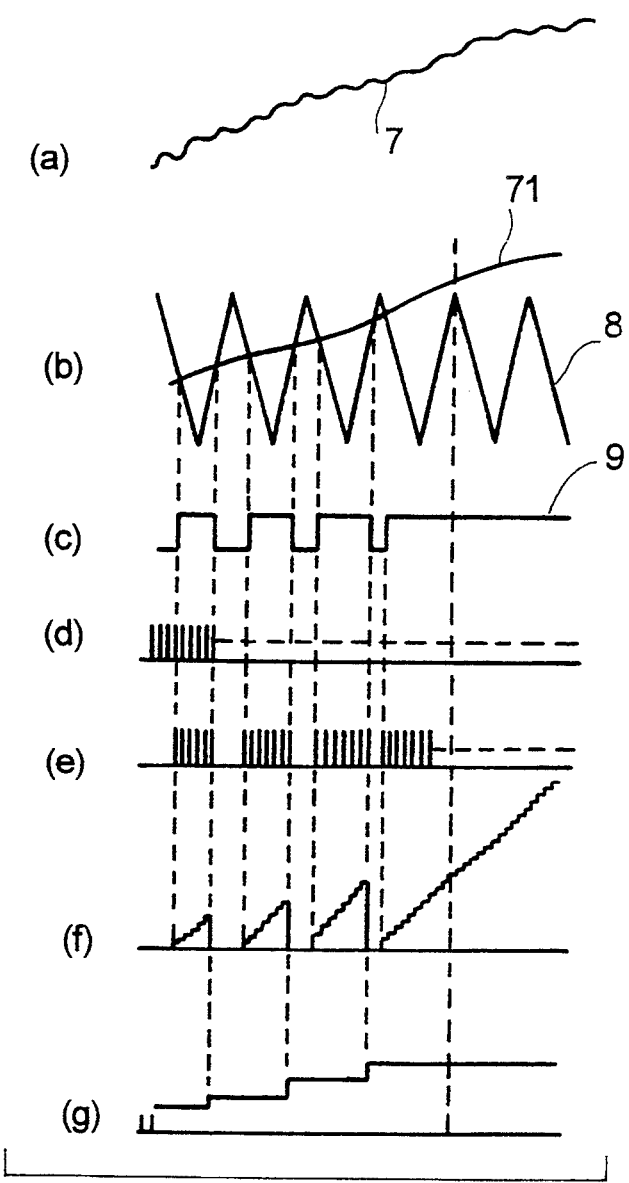
FIG. 45 is a timing chart illustrating the operation of the motor control apparatus shown in FIG. 44.

However, the aforementioned motor control apparatus actually using the A/D converter circuit has room for improvement. The reason is now described by referring to FIGS. 44 and 45. As described already, a speed instruction voltage that is an analog signal is compared with a triangular wave to produce a pulse width modulated signal. The clock pulses appearing during the period of the high level of this signal are counted to convert the analog signal into digital form. This desired operation is permitted only when the level of the speed instruction voltage is less than the amplitude of the triangular wave. If the speed instruction voltage level is in excess of the amplitude of the triangular wave, the pulse width-modulated signal is locked to the high level or to the low level, depending on the level of the speed instruction voltage, as indicated to the right of FIG. 45(b). The counter of the timer will continue to count the clock pulses endlessly. The result is that the digital signal assumes an abnormal value. Since the microprocessor 3 controls the motor 5 via the inverted 4 according to the digital signal, if the digital signal takes an abnormal value, the microprocessor 3 is unable to correctly control the motor 5; the motor 5 may operate uncontrollably.

Accordingly, an improvement over the above-described motor speed control apparatus is offered. In particular, when the level of the speed instruction voltage exceeds the amplitude of the triangular wave and the pulse width-modulated signal is locked to the high or low level, the motor is stopped to prevent uncontrollable operation and other abnormal operations of the motor.

This improvement is next described as Example 7 by referring to FIGS. 40–43. This Example is a motor control apparatus using an analog-to-digital converter circuit. The illustrated Example 7 has numerous components in common with the above-described examples. Like components are indicated by like reference numerals in these various figures.

Figure 40:
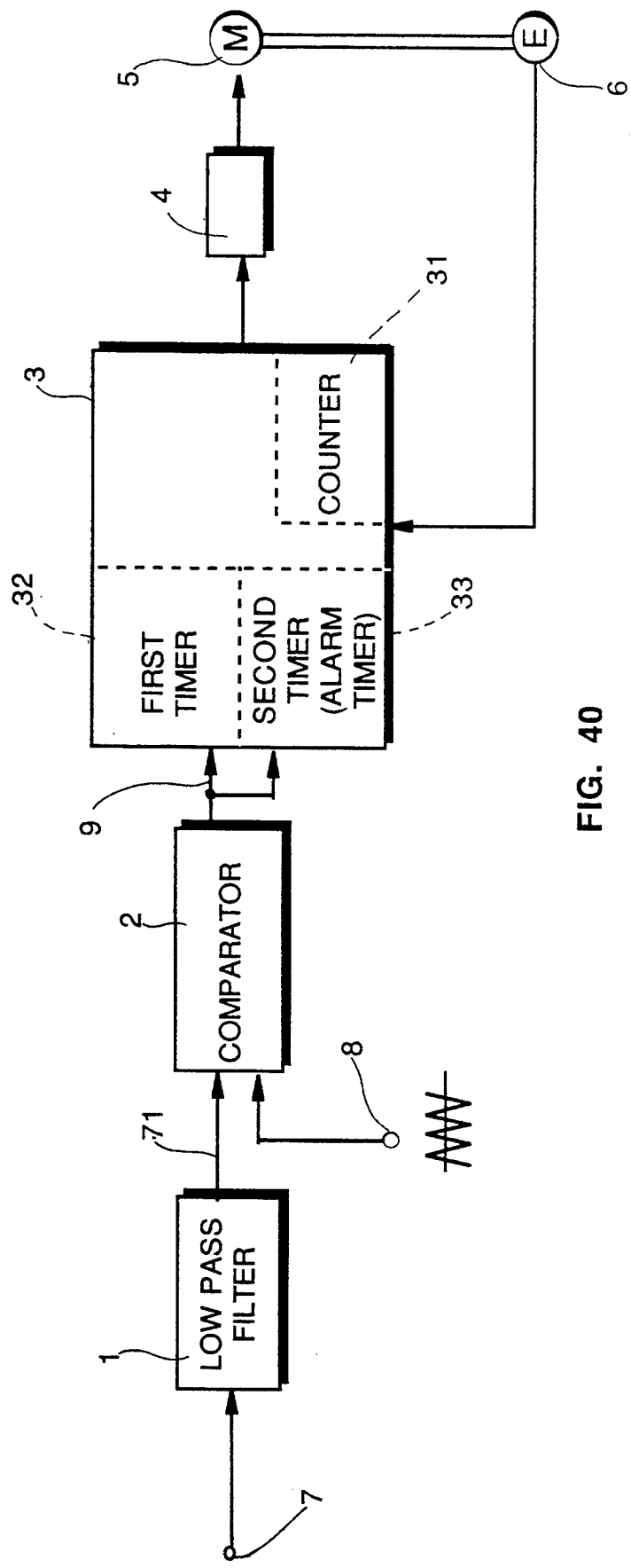
FIG. 40 is a block diagram of Example 7 of motor control apparatus using an analog-to-digital converter circuit according to the invention.

Referring to FIG. 40, a speed instruction voltage 7 that is an analog signal is applied to a low-pass filter 1. The output from the filter 1 and a triangular wave 8 are applied to a comparator 2. The comparator 2 compares the speed instruction voltage 7 with the triangular wave 8 to produce a pulse width-modulated signal 9, as mentioned above. The output from the comparator 2 is applied to a first timer 32 incorporated in a microprocessor 3. The first timer 32 causes a counter 31 included in the microprocessor 3 to count clock pulses appearing during the period of the high or low level of the pulse width-modulated signal 9. Thus, the analog signal is converted into digital form. The microprocessor 3 forms a control circuit providing control of the speed of an electric motor 5. The microprocessor receives the digital signal obtained by the first timer 32 and the signal from an encoder 6 which indicates the rotational speed of the motor 5. The microprocessor 3 controls an inverted 4 in such a way that the difference between the digital signal corresponding to the speed instruction voltage 7 and the signal indicating the rotational speed is reduced down to zero.

Example 7 illustrated in FIG. 40 differs from Example 1 of FIG. 1 in that a second timer 33 acting as an alarm timer is provided. The timer 33 senses that the speed instruction voltage 7 has exceeded the amplitude of the triangular wave 8. The alarm timer 33 can make use of a timer incorporated in the microprocessor 3. The timer 33 is preset on every leading or trailing edge of the pulse width-modulated signal 9 and counts clock pulses backward. Theoretically, this preset value is set to a value which is approximately equal to the amplitude of the triangular wave 8. In practice, the preset value is 0.9 to 1.5 times as large as the amplitude of the triangular wave 8. In the illustrated Example 7, the preset value for the alarm timer 33 is set equal to the amplitude of the triangular wave 8. After the timer 33 is preset, it produces an output signal indicating detection when the total count reaches a given value (O in this Example 7). The output signal is applied to the microprocessor 3.

Figure 41:
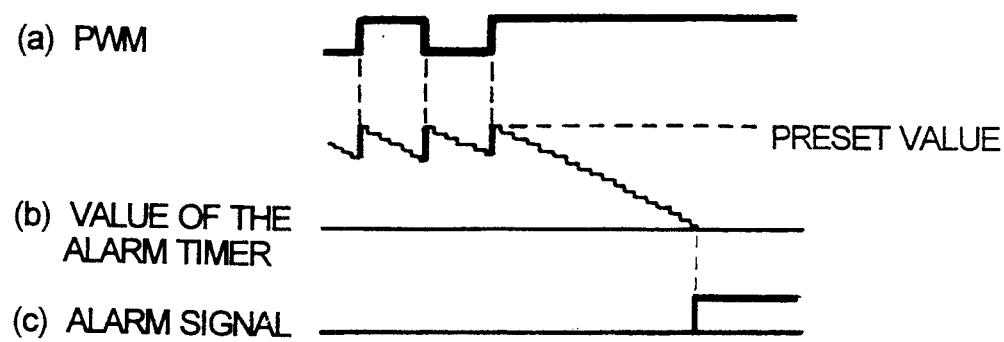
FIG. 41 is a timing chart illustrating one example of operation of Example 7.
Figure 42:
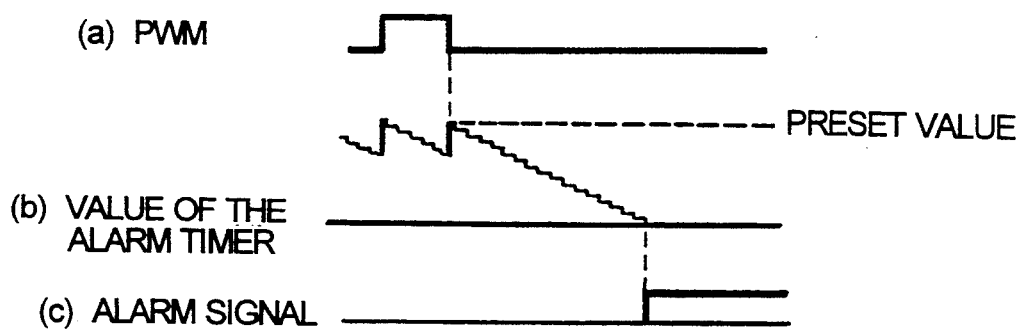
FIG. 42 is a timing chart illustrating another example of operation of Example 7.
Figure 43:
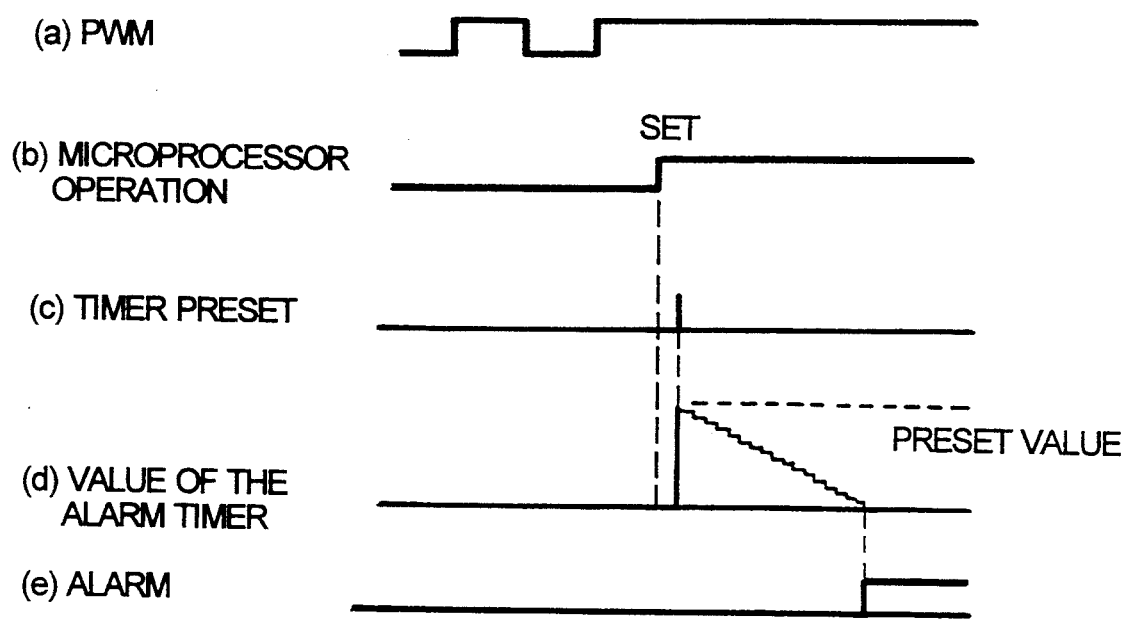
FIG. 43 is a timing chart illustrating the operation of the functions added to Example 7.

The operation of Example 7 is next described in detail by referring to FIGS. 41–43. FIG. 41 illustrates the operation when the level of the pulse width-modulated signal 9 is high, the instruction signal exceeds the amplitude of the triangular wave, and the pulse width-modulated signal 9 is locked to the high level. Whenever the level of the pulse width-modulated signal changes to high or low level, the alarm timer 33 is preset and counts clock pulses backward as indicated to the left of FIG. 41(b). Therefore, while the pulse width-modulated signal 9 is being switched between the high level and the low level, the timer 33 is preset when the total count reaches a value corresponding to the duty cycle of the pulse width-modulated signal 9. However, when the level of the pulse width-modulated signal 9 is high, if the speed instruction signal 7 exceeds the amplitude of the triangular wave 8 and the pulse width-modulated signal 9 is locked to the high level, then the alarm timer 33 continues to count clock pulses backward, as indicated to the right of FIG. 41(b). Finally, the total count reaches 0, whereupon an alarm signal shown in FIG. 41(c) and indicating detection is produced. In response to this signal, the microprocessor 3 stops the motor 5.

FIG. 42 illustrates the operation when the pulse width modulated signal 9 is at a low level, the speed instruction signal 7 exceeds the amplitude of the triangular wave 8, and the pulse width-modulated signal 9 is locked to the low level. When the signal 9 is locked to the low level, the alarm timer 33 keeps counting clock pulses backward, as illustrated to the right of FIG. 42(b). Finally, the total count reaches 0. At this time, the alarm signal shown in FIG. 42(c) and indicating detection is produced. In response to this signal, the microprocessor 3 brings the motor 5 to a stop.

In this way, in the above Example 7, the alarm timer 33 produces an output signal indicating detection when the pulse width-modulated signal 9 is locked to the high or low level. Therefore, the microprocessor 3 can use the digitized value while crediting it unless the timer 33 produces its output signal. The microprocessor can control the motor 5 via the inverter 4 according to the digital signal. On the other hand, if the timer 33 produces its output signal, the microprocessor immediately stops the operation of the inverted 4 and deenergizes the motor 5, applies a regenerative brake to the motor 5, or otherwise stops it. In the motor control circuit using the A/D converter circuit described in Examples 1–6, when the pulse width-modulated signal 9 is at a low level, the speed instruction signal exceeds the amplitude of the triangular wave, so that the digital value assumes an abnormal value. In this case, this abnormal value is used as it is. This permits the motor 5 to operate uncontrollably. In Example 7, if the digital value becomes abnormal, the timer 33 detects this abnormality and produces its output signal. This output signal causes the motor 5 to stop. Hence, erroneous operation of the motor control circuit can be prevented.

The alarm timer 33 acting as a detection means may also be preset when the A/D converter circuit is set into operation. When the operation of the system is started, the speed instruction signal 7 may have already exceeded the amplitude of the triangular wave 8. In this case, if the system is started, it might operate incorrectly and uncontrollably. For this reason, the timer 34 is preset prior to the operation of the whole system. FIG. 43 illustrates an example. When the operation of the system is started, e.g., when the power supply is turned on or the reset button is depressed, if the speed instruction signal 7 has already exceeded the amplitude of the triangular wave 8, either a leading edge or a trailing edge of the pulse width-modulated signal does not appear. Therefore, it is impossible that the alarm timer 33 is preset in response to the leading or trailing edge. Accordingly, when the microprocessor 3 is set into operation, the alarm timer 33 is once preset irrespective of the leaving edge or the trailing edge of the pulse width-modulated signal as illustrated in FIG. 43, (b), (c), (d).

Thus, if the pulse width-modulated signal 9 has been already locked to the high or low level when the A/D converter circuit is set into operation, then the alarm timer 33 can produce its output signal when the total count reaches a given value after a lapse of a given period since the timer 33 has been preset. In response to the output signal from the timer 33, the microprocessor 3 inhibits operation of the motor 5. Thus, it is unlikely that the motor 5 operates incorrectly and uncontrollably.

In the illustrated Example 7, a microprocessor is used as a control circuit. The first timer and the alarm timer, or the second timer, are incorporated in the microprocessor. A device other than a microprocessor can be used as a control circuit. Independent timers not incorporated in the microprocessor may also be used as the first timer and as the alarm timer, respectively. In the above example, a microprocessor is employed as a control means. Timers acting as an A/D conversion timer and as detection means, respectively, are incorporated in the microprocessor. Each circuit portion may be a combination of various circuits. That is, each circuit portion can take the form of hardware. The same function may be performed by processing in terms of software.

The advantages of the present invention are described below.

(1) In accordance with the present invention, an analog-to-digital converter circuit can be fabricated only from a comparator and its peripheral components without using an analog-to-digital converter IC. Consequently, an analog-to-digital converter circuit can be economically offered.

(2) In accordance with the present invention, an analog-to-digital converter circuit is composed of a comparator and a counter. The comparator compares an instruction signal that is an analog signal with a triangular wave having a given frequency and a given amplitude to convert the analog signal into a pulse width-modulated signal. The counter measures the period of the high level of the pulse width-modulated signal to convert it into a digital signal. Hence, the analog-to-digital converter circuit can be built from only the comparator and its peripheral components without using an analog-to-digital converter IC. In this way, the analog-to-digital converter circuit can be manufactured at low cost.

Furthermore, digital data is found from the [(period of the high level of the pulse width-modulated signal)/(total period)] or from a multiple of this value. Therefore, the converted digital output data does not depend on the frequency of the triangular wave used to obtain the pulse width-modulated signal. Thus, stable and accurate conversion into digital form is enabled.

(3) In accordance with the present invention, an analog-to-digital converter circuit comprises a comparator and a counter. The comparator compares an analog signal with a triangular wave to convert the analog signal into a pulse width-modulated signal. The counter measures the period of the high or low level of the pulse width-modulated signal to convert it into a digital signal. Data about the duty cycles of a rectangular wave is subtracted from data about the duty cycle of the pulse width-modulated signal, the rectangular wave being produced by comparing the triangular wave with a given voltage. In this manner, the analog signal is converted into digital form. Therefore, if the DC component of the triangular wave varies with temperature, or if the offset voltage of the comparator varies with temperature, thus changing the duty cycle of the pulse width-modulated signal and the duty cycle of the rectangular wave, the variation in the data about the duty cycle of the pulse width-modulated signal caused by the variation in the DC component of the triangular wave due to temperature variations and the variation in the data caused by the variation in the offset voltage of the comparator due to temperature variations are cancelled out. Consequently, an accurate analog-to-digital converter circuit which is not affected by temperature variations can be obtained.

(4) In accordance with the present invention, an analog-to-digital converter circuit comprises: an analog-to-digital conversion means for comparing an analog, speed instruction signal with a triangular wave having a given frequency and a given amplitude and for converting the analog signal into a digital signal; a detection means which senses that the speed instruction signal lies within the amplitude of the triangular wave; a control means receiving the output from the analog-to-digital conversion means, the output from the detection means, and the output from an encoder detecting the rotational speed of an electric motor; an inverter controlled by the control means in such a way that the difference between the speed indicated by the speed instruction signal and the actual speed of the motor controlled by the inverter decreases to zero. When the detection means senses that the speed instruction signal goes outside of the amplitude of the triangular wave, the control means stops the motor. Therefore, if the speed instruction signal goes outside of the amplitude of the triangular wave and the analog-to-digital conversion means operates incorrectly, uncontrollable operation of the motor can be prevented.

(5) In accordance with the present invention, an analog-to-digital converter circuit which dispenses with an analog-to-digital converter IC comprises: a comparator which compares an analog signal with a triangular wave having a given frequency and a given amplitude to convert the analog signal into a pulse width modulated signal; and a counter which measures the period of the high or low level of the pulse width-modulated signal to convert it into a digital signal. The present total count obtained bye the counter from the pulse width-modulated signal and the previously obtained total count are summed up. The resulting value is used as the digital output from the analog-to-digital converter circuit. Thus, the resolution of the output from the A/D converter circuit can be improved. The resolution of the output from the A/D converter circuit is further improved by summing up the present measured value of the pulse width-modulated signal and plural previously measured values of the pulse width-modulated signal and using the sum value as the digital output. The present total count obtained by the counter from the pulse width-modulated signal and at least one previously obtained total count are summed up. The resulting sum count is used as the digital output. In this way, the counter operates as a low-pass filter. Deterioration in the accuracy of the digital output due to noise can be prevented.

(The period of the high level of the pulse width-modulated signal)/(the total period of the pulse width-modulated signal), (the period of the low level of the pulse width-modulated signal)/(the total period of the pulse width-modulated signal), or the ratio of multiples of the above periods are measured and converted into a digital signal. The obtained digital output data does not depend on the frequency of the triangular wave used to obtain the pulse width-modulated signal. Stable and accurate analog-to-digital conversion is permitted. The present measured value of the pulse width-modulated signal and at least one previously measured value of the pulse width-modulated signal are summed up. Using the resulting value, data concerning the duty cycle of a rectangular wave is subtracted from data about the duty cycle of the pulse width-modulated signal, the rectangular wave being obtained by comparing a triangular wave with a given voltage. In this way, a digital output is produced. If the DC component of the triangular wave varies with temperature, or if the offset voltage of the comparator varies with temperature to thereby change the duty cycle of the pulse width-modulated signal and the duty cycle of the rectangular wave, these variations are cancelled out. As a result, the output from the analog-to-digital converter circuit is not affected by temperature variations and hence accurate.

(6) In accordance with the present invention, an analog-to-digital converter circuit comprises: a comparator which compares an analog instruction signal with a triangular wave having a given frequency and a given amplitude to convert the analog signal into a pulse width-modulated signal; and a counter which counts clock pulses appearing during the period of the high or low level of the pulse width-modulated signal to convert it into a digital signal. The converter circuit is equipped with an alarm timer which is preset in response to the leading and trailing edges of the pulse width-modulated signal. When the total count of the timer reaches a given value, the timer produces an alarm signal. When the instruction signal exceeds the amplitude of the triangular wave and the pulse width-modulated signal is locked to the high or low level, the alarm timer produces the alarm signal to inform that the converted digital signal assumes an abnormal value. Therefore, the converted digital signal can be used with confidence as long as the alarm signal is not produced.

Where the alarm timer is designed to be preset when the analog-to-digital converter circuit is set into operation, if the pulse width-modulated signal has already been locked to the high or low level when the operation starts, the alarm signal can be produced. Hence, incorrect operation of the A/D converter circuit and uncontrollable operation of the whole system can be prevented.

While the foregoing description and drawings represent the preferred embodiments of the present invention, it will be obvious to those skilled in the art that various changes and modifications may be made therein without departing from the true spirit and scope of the present invention.

What is claimed is:

1. An analog-to-digital converter circuit comprising:
   a comparator for comparing an analog input signal with a triangular wave signal having a given frequency and a given amplitude to convert the analog signal into a pulse width-modulated output signal; and
   a counter responsive to said pulse width-modulated output signal for counting clock pulses appearing during the period of the high or low level of the pulse width-modulated output signal to convert it into a digital output signal representative of said analog input signal;
   wherein the analog signal is converted into digital data by subtracting data containing information related to the duty cycle of a rectangular wave from data containing information related to the duty cycle of the pulse width-modulated signal, the rectangular wave being obtained from a comparator by comparing the triangular wave with a given voltage and wherein digital data obtained when the analog input is zero is used as an offset correction value.

2. An analog-to-digital converter circuit comprising:
   a comparator for comparing an analog input signal with a triangular wave signal having a given frequency and a given amplitude to convert the analog signal into a pulse width-modulated output signal; and
   a counter responsive to said pulse width-modulated output signal for counting clock pulses appearing during the period of the high or low level of the pulse width-modulated output signal to convert it into a digital output signal representative of said analog input signal; and
   wherein means are provided for storing prior measured values of the pulse width-modulated signals, wherein the present measured value and at least one previously measured value of the width-modulated signal by the counter are summed up, and wherein the resulting value is taken as the digital output from the converter circuit.

3. The analog-to-digital converter circuit of claim 2, wherein the sum of the present measured value and plural previously measured values of the pulse width-modulated signal is taken as the digital output signal.

4. The analog-to-digital converter circuit of claim 2, wherein the digital output signal is produced in synchronism with the pulse width-modulated signal.

5. The analog-to-digital converter circuit of claim 2, wherein the digital output signal is produced at regular intervals of time.

6. An analog-to-digital converter circuit comprising:
   a comparator for comparing an analog input signal with a triangular wave signal having a given frequency and a given amplitude to convert the analog signal into a pulse width-modulated output signal; and
   a counter responsive to said pulse width-modulated output signal for counting clock pulses appearing during the period of the high or low level of the pulse width-modulated output signal to convert it into a digital output signal representative of said analog input signal; and
   wherein means are provided for storing prior measured values of the pulse width-modulated signals, wherein the present measured value and at least one previously measured value of the width-modulated signal by the counter are summed up, and wherein the resulting value is taken as the digital output from the converter circuit and wherein (the period of the high level of the pulse width-modulated signal)/(the total period of the pulse width-modulated signal) or a multiple of this ratio is produced as a digital output signal, and wherein the digital output is used as data concerning the period of the high level.

7. An analog-to-digital converter circuit comprising:
   a comparator for comparing an analog input signal with a triangular wave signal having a given frequency and a given amplitude to convert the analog signal into a pulse width-modulated output signal; and
   a counter responsive to said pulse width-modulated output signal for counting clock pulses appearing during the period of the high or low level of the pulse width-modulated output signal to convert it into a digital output signal representative of said analog input signal; and
   wherein means are provided for storing prior measured values of the pulse width-modulated signals, wherein the present measured value and at least one previously measured value of the width-modulated signal by the counter are summed up, and wherein the resulting value is taken as the digital output from the converter circuit and wherein (the period of the low level of the pulse width-modulated signal)/(the total period of the pulse width-modulated signal) or a multiple of this ratio is produced as a digital output signal, and wherein the digital output is used as data concerning the period of the low level.

8. An analog-to-digital converter circuit comprising:
a comparator for comparing an analog input signal with a triangular wave signal having a given frequency and a given amplitude to convert the analog signal into a pulse width-modulated output signal; and
a counter responsive to said pulse width-modulated output signal for counting clock pulses appearing during the period of the high or low level of the pulse width-modulated output signal to convert it into a digital output signal representative of said analog input signal; and
wherein means are provided for storing prior measured values of the pulse width-modulated signals, wherein the present measured value and at least one previously measured value of the width-modulated signal by the counter are summed up, and wherein the resulting value is taken as the digital output from the converter circuit and wherein the digital output signal from a counter indicating the present measured value and at least one previously measured value of the pulse width-modulated value is produced by subtracting data about the duty cycle of a rectangular wave from data containing information related to the duty cycles of the pulse width-modulated signal, the rectangular wave being obtained by comparing the triangular wave with a given voltage, and wherein at least the numerator of the duty cycle of the pulse width-modulated signal uses the digital output signal.

9. An analog-to-digital converter circuit comprising:
a comparator for comparing an analog input signal with a triangular wave signal having a given frequency and a given amplitude to convert the analog signal into a pulse width-modulated output signal; and
a counter responsive to said pulse width-modulated output signal for counting clock pulses appearing during the period of the high or low level of the pulse width-modulated output signal to convert it into a digital output signal representative of said analog input signal; and
further comprising an alarm timer which is preset on the leading edge and the trailing edge of the pulse width-modulated signal and which produces an alarm signal when the total count of the timer reaches a given value.

10. The analog-to-digital converter circuit of claim 9, wherein the alarm timer is preset also when the analog-to-digital converter circuit is set into operation.

11. Apparatus for controlling the speed of an electric motor, comprising:
analog-to-digital converter means which compares an analog speed instruction signal with a triangular wave having a given frequency and a given amplitude to convert the analog signal into a digital output signal;
detector means having an output which detects that the speed instruction signal lies within the amplitude of the triangular wave;
control means receiving the digital output signal from the analog-to digital converter means, an output from the detector means, the output from an encoder that detects the rotational speed of the motor;
an inverter controlled by said control means so that the difference between the speed indicated by the speed instruction signal and the actual speed of the motor is reduced to zero, the motor being controlled by the inverter; and
wherein, when the detector means senses that the speed indicated by the speed instruction signal exceeds the amplitude of the triangular wave, the control means stops the motor.

12. An analog-to-digital converter circuit comprising:
a first comparator for comparing an analog signal with a triangular wave signal having a given frequency and a given amplitude to convert the analog signal into a pulse width-modulated output signal;
a first counter responsive to said pulse width-modulated output signal for producing a count corresponding to the duty cycle of the pulse width-modulated signal;
a second comparator for comparing said triangular wave signal with a constant voltage to form a rectangular wave signal;
a second counter responsive to said rectangular wave signal for producing a count corresponding to the duty cycle of the rectangular wave signal; and
means for subtracting the count corresponding to the duty cycle of the rectangular wave signal from the count corresponding to the duty cycle of the pulse width-modulated signal and for providing said difference in digital form; said digital form being a digital representation of said analog signal.

13. The analog-to-digital converter circuit of claim 12, wherein said digital output signal is found from one of the following: (the period of the high level of the pulse width-modulated signal)/(the total period of the pulse width-modulated signal), a multiple of this ratio, (the period of the low level of the pulse width-modulated signal)/(the period of the pulse width-modulated signal), or a multiple of this ratio.

14. The analog-to-digital converter circuit of claim 13, wherein the period of the high or low level of the pulse width-modulated signal is measured by said first counter, and wherein the total period of the pulse width-modulated signal is taken to be the sum of the measured period of the high level and the measured period of the low level.

15. The analog-to-digital converter circuit of claim 12, wherein digital data obtained when the analog input is zero is used as an offset correction value.

* * * * *